United States Patent
Hekmatshoartabari

(10) Patent No.: US 10,903,271 B2
(45) Date of Patent: Jan. 26, 2021

(54) MULTILAYER BACK END OF LINE (BEOL)-STACKABLE CROSS-POINT MEMORY ARRAY WITH COMPLEMENTARY PASS TRANSISTOR SELECTORS

(71) Applicant: International Business Machines Corporation, Armonk, NY (US)

(72) Inventor: Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/813,721

(22) Filed: Mar. 9, 2020

(65) Prior Publication Data

US 2020/0212106 A1 Jul. 2, 2020

Related U.S. Application Data

(62) Division of application No. 16/109,369, filed on Aug. 22, 2018, now Pat. No. 10,615,225.

(51) Int. Cl.
*G11C 11/00* (2006.01)
*H01L 27/24* (2006.01)
(Continued)

(52) U.S. Cl.
CPC ...... *H01L 27/2454* (2013.01); *G11C 11/1657* (2013.01); *G11C 11/1673* (2013.01);
(Continued)

(58) Field of Classification Search
CPC ... H01L 27/2454; H01L 27/228; H01L 43/12; H01L 45/16; H01L 27/2463;
(Continued)

(56) References Cited

U.S. PATENT DOCUMENTS

| 5,936,880 A | * | 8/1999 | Payne | G11C 17/16 |
| | | | | 365/100 |
| 6,420,215 B1 | * | 7/2002 | Knall | H01L 21/822 |
| | | | | 257/E21.606 |

(Continued)

FOREIGN PATENT DOCUMENTS

WO WO 2010018888 A1 2/2010

OTHER PUBLICATIONS

Alvaro Padilla, Advanced Structures and New Detection Methods for Future High Density Non-volatile Memory Technologies, Electrical Engineering and Computer Sciences, University of California at Berkeley, Technical Report No. UCB/EECS-2008-9, http://www.eecs.berkeley.edu/Pubs/TechRpts/2008/EECS-2008-9.html, Jan. 29, 2008, 180 pages.

(Continued)

*Primary Examiner* — Tha-O H Bui
(74) *Attorney, Agent, or Firm* — L. Jeffrey Kelly; Otterstedt, Wallace & Kammer, LLP

(57) ABSTRACT

A multi-layer cross point memory array includes a plurality of layers, each in turn with a plurality of word lines; a plurality of intersecting lines intersecting the word lines at a plurality of points; and a plurality of memory element-transistor stacks. Each of the latter is formed on the intersecting lines; each stack in turn includes a memory element; and a complementary pair of parallel-connected field effect selection transistors including a p-FET and an n-FET, each of which has a gate, a first drain-source terminal connected to a corresponding one of the intersecting lines, and a second drain-source terminal connected to a corresponding one of the memory elements. The gate of the p-FET and the gate of an n-FET in an adjacent stack are connected to the same word line; and the mirror image is true for the n-FET and a p-FET in the adjacent stack on the opposite side.

8 Claims, 33 Drawing Sheets

(51) Int. Cl.
*H01L 27/22* (2006.01)
*H01L 43/12* (2006.01)
*H01L 45/00* (2006.01)
*G11C 13/00* (2006.01)
*G11C 11/16* (2006.01)

(52) U.S. Cl.
CPC ........ *G11C 11/1675* (2013.01); *G11C 13/004* (2013.01); *G11C 13/0028* (2013.01); *G11C 13/0069* (2013.01); *G11C 13/0097* (2013.01); *H01L 27/228* (2013.01); *H01L 27/2463* (2013.01); *H01L 43/12* (2013.01); *H01L 45/16* (2013.01)

(58) Field of Classification Search
CPC ............ G11C 13/0097; G11C 11/1673; G11C 11/1675; G11C 13/0028; G11C 13/004; G11C 13/0069; G11C 11/1657; G11C 13/0033; G11C 11/1659; G11C 2213/74; G11C 2213/79; G11C 13/003
USPC ........................................................ 365/148
See application file for complete search history.

(56) References Cited

U.S. PATENT DOCUMENTS

| | | | |
|---|---|---|---|
| 6,559,491 B2* | 5/2003 | Forbes | H01L 27/10823 257/296 |
| 6,881,994 B2 | 4/2005 | Lee et al. | |
| 7,158,410 B2 | 1/2007 | Bhattacharyya et al. | |
| 7,212,432 B2 | 5/2007 | Ferrant et al. | |
| 7,483,292 B2* | 1/2009 | Lung | G11C 11/5678 365/148 |
| 7,679,118 B2 | 3/2010 | Forbes | |
| 9,219,005 B2 | 12/2015 | Or-Bach et al. | |
| 9,859,177 B2 | 1/2018 | Viraraghavan et al. | |
| 10,615,225 B2 | 4/2020 | Hekmatshoartabari | |
| 2012/0210932 A1 | 8/2012 | Hekmatshoar-Tabari et al. | |
| 2017/0033158 A1 | 2/2017 | Vereen et al. | |
| 2017/0084620 A1 | 3/2017 | Wu et al. | |
| 2017/0084627 A1 | 3/2017 | Lee et al. | |
| 2018/0012937 A1 | 1/2018 | Park et al. | |

OTHER PUBLICATIONS

Paul J. Otterstedt, List of IBM Patents or Patent Applications Treated As Related, Apr. 14, 2020, pp. 1-2.

* cited by examiner

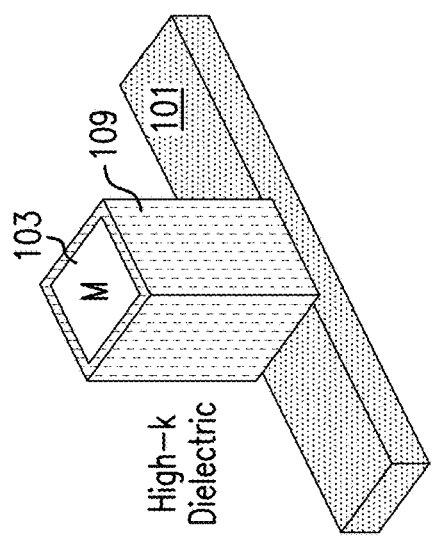
FIG.1C
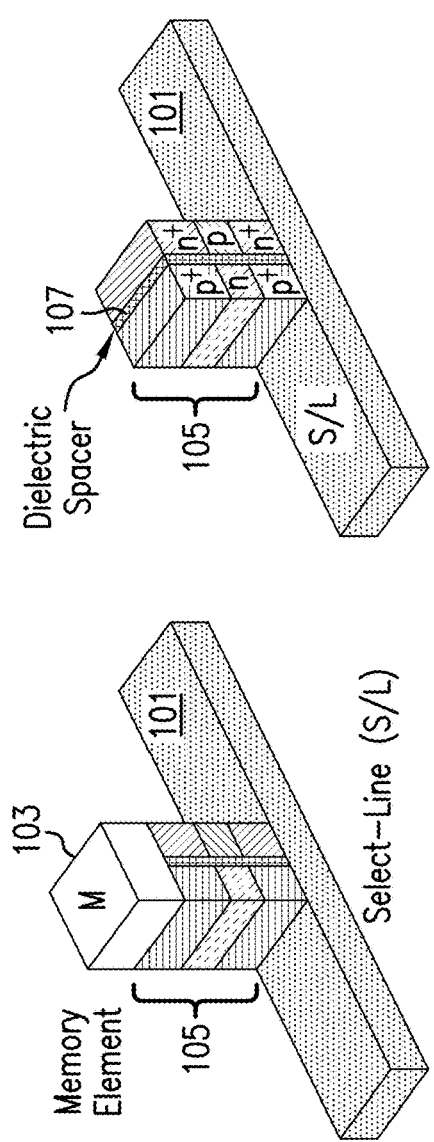
FIG.1B
FIG.1A
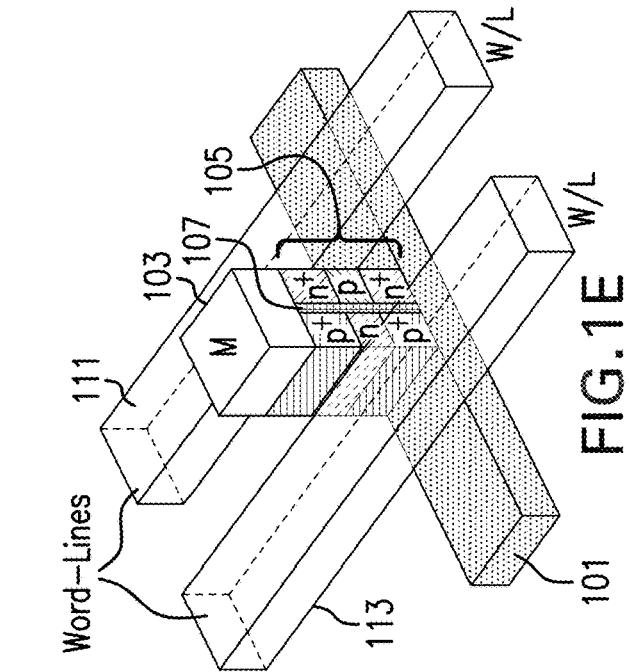
FIG.1E
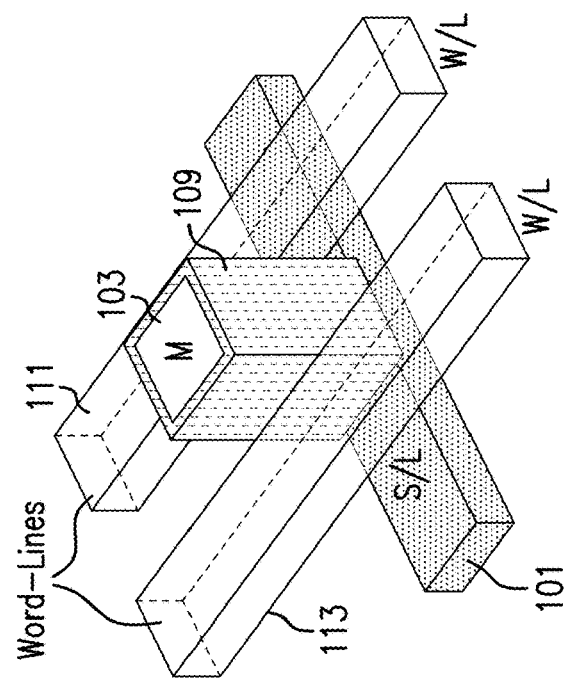
FIG.1D

MULTILAYER BACK END OF LINE (BEOL)-STACKABLE CROSS-POINT MEMORY ARRAY WITH COMPLEMENTARY PASS TRANSISTOR SELECTORS

CROSS-REFERENCE TO RELATED APPLICATIONS

This patent application is a divisional of U.S. patent application Ser. No. 16/109,369 filed 22 Aug. 2018, entitled "MULTILAYER BACK END OF LINE (BEOL)-STACKABLE CROSS-POINT MEMORY ARRAY WITH COMPLEMENTARY PASS TRANSISTOR SELECTORS," the complete disclosure of which is expressly incorporated herein by reference in its entirety for all purposes.

BACKGROUND

The present invention relates generally to the electrical, electronic and computer arts, and, more particularly, to memory circuitry.

Emerging memory applications such as STT-MRAM (Spin-transfer torque magnetic random-access memory) and RRAM (Resistive random-access memory) require bidirectional selection for efficient operation. Transistor selectors enable bidirectional operation; however, they introduce some asymmetry. This is because, depending on the voltage polarity of the operation, the transistor terminal connected to the memory element may be the functional drain or the functional source. The issue of asymmetry becomes more problematic for multi-state or synaptic memories.

SUMMARY

Principles of the invention provide techniques for a multilayer back end of line (BEOL)-stackable cross-point memory array with complementary pass transistor selectors. In one aspect, an exemplary multi-layer cross point memory array includes a plurality of layers; each of the layers in turn includes a plurality of word lines; a plurality of intersecting lines intersecting the plurality of word lines at a plurality of points; and a plurality of memory element-transistor stacks. Each of the memory element-transistor stacks is formed on the intersecting lines at each of the plurality of points, and each of the memory element-transistor stacks in turn includes a memory element; and a complementary pair of parallel-connected field effect selection transistors including a p-channel field effect transistor and an n-channel field-effect transistor. Each of the field effect selection transistors has a gate, a first drain-source terminal connected to a corresponding one of the intersecting lines, and a second drain-source terminal connected to a corresponding one of the memory elements. For a majority of the memory element-transistor stacks, the gate of the p-channel field effect transistor and the gate of the n-channel field-effect transistor in an adjacent one of the memory-element transistor stacks are connected to the same corresponding one of the word lines, and for a majority of the memory element-transistor stacks, the gate of the n-channel field effect transistor and the gate of the p-channel field-effect transistor in an adjacent one of the memory-element transistor stacks are connected to another same corresponding one of the word lines.

In another aspect, an exemplary method of manufacturing a multi-layer cross point memory array includes fabricating a plurality of layers, each layer outward of a preceding layer, wherein fabricating each of the layers in turn includes forming a structure including an inter-layer dielectric layer, a select line metal layer outward of the inter-layer dielectric layer, a plurality of p+/n/p+ lines outward of the select line metal layer, a plurality of n+/p/n+ lines outward of the select line metal layer, and a plurality of dielectric spacers outward of the select line metal layer and at least partially separating the p+/n/p+ lines from the n+/p/n+ lines. The p+/n/p+ lines are formed with inner p+ layers, intermediate n layers, and outermost p+ layers, and the n+/p/n+ lines are formed with inner n+ layers, intermediate p layers, and outermost n+ layers. Also included in fabricating each layer are forming a memory stack outward of the plurality of p+/n/p+ lines, the plurality of n+/p/n+ lines, and the plurality of dielectric spacers; patterning the memory stack, the plurality of p+/n/p+ lines, the plurality of n+/p/n+ lines, and the plurality of dielectric spacers to form a plurality of lines perpendicular to the plurality of p+/n/p+ lines and the plurality of n+/p/n+ lines; patterning the plurality of lines perpendicular to the plurality of p+/n/p+ lines and the plurality of n+/p/n+ lines into a plurality of pillars including memory elements; forming a high-k dielectric on at least sidewalls of the pillars; forming a plurality of word lines parallel to the plurality of p+/n/p+ lines and the plurality of n+/p/n+ lines; and forming a plurality of bit lines interconnected with the memory elements.

In still another aspect, a method of operating a cross-point memory array is provided. The cross-point memory array to be operated includes at least one stacked level; the at least one stacked level includes an array of bit-lines, word-lines, select-lines, memory cells and selection elements, and each of the selection elements includes an n-channel transistor and a p-channel transistor with shared source/drain terminals and with transistor channels separated by a dielectric spacer. Each of the n-channel and p-channel transistors has a gate. Gates of a given n-channel transistor and a given p-channel transistor from two adjacent ones of the selection elements share a same one of the word-lines. The method includes selecting a given one of the memory cells by carrying out the steps of applying a LOW voltage to that one of the word-lines connected to the gate of the p-channel transistor connected to the memory cell to be selected; applying a HIGH voltage to that one of the word-lines connected to the gate of the n-channel transistor connected to the memory cell to be selected; and applying a voltage between HIGH and LOW to all other ones of the word-lines. The applied HIGH voltage is higher than a threshold voltage of the n-channel transistor connected to the memory cell to be selected and the applied LOW voltage is lower than a threshold voltage of the p-channel transistor connected to the memory cell to be selected.

As used herein, "facilitating" an action includes performing the action, making the action easier, helping to carry the action out, or causing the action to be performed. For the avoidance of doubt, where an actor facilitates an action by other than performing the action, the action is nevertheless performed by some entity or combination of entities.

Techniques as disclosed herein can provide substantial beneficial technical effects. By way of example only and without limitation, one or more embodiments may provide one or more of the following advantages:

enable the use of complementary pass transistors (also known as transmission gates) as selection devices in a three-dimensional (3D) multilayer BEOL-stackable cross-point memory array, thereby improving the dynamic range of voltage transmission (i.e. maintaining low and nearly constant transmission resistance);

reduce or even minimize density impact of doubling the transistor count by sharing the transistor bodies and sharing the word lines;

achieve 3D multilayer BEOL-stackability by a combination of pulsed laser annealing and low-temperature PECVD (Plasma-enhanced chemical vapor deposition) epitaxial growth of hydrogenated Si-containing layers;

enable low-cost 3D multilayer memory arrays on flexible plastic substrates by low-temperature fabrication of complementary pass transistors.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 1A-1F present perspective high-level views of a structure and method of forming same, according to an aspect of the invention;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative exemplary embodiments. It is to be appreciated, however, that the specific systems, circuits and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

As noted above, emerging memory applications such as STT-MRAM (Spin-transfer torque magnetic random-access memory) and RRAM (Resistive random-access memory) require bidirectional selection for efficient operation. Transistor selectors enable bidirectional operation; however, they introduce some asymmetry. This is because, depending on the voltage polarity of the operation, the transistor terminal connected to the memory element may be the functional drain or the functional source. The issue of asymmetry becomes more problematic for multi-state or synaptic memories. Advantageously, one or more embodiments disclosed herein address this issue without significant negative impact on the density or the 3D stackability of the array.

One or more embodiments provide structures and/or methods that enable the use of complementary pass transistors as selection devices in a 3D multilayer BEOL-stackable cross-point memory array. The density impact of doubling the transistor count is reduced or even minimized by sharing the transistor bodies and sharing the word lines. In one or more embodiments, three-dimensional (3D) multilayer BEOL-stackability is achieved by a combination of pulsed laser annealing and low-temperature PECVD epitaxial growth of hydrogenated Si-containing layers.

One or more embodiments provide structures and/or methods that enable the use of complementary pass transistors as selection devices in a 3D multilayer cross-point memory array on low-cost, light-weight and/or flexible plastic substrates. Compatibility with plastic substrates is enabled by a low-temperature fabrication process achieved by a combination of pulsed laser annealing and low-temperature PECVD epitaxial growth of hydrogenated Si-containing layers.

Figure 8:
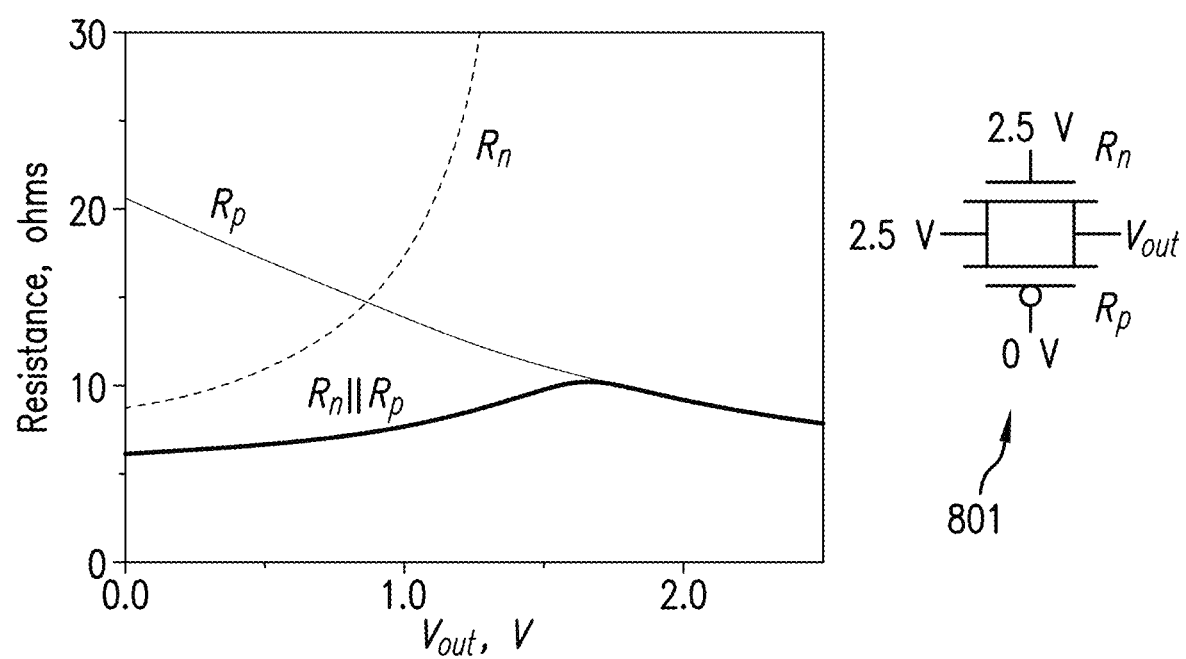
FIG. 8 shows simulated equivalent resistance of a transmission gate for the low-to-high transition, useful in understanding aspects of the invention.

Referring to FIG. 8, complementary pass transistors (also known as transmission gates) substantially improve the dynamic range of voltage transmission (i.e. maintain low and nearly constant transmission resistance) but double the number of required pass transistors (i.e. one n-channel and one p-channel). FIG. 8 plots the simulated equivalent resistance of a transmission gate 801 for low-to-high transition, for $(W/L)_n=(W/L)_p=0.5$ μm/0.25 μm. A similar response for overall resistance would be obtained for the high-to-low transition. The n-type device has 2.5V applied to its gate and has a resistance $R_n$; the p-type device has 0V applied to its gate and has a resistance $R_p$; one drain-source terminal of the n-type device is coupled to one drain-source terminal of the p-type device to form an input terminal to which 2.5V are applied; and another drain-source terminal of the n-type device is coupled to another drain-source terminal of the p-type device to form an output terminal with voltage $V_{out}$. The graph shows the resistance values for $R_p$, $R_n$, and $R_n$ in parallel with $R_p$, plotted against $V_{out}$.

Figure 1F:
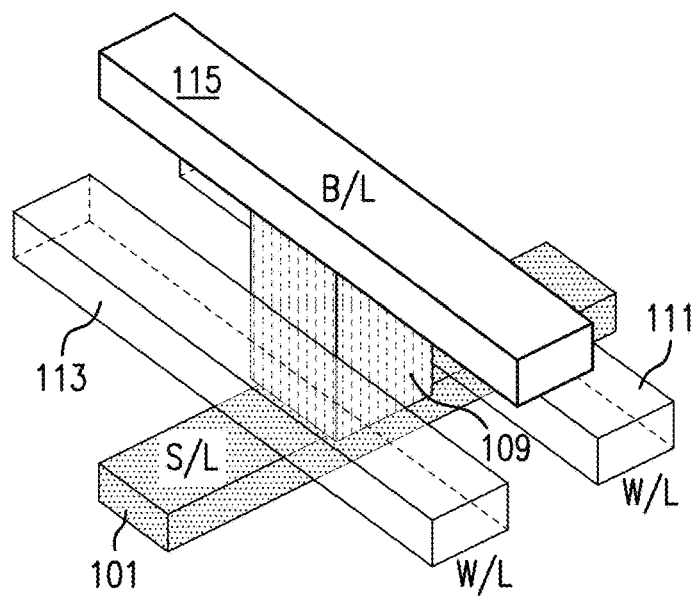

FIGS. 1A-1F present perspective high-level views of a structure and method of forming same, according to an aspect of the invention. In FIG. 1A, a memory element/transistor stack is formed on the select-line (S/L) 101; note the memory element 103 and transistor stack 105. FIG. 1B is a view of the structure of FIG. 1A without the memory element, for better illustration; note the p+, n+, n, and p regions in the transistor stack 105 as well as the dielectric spacer 107. This dielectric spacer is inserted between the n-FET and the p-FET to electrically isolate them from each other. In FIG. 1C, high-k dielectric 109 is formed using a conformal method, e.g. ALD (atomic layer deposition). In FIG. 1D, word lines 111, 113, including gate electrodes of the n-FETs and p-FETs, are formed. FIG. 1E is a view of the structure of FIG. 1D without the high-k dielectric, for better illustration; note the p+, n+, n, and p regions in the transistor stack 105 as well as the dielectric spacer 107. In FIG. 1F, bit lines (B/L) 115 are formed (note that various ILD (inter layer dielectric) layers are not shown for better illustration). Also, note that there is no difference between word lines 111 and 113; they are given separate numbers merely for purposes of descriptive and illustrative convenience.

Figure 2:
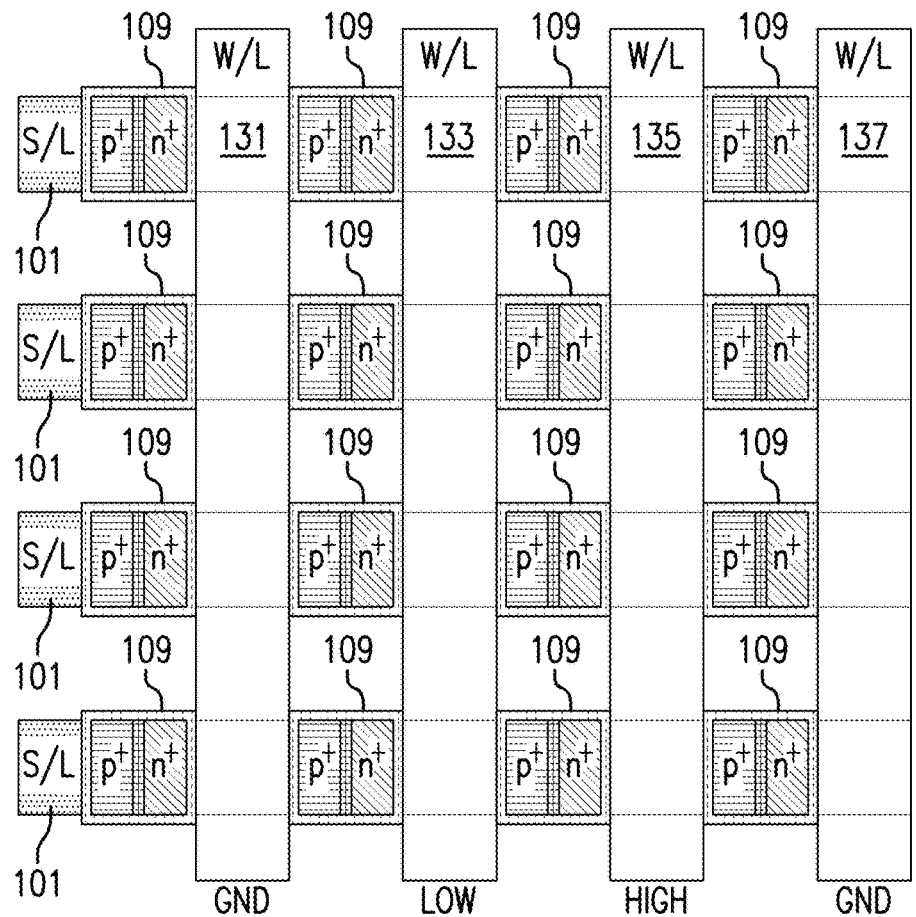
FIG. 2 shows a top view of a memory array, according to an aspect of the invention.
Figure 3:
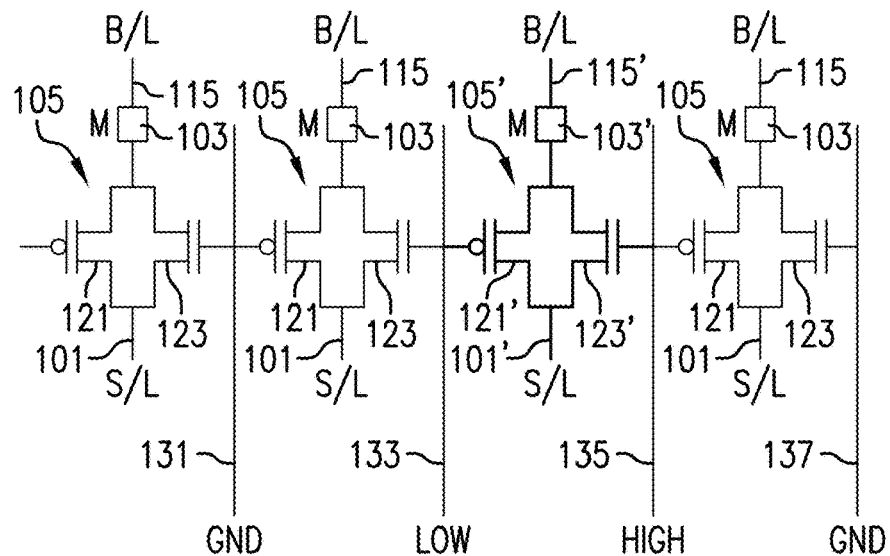
FIG. 3 shows a circuit diagram of one row of the array of FIG. 2, according to an aspect of the invention.

FIG. 2 shows a top view of a memory array, according to an aspect of the invention. FIG. 2 shows one stacking level; memory elements, bit-lines, and various ILD layers are not shown for simplicity. FIG. 3 shows a circuit diagram of one row of the array of FIG. 2, wherein a desired memory element is accessed by the control circuitry (typically in the front-end) for programming, erasing or reading, according to an aspect of the invention. The reference numerals associated with the accessed memory element are denoted with a prime (') symbol, e.g. 103' for the accessed memory element and 121' for the p-FET connected to the accessed memory element. The p+ and n+ regions of the transistor stacks 105 and the dielectric spacers 107, all within the high-k dielectric 109, are not separately numbered to reduce clutter. Referring back to FIG. 1B, the p+-n-p+ portion of stack 105 to the left of the dielectric 107 forms the left-hand p-FETs 121 in FIG. 3 while the n+-p-n+ portion of stack 105 to the right of the dielectric 107 forms the right-hand n-FETs 123 in FIG. 3. Note the word lines 131, 133, 135, and 137 at, respectively, ground, low, high, and ground. When a specific cell is selected, the LOW word-line 133 connected to the p-FET of that cell may be functionally referred to as a complementary word-line and the HIGH word line 135 connected to the n-FET of that cell may be referred to functionally as a true word-line. Physically, however, there is no difference between the word-lines; they are all the same in one or more embodiments.

Figure 4:
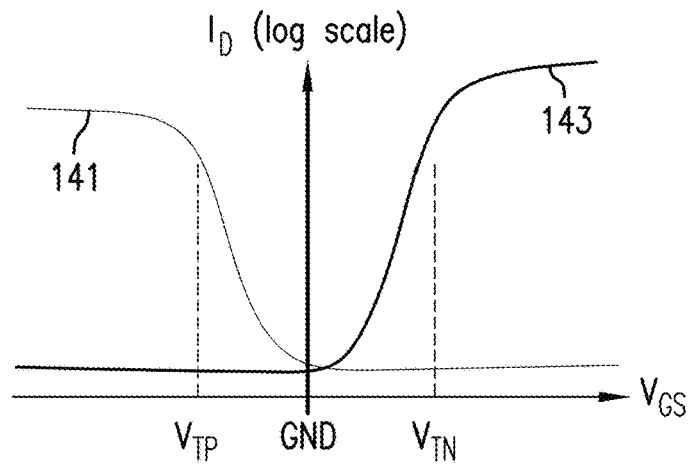
FIG. 4 shows drain current (log scale) plotted against gate-source voltage, for an n-channel transistor and a p-channel transistor in a transmission gate according to an embodiment of the present invention.

FIG. 4 shows the transfer characteristics (plots of drain current (log scale) against gate-source voltage) 141 and 143 of an n-FET and a p-FET, respectively, in a transmission gate according to an embodiment of the present invention. The threshold voltages of the p-FET and n-FETs are, respectively, $V_{TP}$ and $V_{TN}$. Curve 143 is for the n-FET while curve 141 is for the p-FET.

In FIGS. 2-4, the HIGH voltage is greater than $V_{TN}$ which in turn is greater than a GND (ground) voltage, while the LOW voltage is less than $V_{TP}$ which in turn is less than GND (note that GND does not necessarily have to be the global GND). As known in the art, an n-FET is switched ON by applying a voltage higher than its threshold voltage, $V_{TN}$, while a p-FET is switched ON by applying a voltage lower than its threshold voltage, $V_{TP}$. Therefore, the n-FET is switched ON by applying a HIGH voltage to its gate and switched OFF by applying a GND or a LOW voltage to its gate, while the p-FET is switched ON by applying a LOW voltage to its gate and switched off by applying a GND or a HIGH voltage to its gate. In order to access the memory element 103' via bit-line 115' and select-line 101', a LOW voltage is asserted on word-line 133, a HIGH voltage is asserted on word-line 135, and a GND voltage is asserted on all other word-lines in the array (131, 137, etc.). As a result, the p-FET 121' and the n-FET 123' switch ON, allowing the control circuitry to access the memory element 103' via bit-line 115' and select-line 101'; while all other p-FETs 121 and n-FETs 123 remain OFF. Therefore, the memory element 103' can be accessed by the control circuitry for read, write or erase operations independent of (i.e. without disturbing or being disturbed by) the rest of the memory elements 103.

Referring to the circuit diagram of FIG. 3, it will be appreciated that either the select-lines or the bit-lines may be connected to each other to form a common electrode. This may be achieved, for example, by not patterning the metal layers that form the select lines or the bit-lines, respectively. When the bit-lines are replaced by a common electrode, the memory array may be addressed by the word-lines and the select-lines. Similarly, when the select-lines are replaced by a common electrode, the memory array may be addressed by the bit-lines and the word-lines. Replacing one of the select-lines or bit-lines with a common electrode is beneficial in reducing the number of connections (i.e. input-output (I/O) lines or vias) between the memory array (typically in the back-end) and the control circuitry (typically in the front-end). However, as will be appreciated by those skilled in the art, access to both select-lines and bit-lines (instead of replacing one of them with a common electrode) may significantly enhance the capabilities of the control circuitry in terms of memory management, including tasks such as memory allocation and error correction during operation. Also, it will be appreciated that the naming of the select-line versus bit-line is arbitrary and therefore interchangeable, i.e. the bit-lines may be referred to as select-lines and vice versa.

Figure 5A:
FIGS. 5A-5Z and 5AA-5OO show steps in a first exemplary process flow, according to an aspect of the invention, wherein the views are elevation views except that FIGS. 5G, 5I, 5L, 5N, 5P, 5R, 5U, 5W, 5Y, 5BB, 5EE, 5HH, 5JJ, 5LL and 5OO are top plan views of, respectively, FIGS. 5F, 5H, 5K, 5M, 5O, 5Q, 5T, 5V, 5X, 5AA, 5DD, 5GG, 5II, 5KK, and 5NN.
Figure 5B:
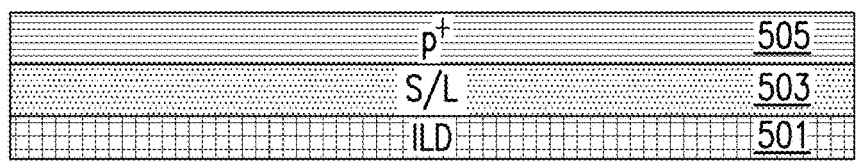
Figure 5C:
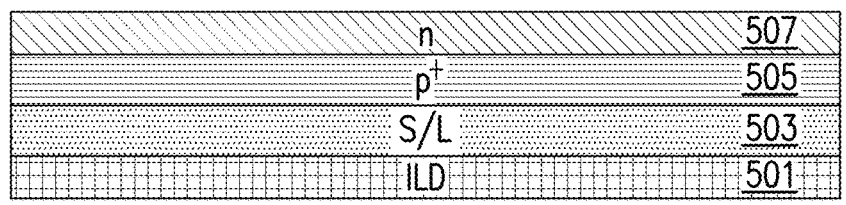
Figure 5D:
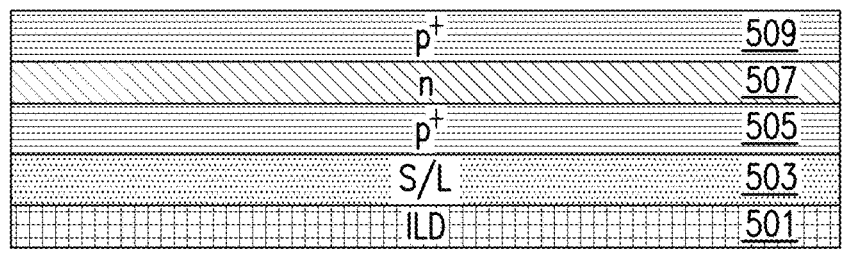
Figure 5E:
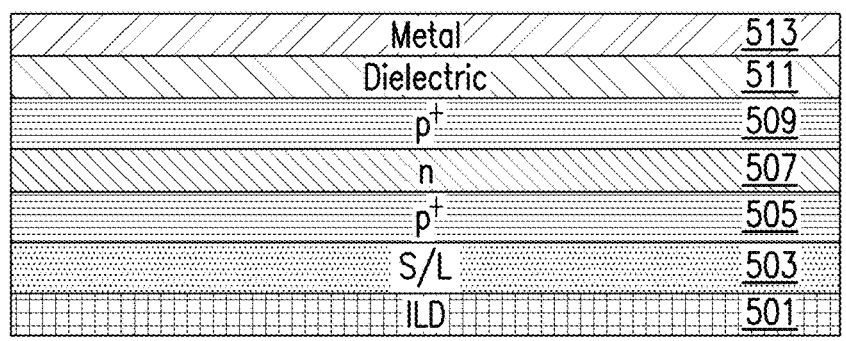
Figure 5F:
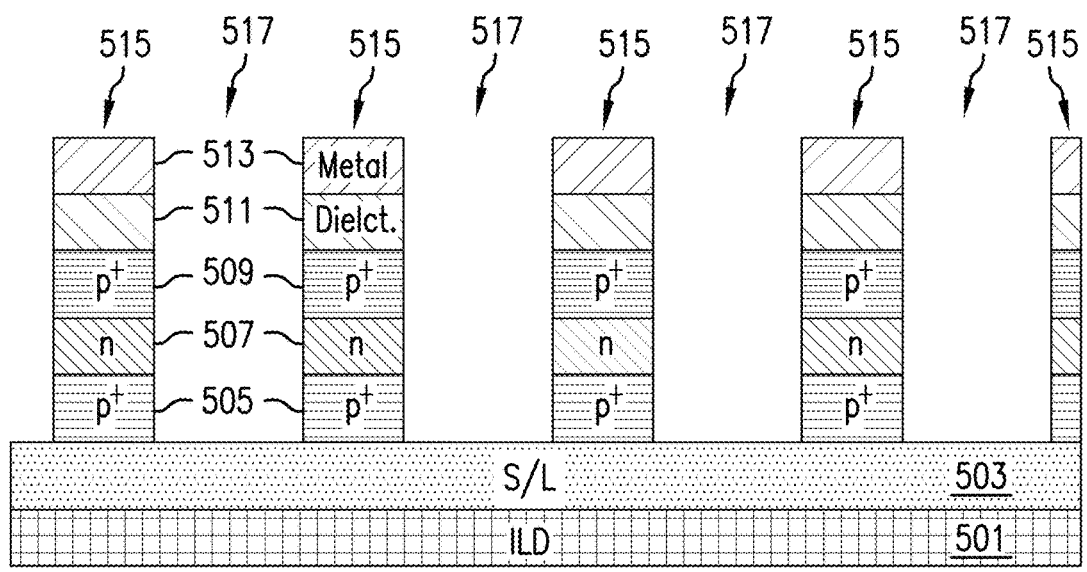
Figure 5G:
Figure 5H:
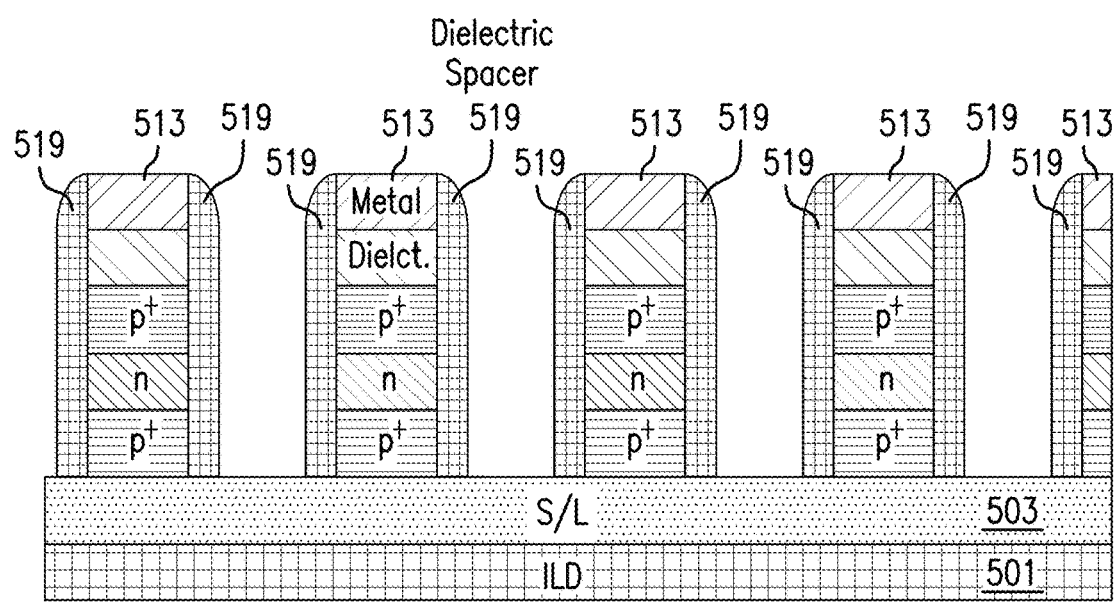
Figure 5I:
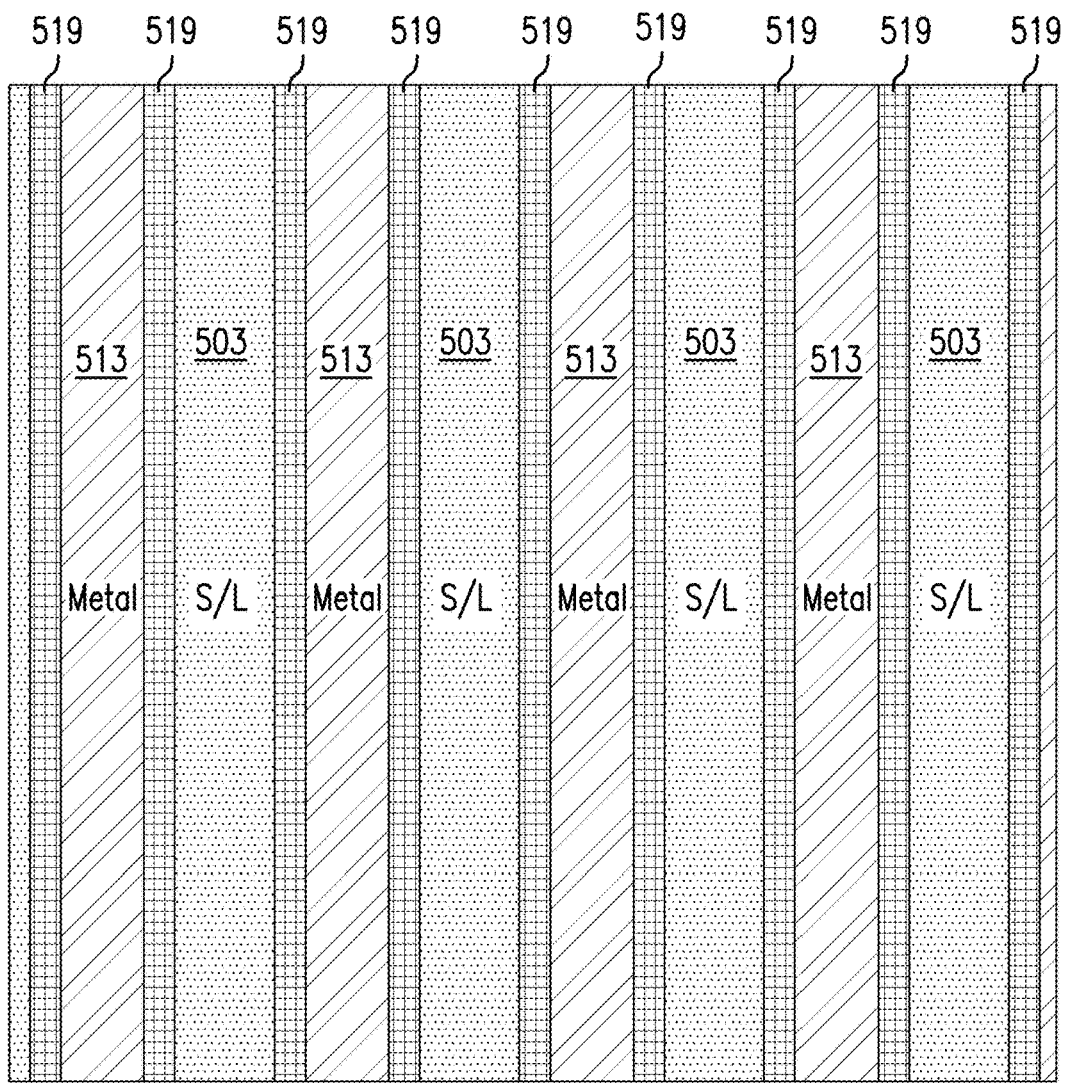
Figure 5J:
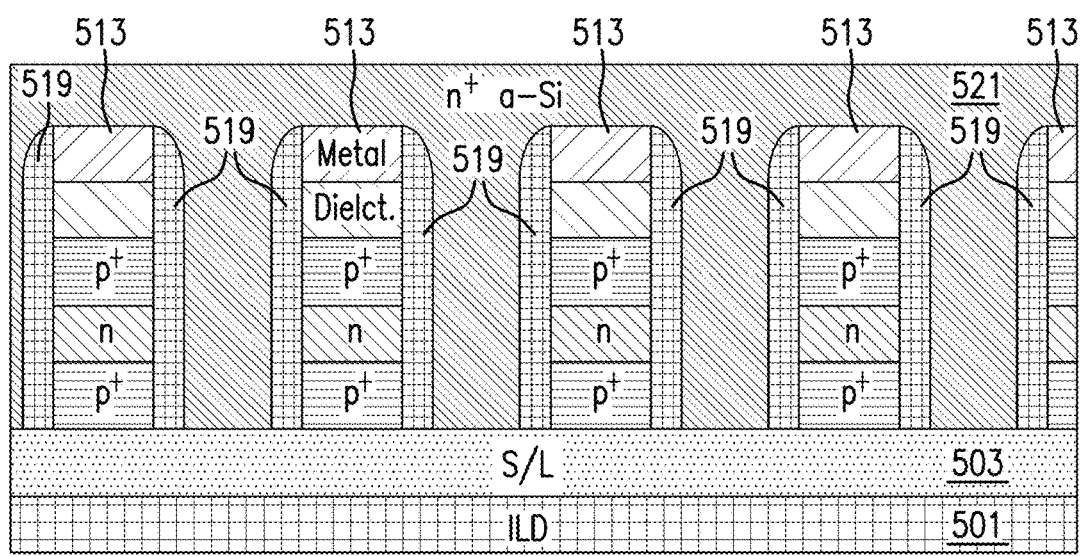
Figure 5K:
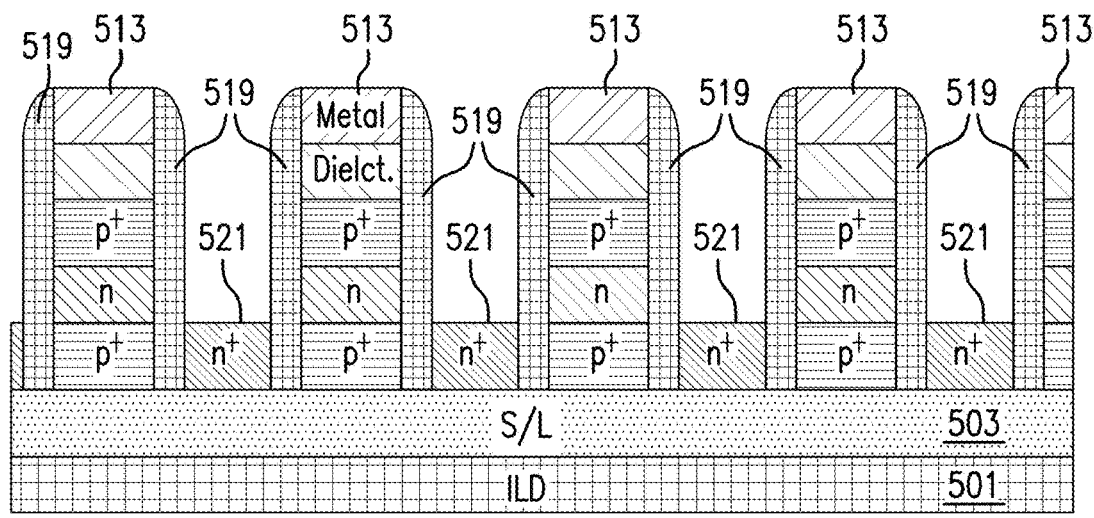
Figure 5L:
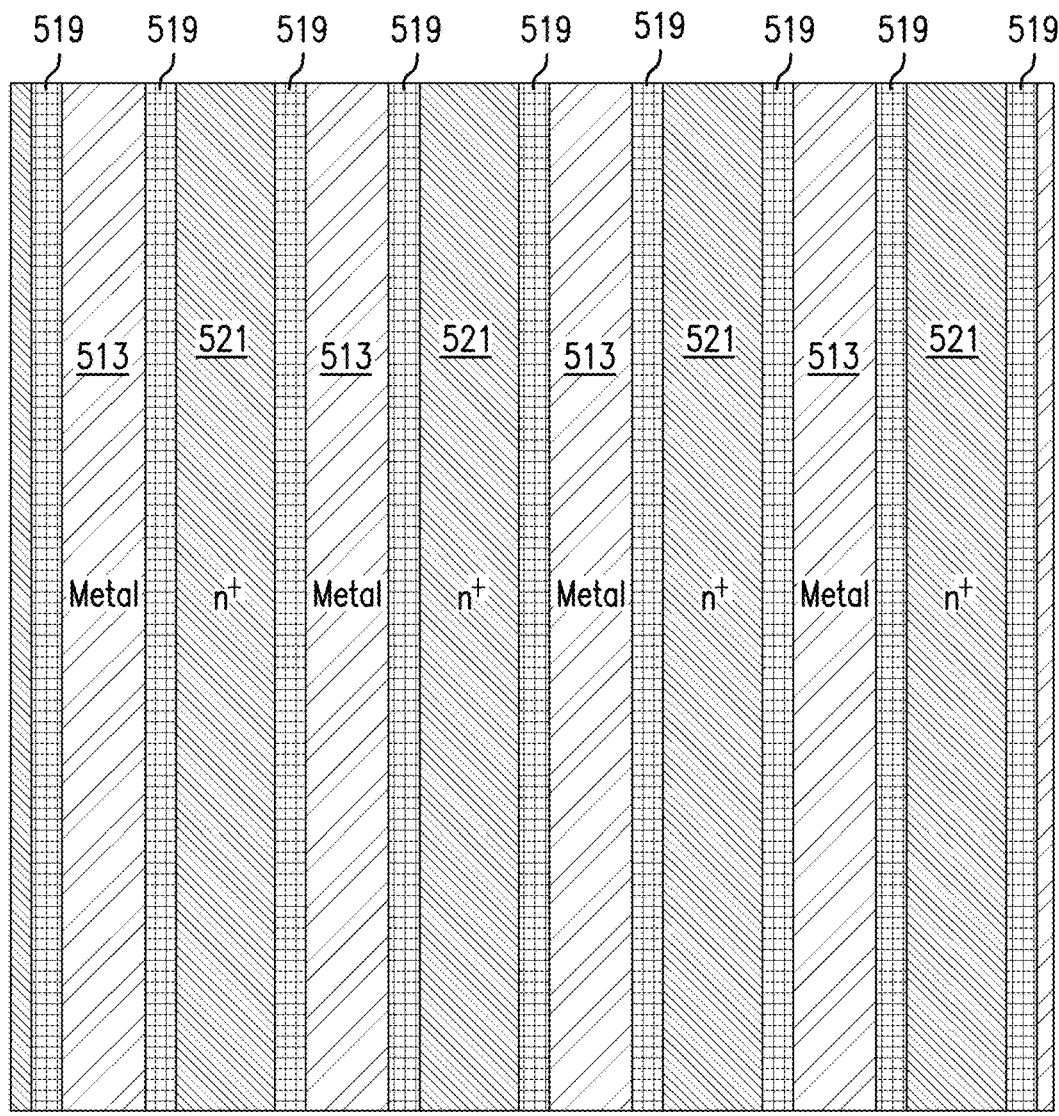
Figure 5M:
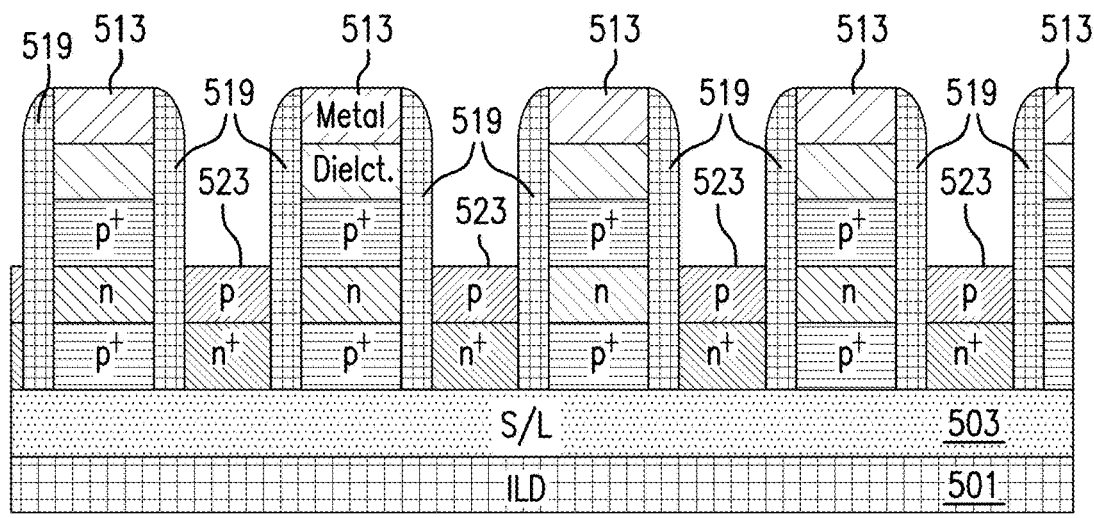
Figure 5N:
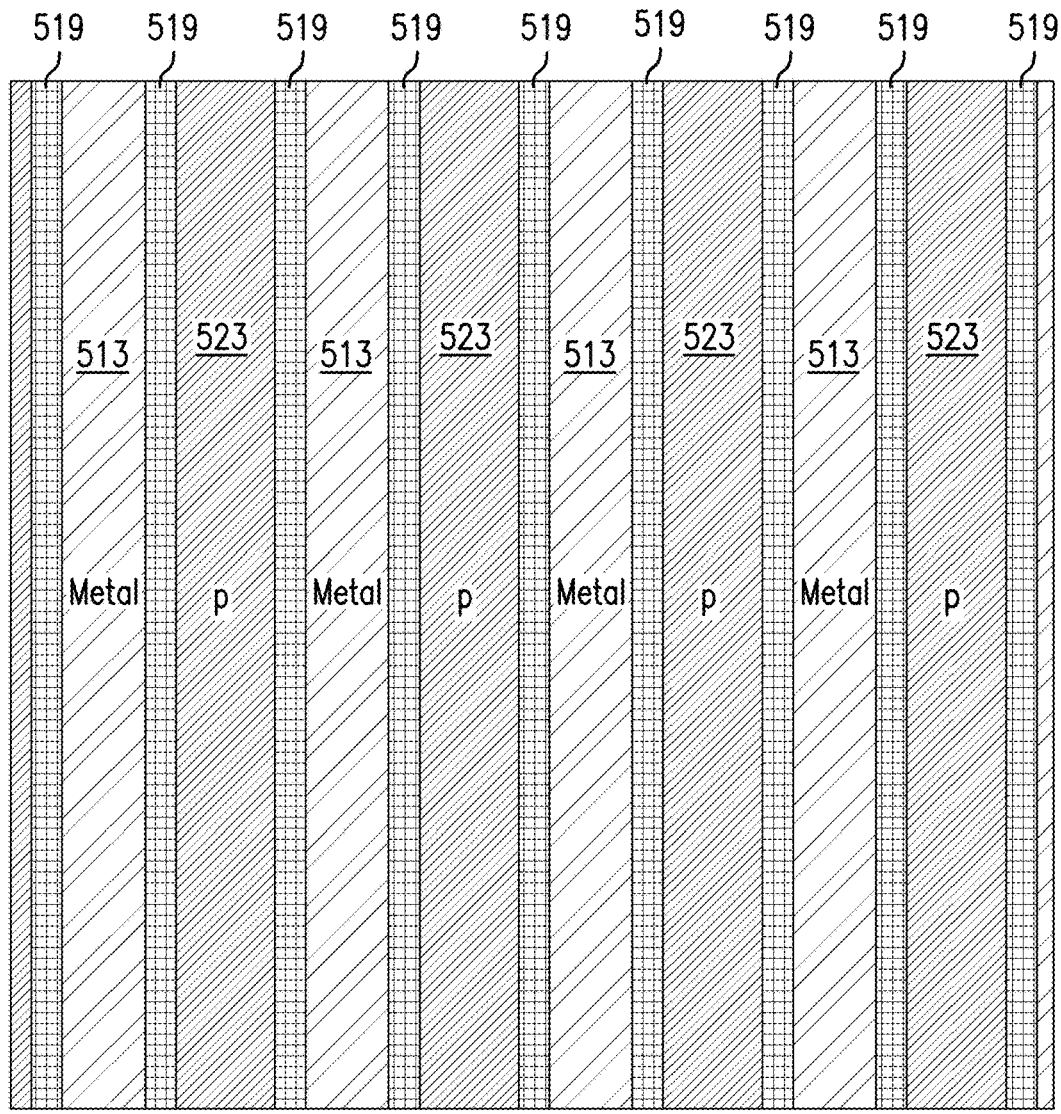
Figure 5O:
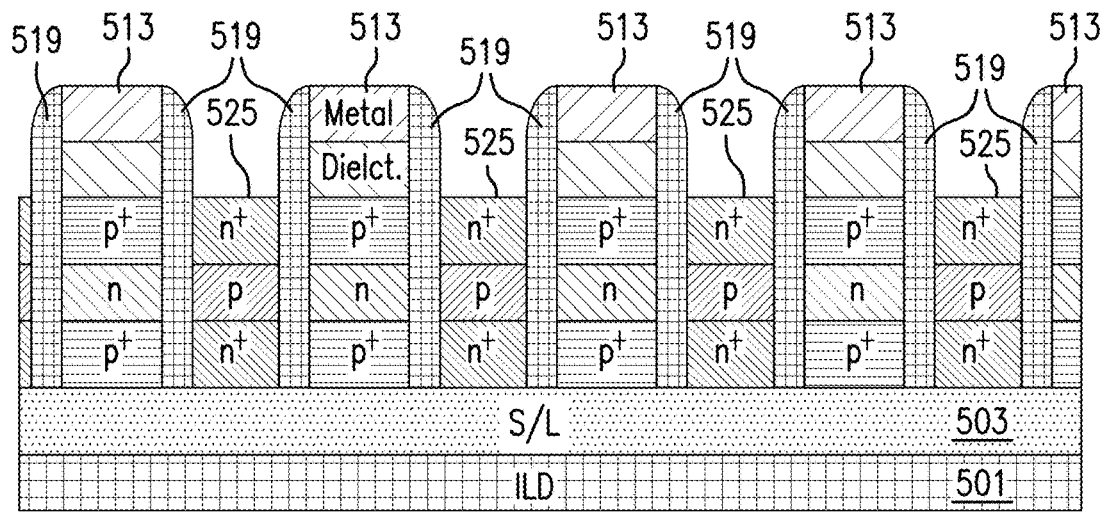
Figure 5P:
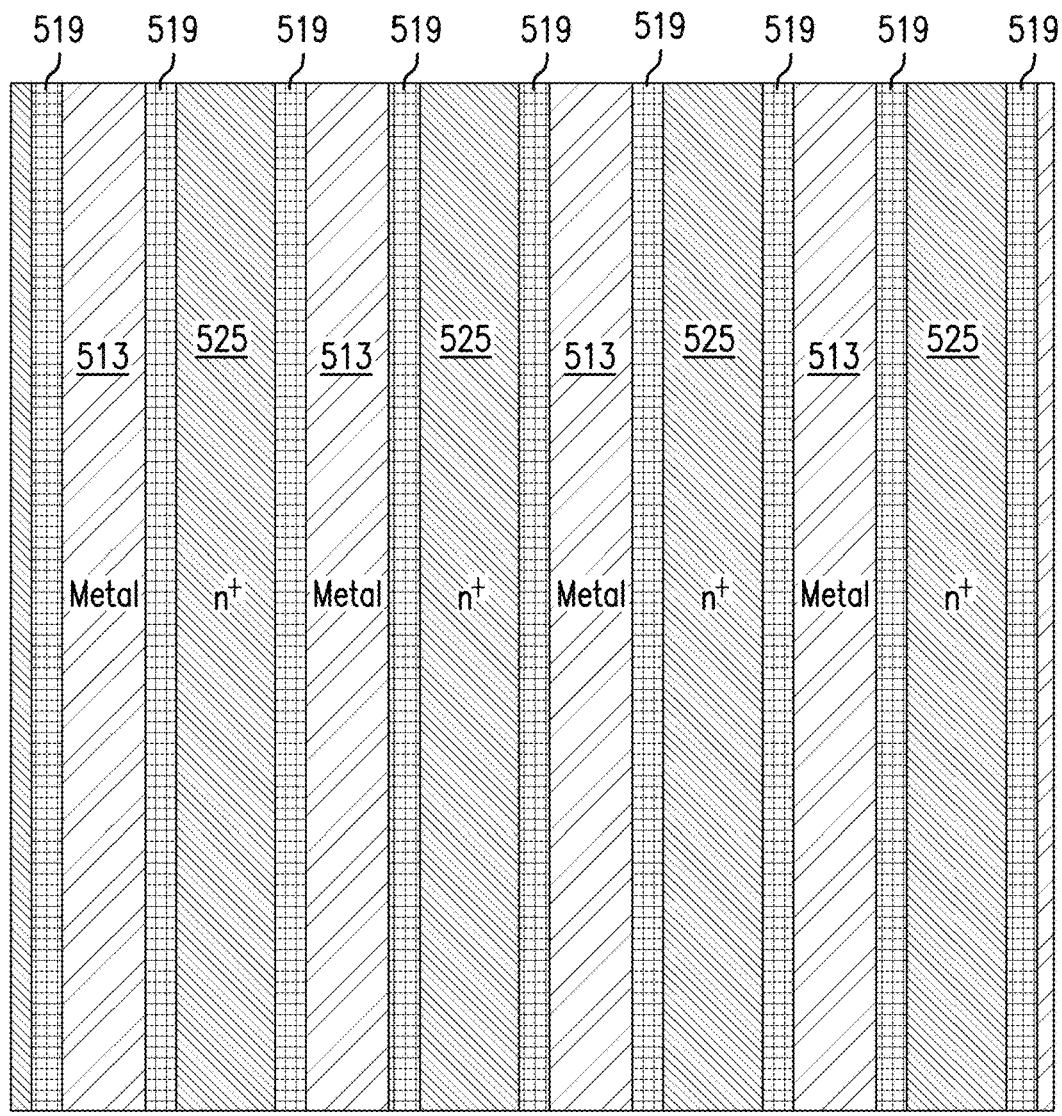
Figure 5Q:
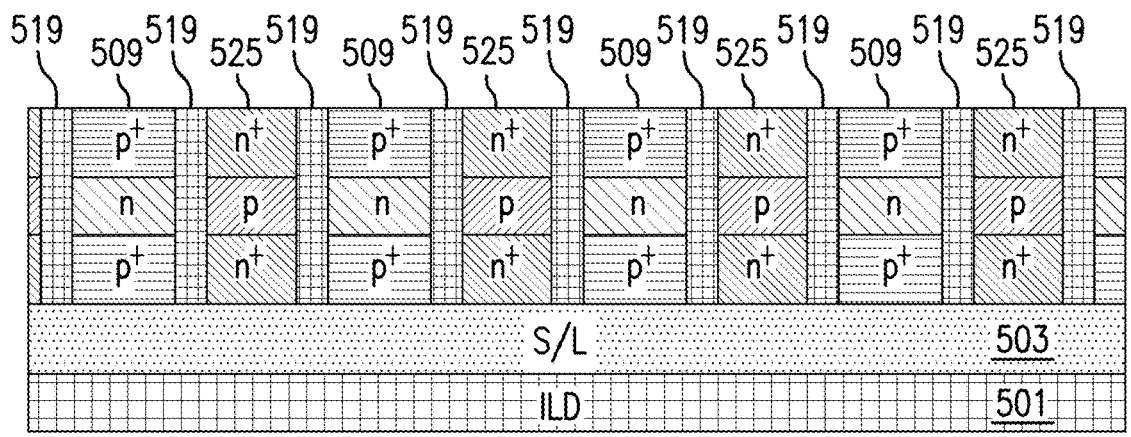
Figure 5R:
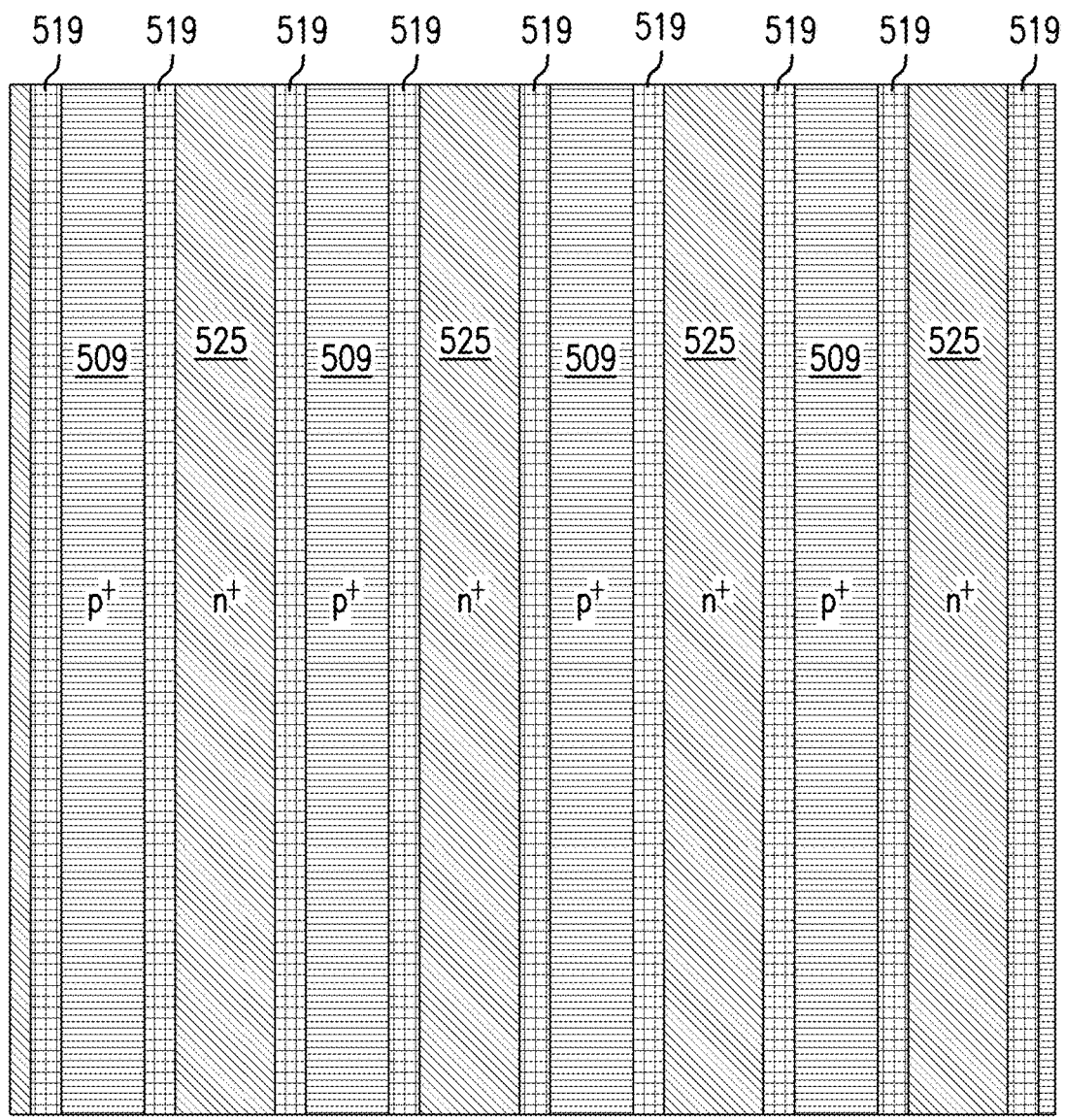
Figure 5S:
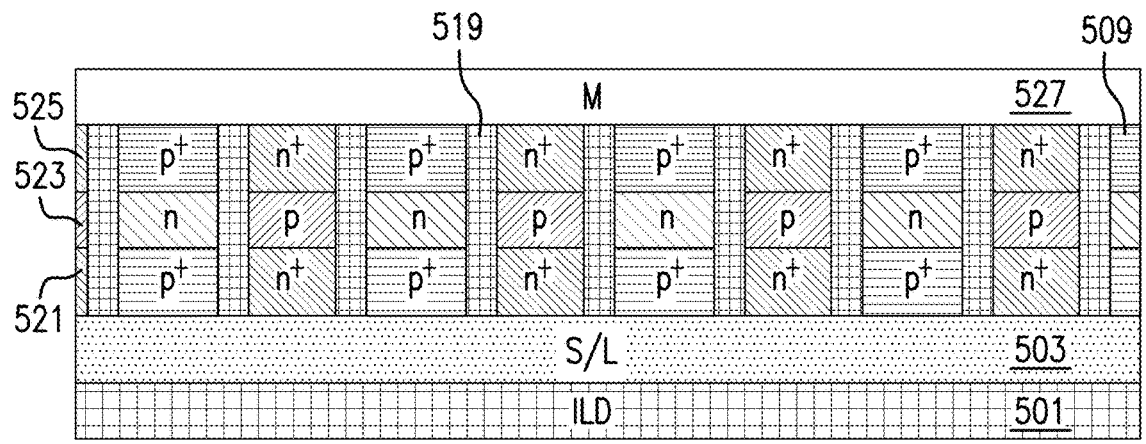
Figure 5T:
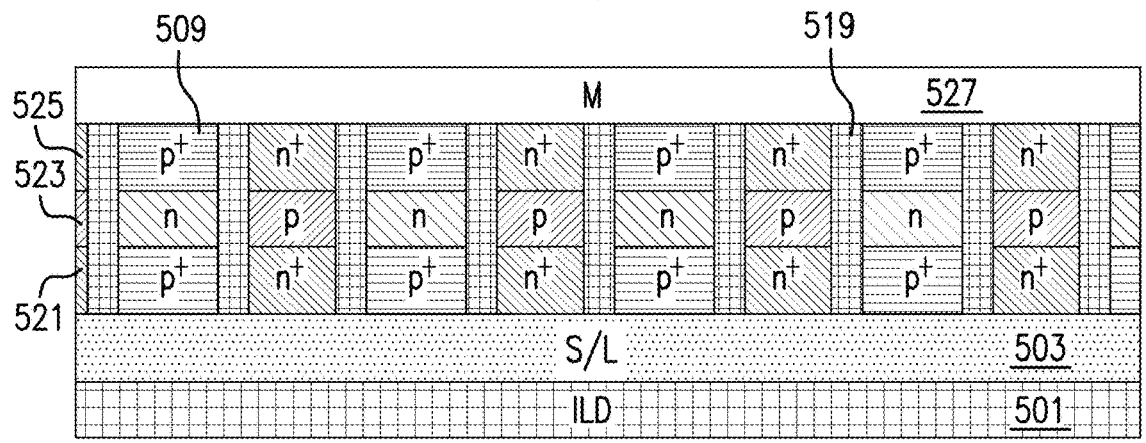
Figure 5U:
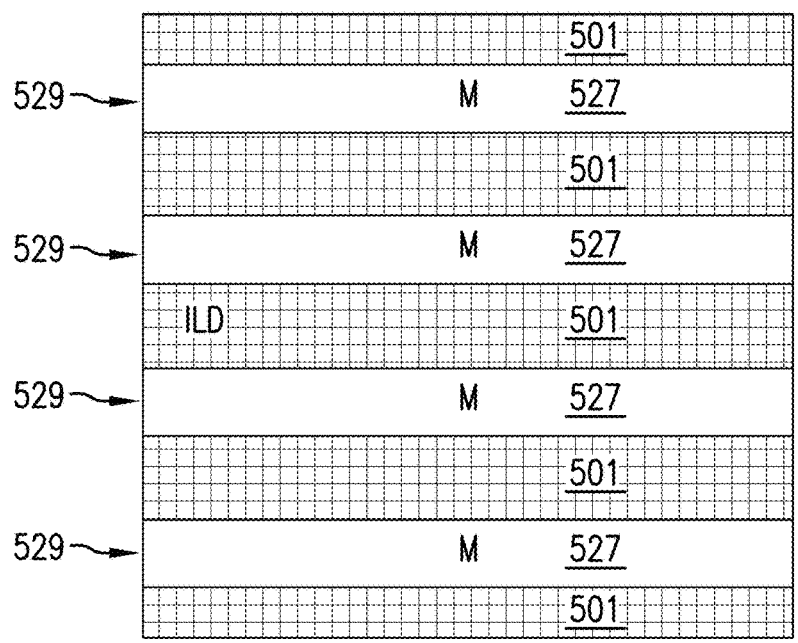
Figure 5V:
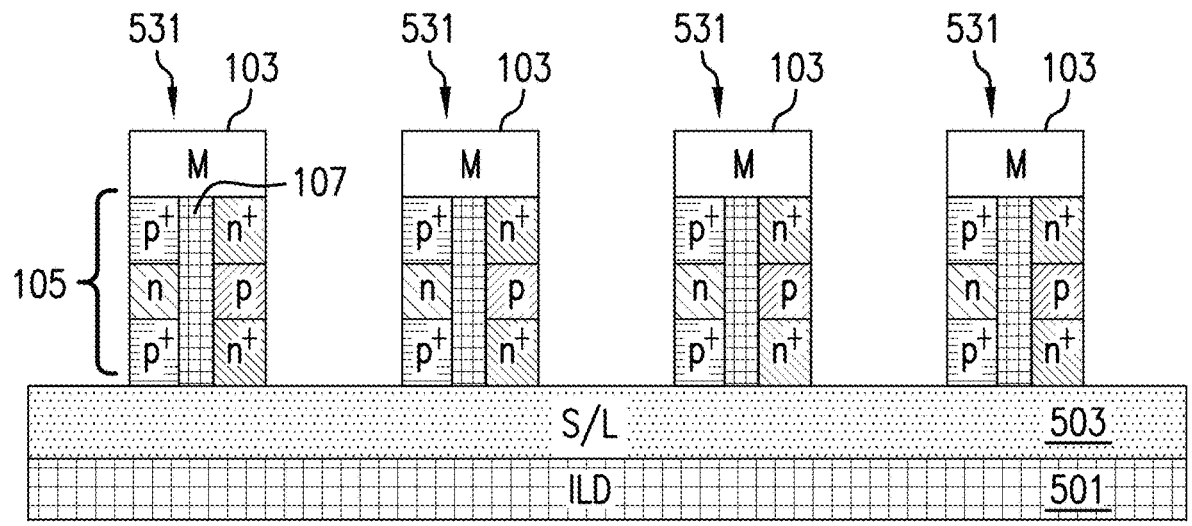
Figure 5W:
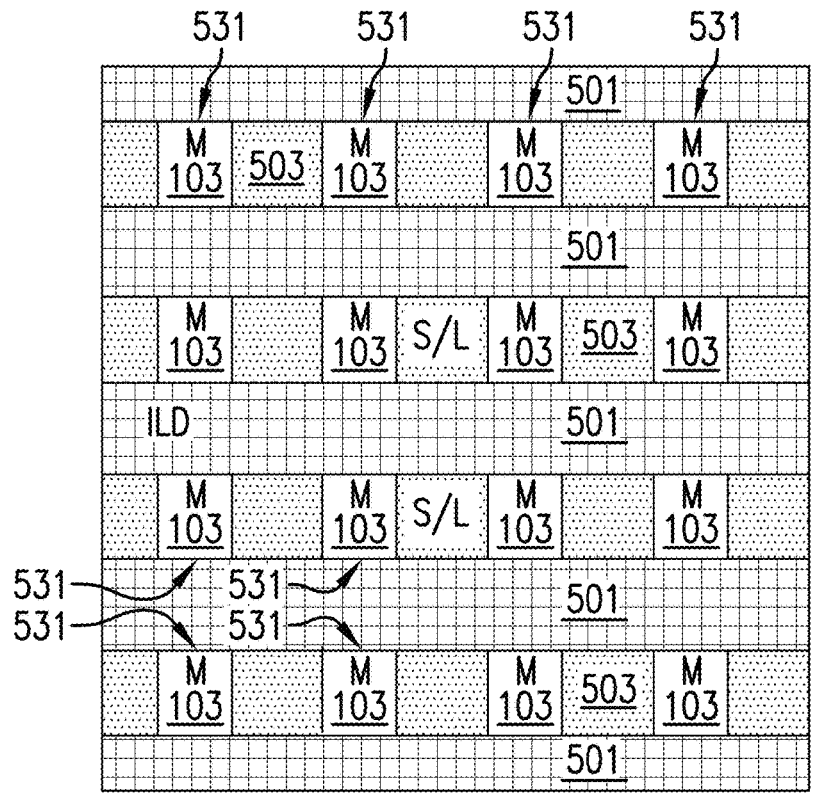
Figure 5X:
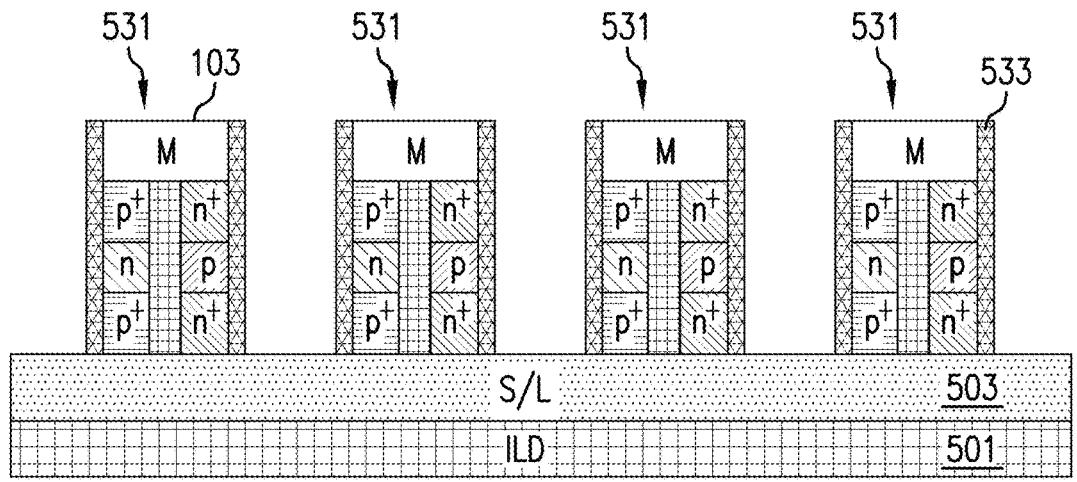
Figure 5Y:
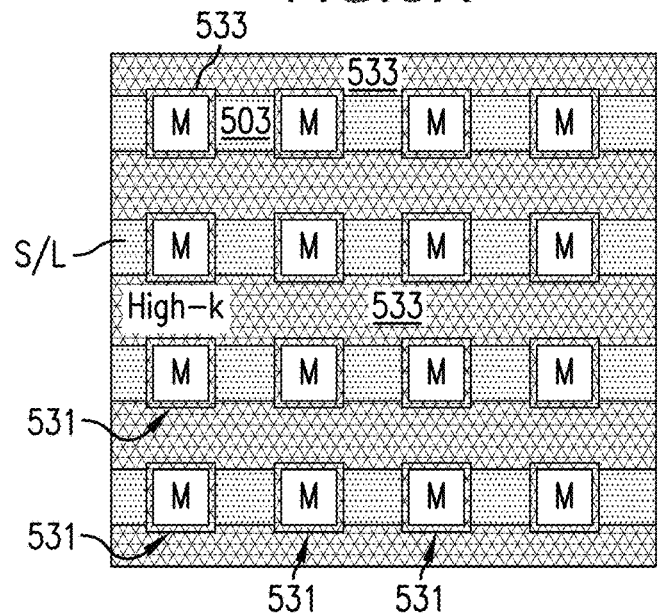
Figure 5Z:
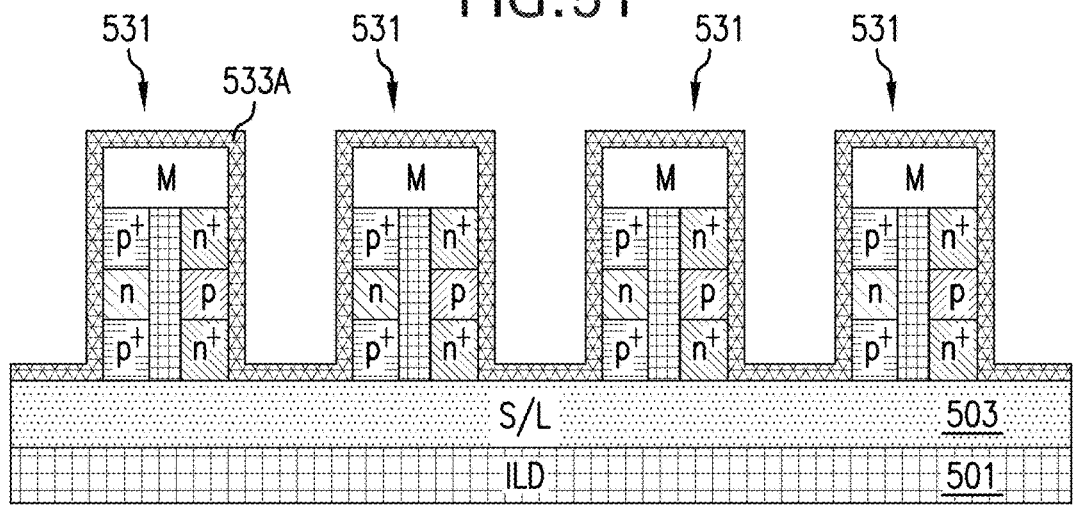
Figure 5A:
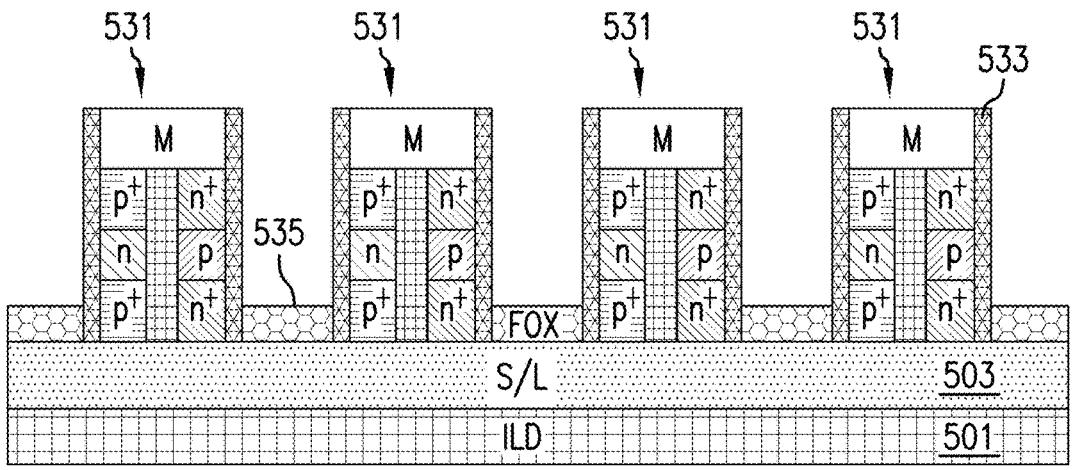
Figure 5B:
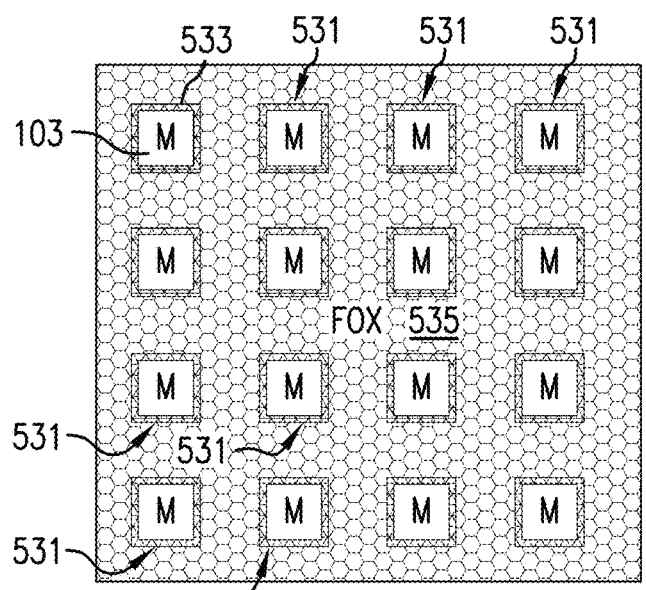
Figure 5C:
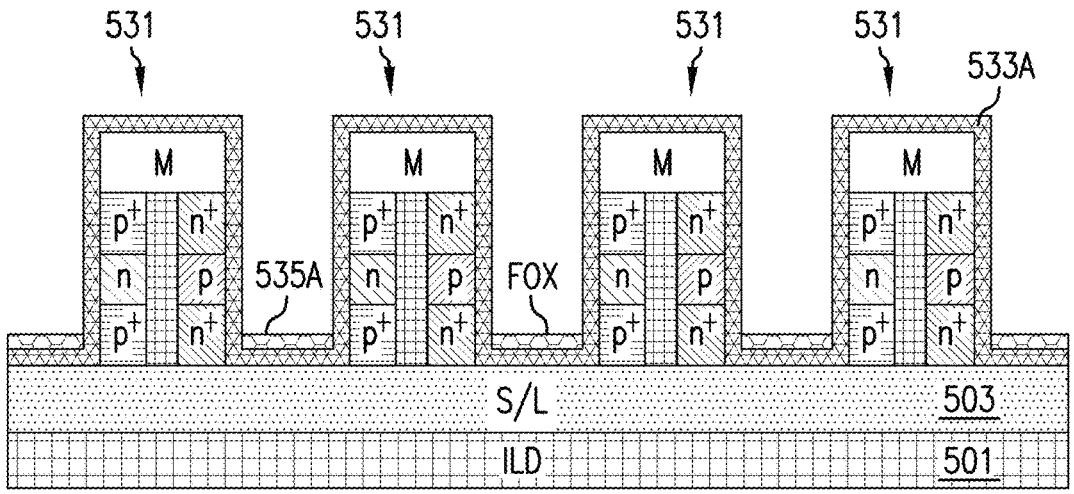
Figure 5D:
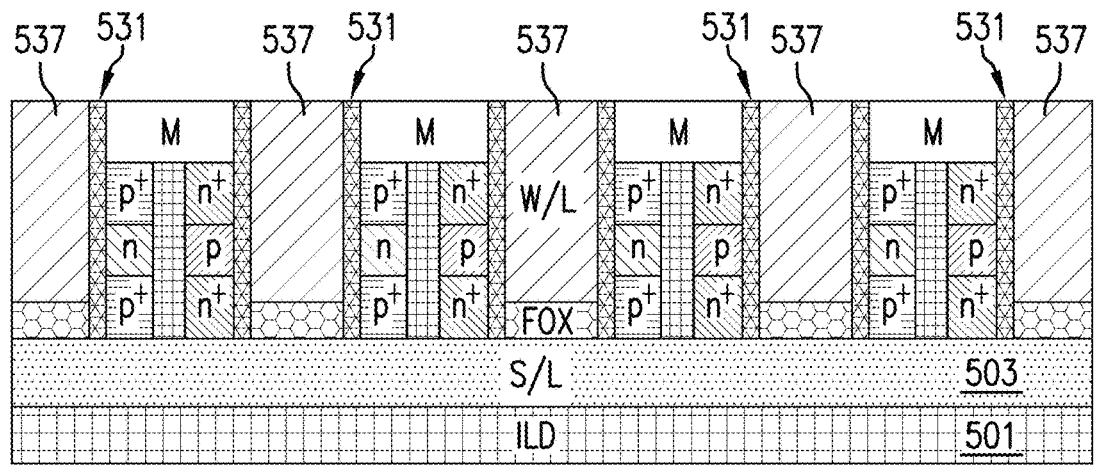
Figure 5E:
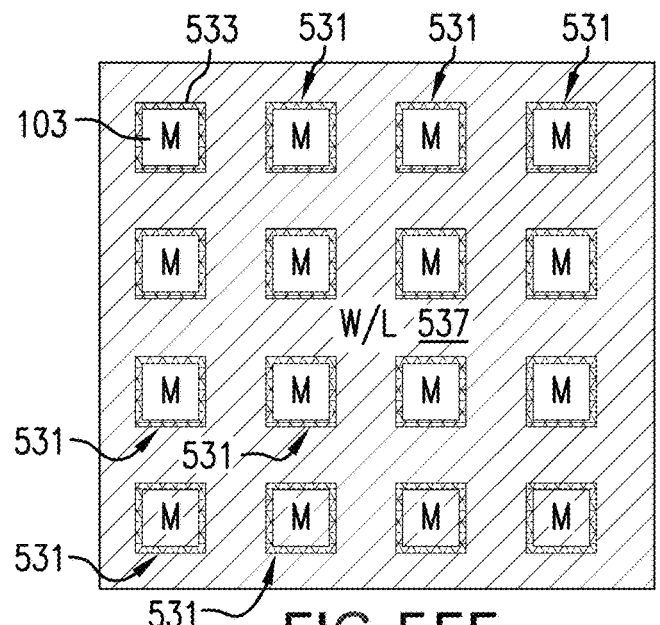
Figure 5F:
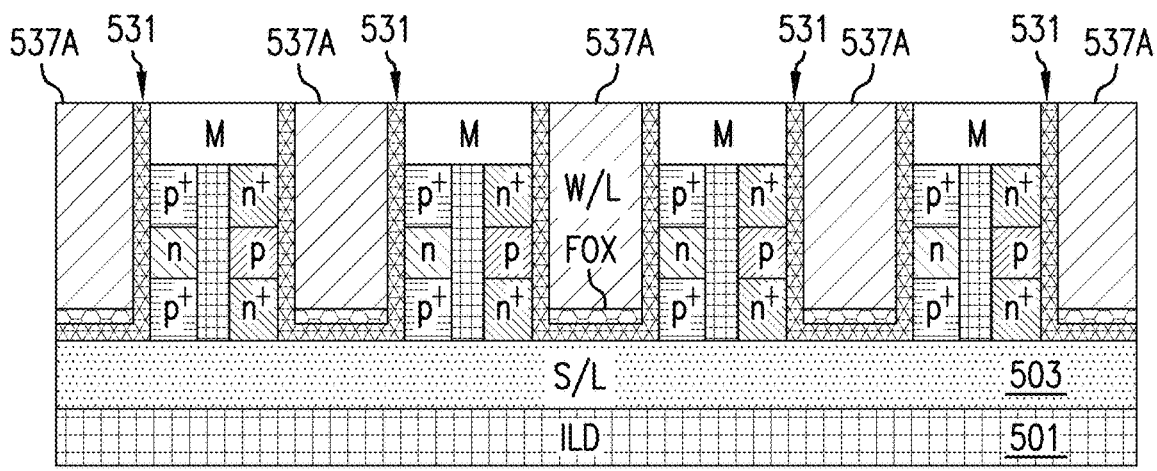
Figure 5G:
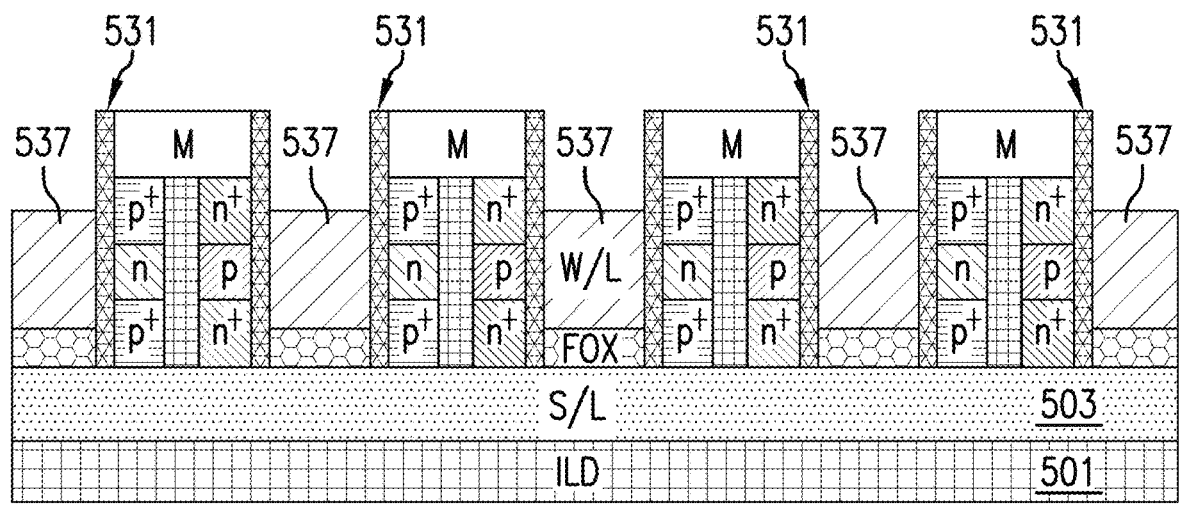
Figure 5H:
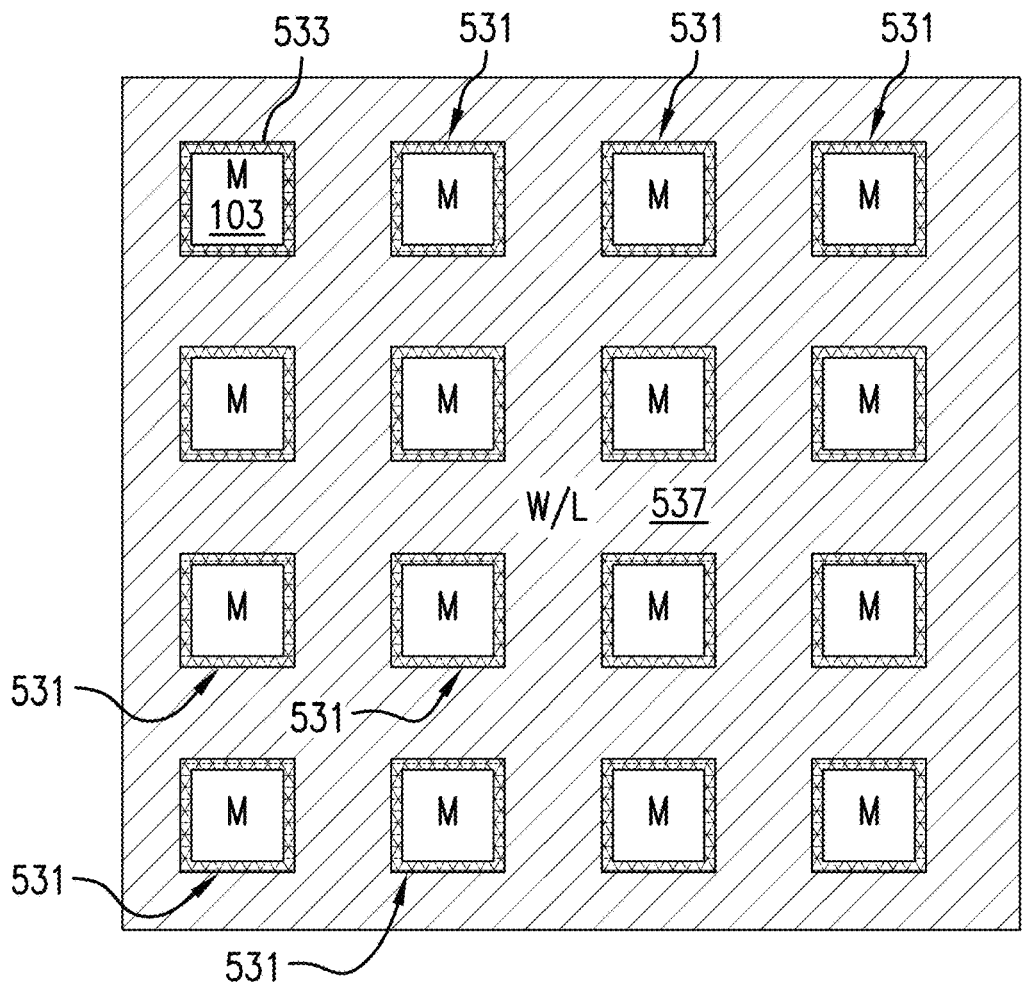
Figure 5I:
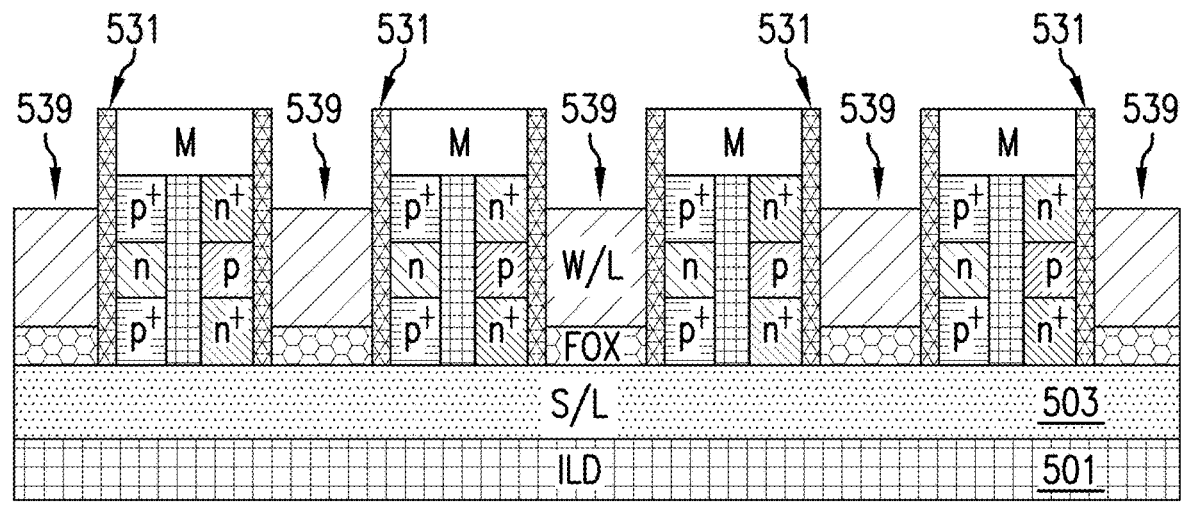
Figure 5J:
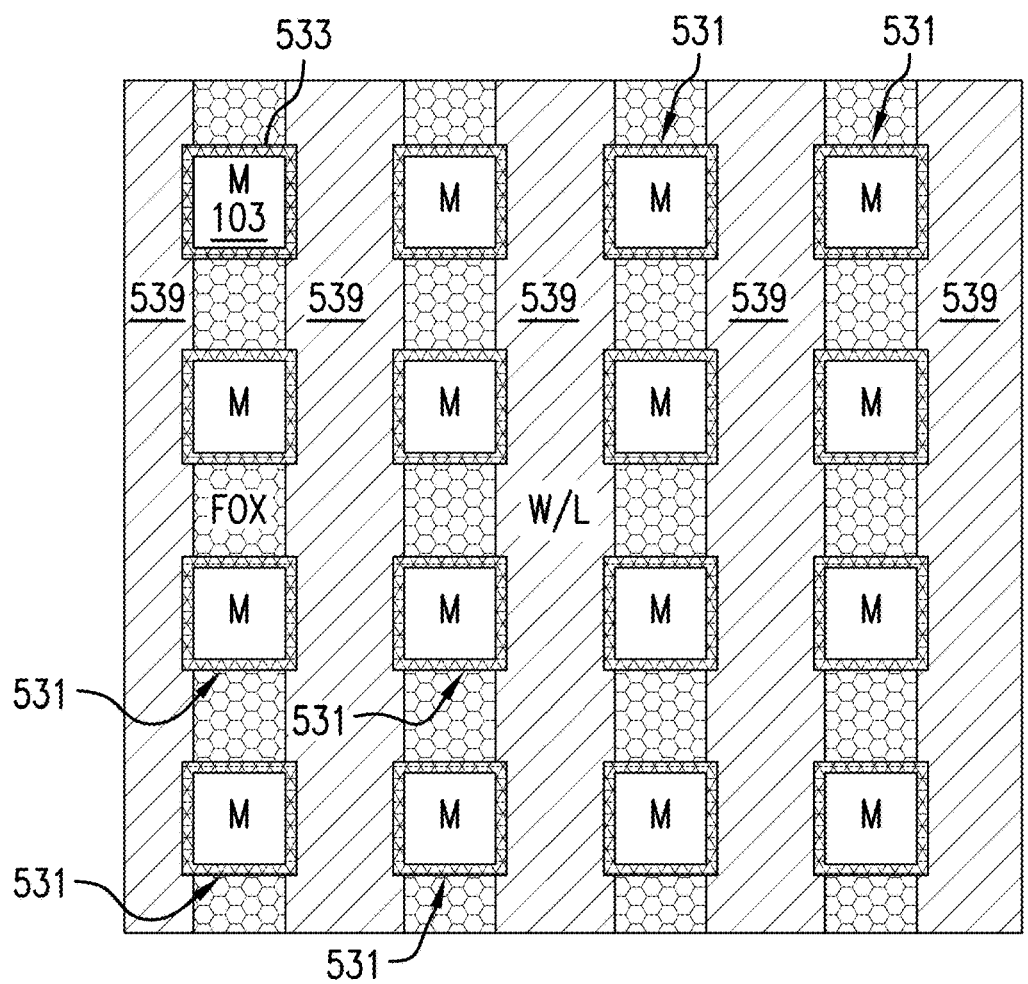
Figure 5K:
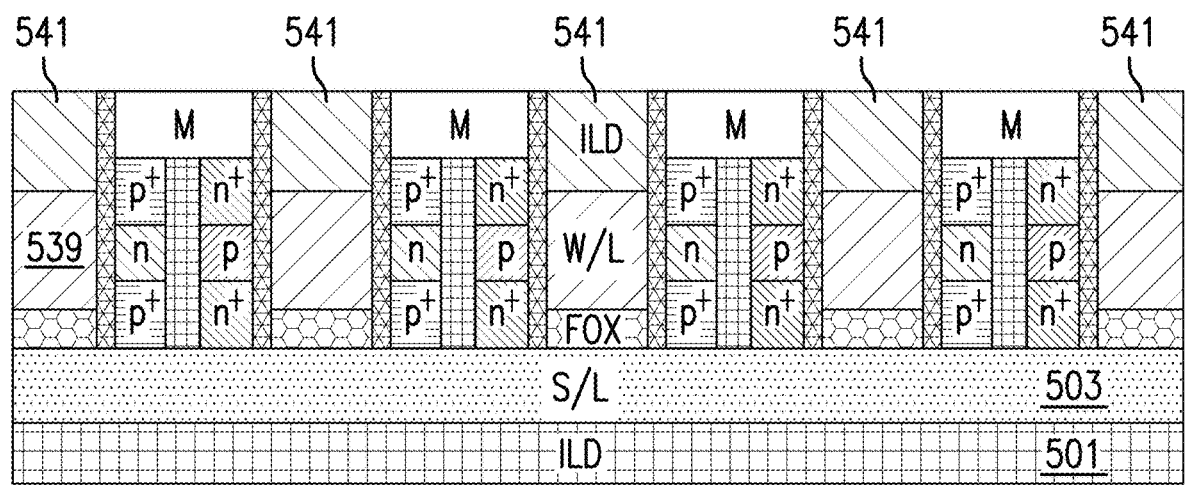
Figure 5L:
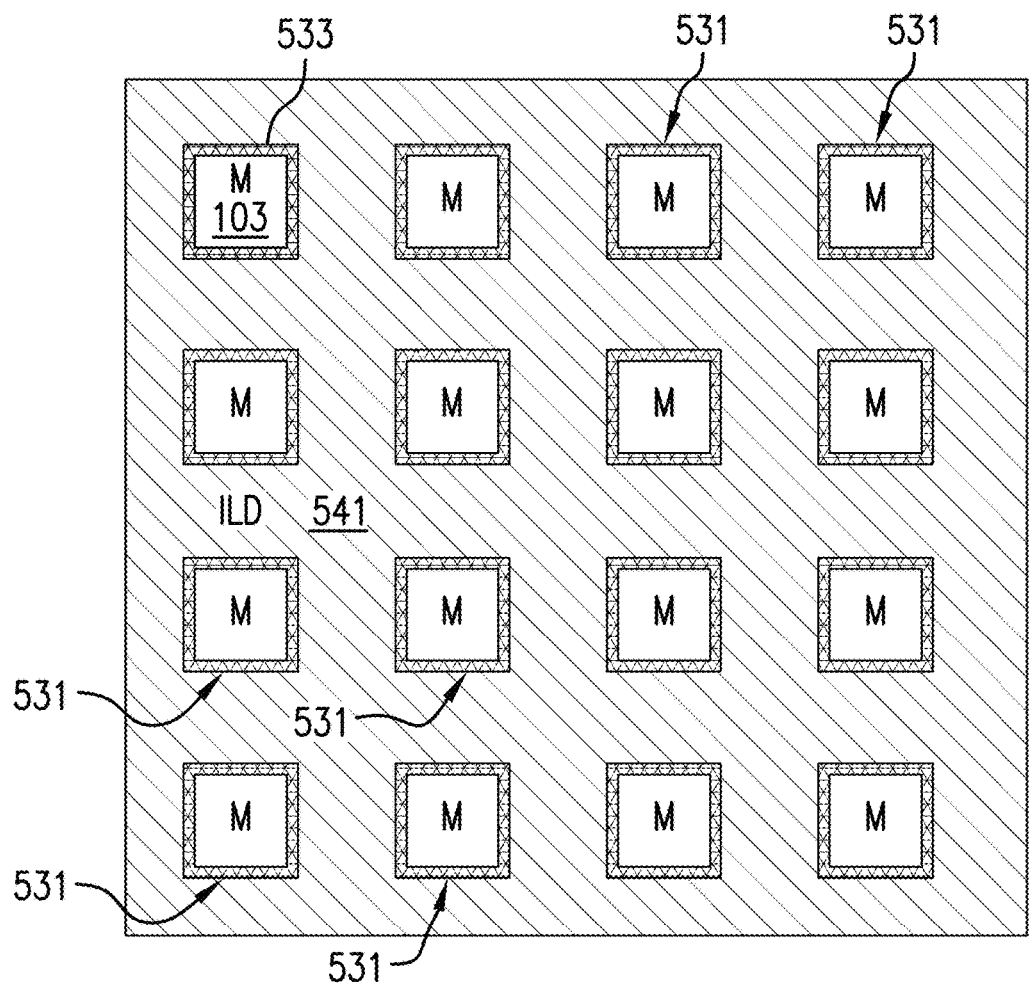
Figure 5M:
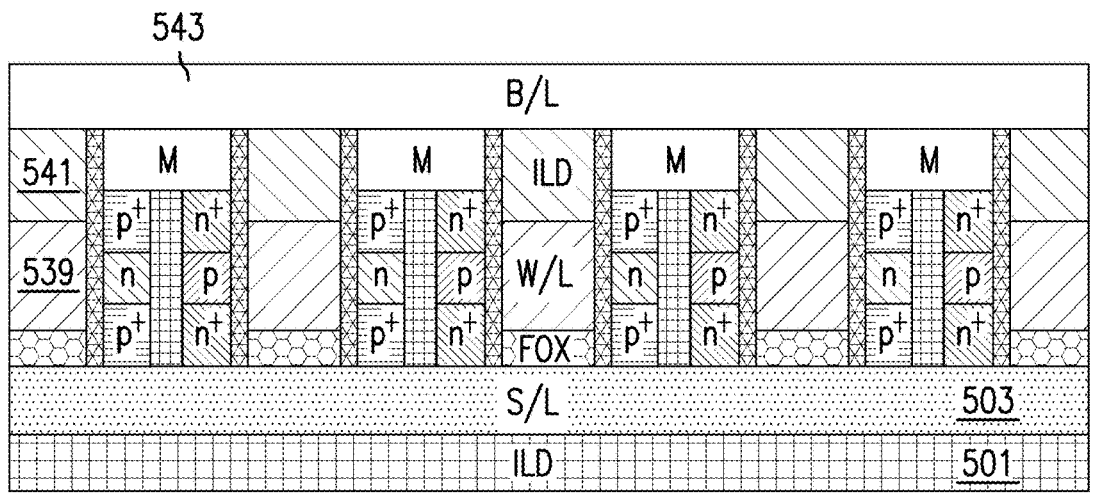
Figure 5N:
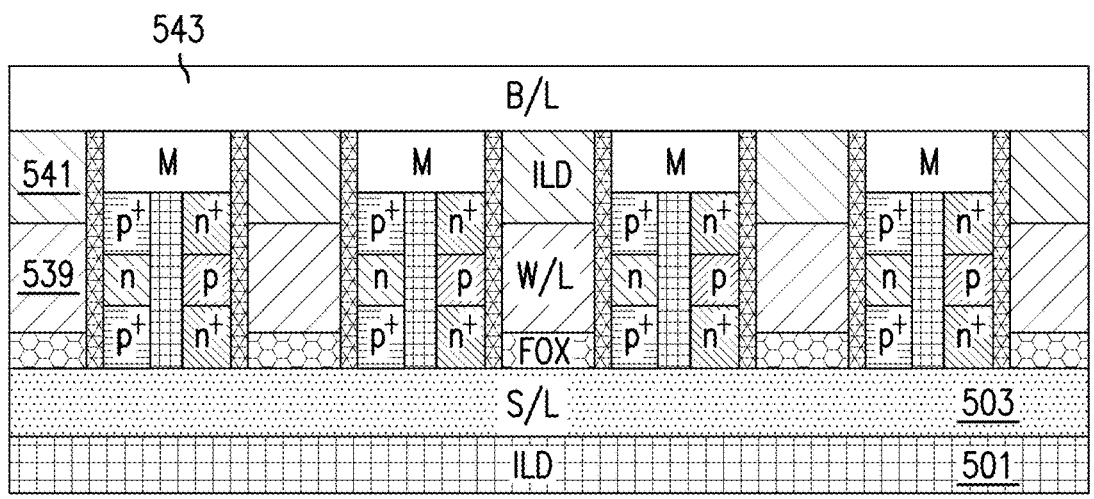
Figure 5O:
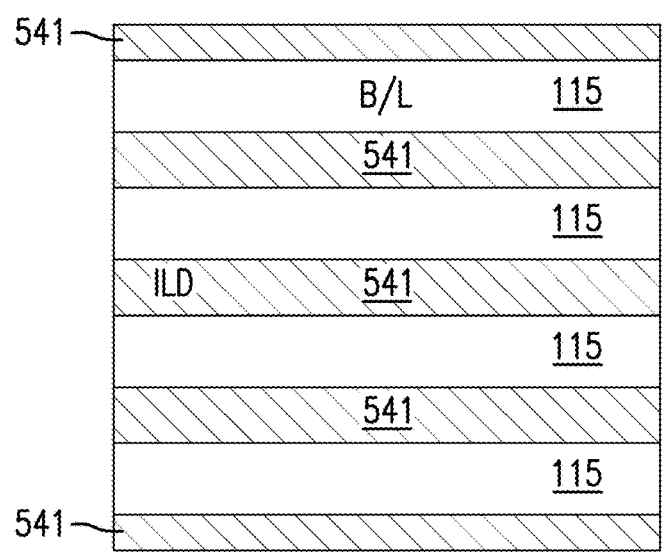

FIGS. 5A-5Z and 5AA-5OO show steps in a first exemplary process flow, according to an aspect of the invention, wherein the views are elevation views except that FIGS. 5G, 5I, 5L, 5N, 5P, 5R, 5U, 5W, 5Y, 5BB, 5EE, 5HH, 5JJ, 5LL and 5OO are top plan views of, respectively, FIGS. 5F, 5H, 5K, 5M, 5O, 5Q, 5T, 5V, 5X, 5AA, 5DD, 5GG, 5II, 5KK, and 5NN. Top plan views are omitted for brevity where the upper surface is uniform. In FIG. 5A, ILD 501 and required vias to the underlying level (underlying level and vias omitted to avoid clutter) are formed. Select-line (S/L) metal 503 is formed on the ILD 501; non-limiting examples of metal include W, TiN, and the like. In FIG. 5B, p+ amorphous silicon (a-Si) is deposited on the S/L metal 503 and converted to p+ poly-Si 505 using pulsed laser annealing. Alternatively, i (intrinsic) a-Si may be deposited and implanted before laser crystallization; or poly-Si may be implanted and activated with a second (e.g. lower energy) laser anneal. Pulsed laser annealing may include a first lower energy anneal step to dehydrogenate a-Si:H (if the deposited a-Si layer is hydrogenated), as known in the art, followed by a higher energy anneal step for crystallization. In one example, laser crystallization is performed using a pulsed excimer laser having a wavelength of 308 nm, energy density (fluence) in the range of 350-450 mJ/cm$^2$, pulse width in the range of 10-50 ns and repetition rate in the range of 100 Hz-1 KHz. The number of laser pulses (shots) may be, for example, in the range of 1-100. Dehydrogenation may be performed, for example, using excimer laser with an energy density below 300 mJ/cm$^2$.

In FIG. 5C, low-temperature PECVD epi (epitaxial) is used to grow n poly-Si:H 507. An optional low-energy laser treatment may follow to improve the crystalline quality. The low-energy laser treatment may include, for example, annealing with a pulsed excimer laser having an energy density in the range of 250-350 mJ/cm$^2$. Alternatively, n a-Si (or n a-Si:H) may be deposited and crystallized epitaxially, for example, using a pulsed excimer laser with energy density in the range of 350-450 mJ/cm$^2$. In FIG. 5D, low-temperature PECVD epi is used to grow p$^+$ poly-Si:H 509. An optional low-energy laser treatment may follow to improve the crystalline quality. Alternatively, p$^+$ a-Si (or p$^+$ a-Si:H) may be deposited and crystallized epitaxially using for example a pulsed excimer laser. In FIG. 5E, a metal/dielectric stack is deposited. The purpose of the metal layer 513 is blocking laser from the $p^+/n/p^+$ stack during the subsequent process steps. The purpose of the dielectric layer 511 is preventing metal reaction with $p^+$ Si and protection of $p^+$ Si during subsequent chemical-mechanical polishing (CMP) steps. The dielectric layer 511 may be omitted in some embodiments. In some embodiments, a dielectric layer may be deposited on the metal 513 and function as a hard-mask.

In FIGS. 5F-5G, the metal, dielectric, and poly-Si stack is patterned into lines 515; e.g., using a single mask. In some embodiments, one or more appropriate hard mask(s) may be used. The etching process stops on the select line (S/L) 503. In some embodiments, more than one lithography mask may be used, and/or the patterning process may include further steps, as known in the art, as will be appreciated by the skilled artisan, given the teachings herein. Every instance of every layer in lines 515 is not numbered in FIG. 5F, to avoid clutter. The lines 515 are separated by etched gaps 517, within which their sides are exposed. In FIGS. 5H-5I, dielectric spacers 519 are formed on the sides of lines 515 in gaps 517 using techniques known in the art; e.g., conformal deposition, followed by anisotropic etching. FIGS. 5H and 5I are illustrative (spacer dimensions are not to scale, sidewall profile is illustrative), for purposes of illustrative convenience. In FIG. 5J, $n^+$ a-Si (or $n^+$ a-Si:H) 521 is deposited, followed by CMP, using known techniques. In FIGS. 5K and 5L, $n^+$ a-Si layer 521 is etched back, using known techniques. A combination of dry and wet etch with appropriate timed etching may be used in one or more embodiments, for example. The n+ a-Si is converted to n+ poly-Si using pulsed laser annealing. Alternatively, intrinsic (i) a-Si may be deposited and implanted before laser crystallization. Pulsed laser annealing may include, for example, a first lower energy anneal step to dehydrogenate a-Si:H (if a-Si is hydrogenated), as known in the art, followed by a higher energy anneal step for crystallization. For convenience, the etched and converted layer is still designated by reference character 521.

In FIGS. 5M and 5N, low-temperature PECVD epi is used to "selectively" form p poly-Si:H 523 over the etched and converted layer 521. An optional low-energy laser treatment may follow to improve the crystalline quality. The selective formation is a two-step process in one or more embodiments; epitaxial growth of p poly-Si:H on $n^+$ poly-Si is followed by selective removal of the non-crystalline p Si:H grown elsewhere (e.g. using hydrogen plasma). The process details are disclosed in U.S. Patent Publication 2012-0210932 of Bahman Hekmatshoartabari et al., LOW-TEMPERATURE SELECTIVE EPITAXIAL GROWTH OF SILICON FOR DEVICE INTEGRATION, hereby expressly incorporated by reference herein in its entirety for all purposes. In FIGS. 5O and 5P, low-temperature PECVD epi is used to "selectively" form $n^+$ poly-Si:H 525 over the layer 523. An optional low-energy laser treatment may follow to improve the crystalline quality. The selective formation is a two-step process in one or more embodiments; epitaxial growth of $n^+$ poly-Si:H on p poly-Si:H, followed by selective removal of the non-crystalline $n^+$ Si:H grown elsewhere (e.g. using hydrogen plasma). The process details are disclosed in the aforementioned U.S. Patent Publication 2012-0210932.

In FIGS. 5Q and 5R, the metal, dielectric and a portion of the spacers 519 are removed using techniques known in the art, including, for example, CMP. In FIG. 5S, the memory stack 527 is formed. Note the memory stack may include various layers such as top and bottom electrodes, thermal barriers, passivation layers/spacers, etc. as well as other components, as known in the art. In FIGS. 5T and 5U, as best seen in FIG. 5U, the memory stack, the poly-Si stack and the select-line (S/L) are patterned into lines 529, e.g. using a single mask. One or more appropriate hard mask(s) may be used. The etching process stops on the ILD 501. In some embodiments, more than one lithography mask may be used, and/or the patterning process may include further steps, as known in the art. In FIGS. 5V and 5W, the memory stack and the poly-Si stack are patterned into pillars 531, e.g. using a single mask. One or more appropriate hard mask(s) may be used. The etching process stops on the S/L 503. In some embodiments, more than one lithography mask may be used, and/or the patterning process may include further steps, as known in the art. In some embodiments, different processes or steps known in the art may be used to form the pillars. For example, the memory stack and the poly-Si stack may be patterned into pillars first and then the S/L layer patterned into lines; or the S/L layer may be patterned into lines before the deposition of the first a-Si layer (i.e. immediately after S/L formation in FIG. 5A). It will be seen that the pillars 531 include the memory elements 103, transistor stacks 105, and dielectric spacers 107 from FIGS. 1A-1F; the pillars sit on select lines labeled 503 which correspond to elements 101 in FIGS. 1A-1F. In some embodiments, patterning of the select-line (S/L) metal may be skipped to form a common select electrode, as explained above with respect to FIG. 3.

In FIGS. 5X and 5Y, high-k dielectric 533 is formed at least on poly-Si sidewalls (i.e. sidewalls of pillars 531) using a conformal process, e.g. ALD. Depending on the high-k material, S/L material, memory material and the deposition process, the high-k material may be formed on all or parts of the memory and the S/L as well, e.g. as shown in the alternative embodiment of FIG. 5Z, where the high-k is designated as 533A. The fabrication process can be adjusted accordingly in case of the alternative embodiment. In FIGS. 5AA and 5BB, flowable oxide (FOX) 535 is deposited using techniques known in the art. In the alternative embodiment of FIG. 5CC (corresponding to FIG. 5Z), the FOX is designated as 535A and resides on top of the high-k material. In FIGS. 5DD and 5EE, word-line (W/L) metal 537 is deposited, followed by CMP for planarization. Non-limiting examples of metal include W, TiN, etc. In the alternative embodiment of FIG. 5FF (corresponding to FIGS. 5Z and 5CC), the metal is designated as 537A. In FIGS. 5GG and 5HH, as best seen in FIG. 5GG, metal 537 is etched back using known techniques, e.g. wet or dry etch with timed etching. In some embodiments, the metal-etch back step may be skipped; the consequence will typically be larger source/drain (S/D) overlap capacitance, which may be tolerated in some applications. A similar etch-back can be used in the alternative embodiment. In FIGS. 5II and 5JJ, as best seen in FIG. 5JJ, metal 537 is patterned into lines 539 (e.g. corresponding to 131, 133, 135, 137 . . . ) using a masking step and etching. Note there may be some inconsequential misalignment due to the masking steps (not explicitly shown). A similar patterning can be used in the alternative embodiment.

In FIGS. 5KK and 5LL, ILD 541 is deposited and planarized by CMP. A similar deposition and planarization can be used in the alternative embodiment. In FIG. 5MM, bit-line (B/L) metal 543 is deposited to make contact to the memory top electrode (e.g. the CMP of ILD described in FIGS. 5KK and 5LL can also expose the top electrode of the memory 103, or an additional CMP may be used). Non-limiting examples of metal include W, TiN, and the like. A similar deposition can be used in the alternative embodiment. In FIGS. 5NN and 5OO, as best seen in FIG. 5OO, the bit-line (B/L) metal 543 is patterned into lines 115. A similar patterning can be used in the alternative embodiment. In some embodiments, patterning of the bit-line (B/L) metal 543 may be skipped to form a common-electrode for all memory elements, as explained with respect to FIG. 3. The process described in FIGS. 5A-5OO can be repeated to stack additional layers of cross-point memory arrays and create a 3D cross-point memory structure.

Figure 6A:
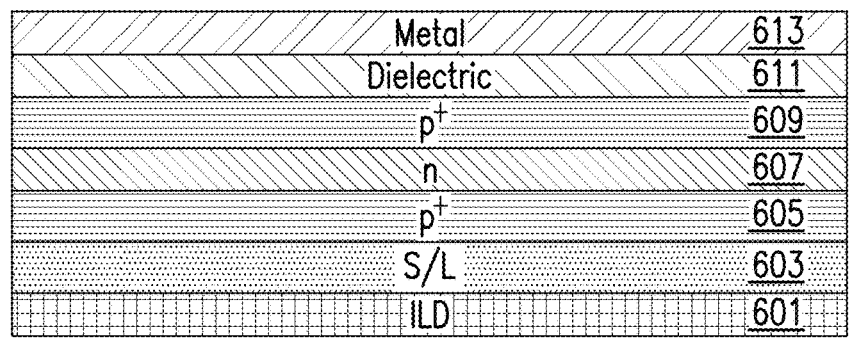
FIGS. 6A-6O show steps in a second exemplary process flow, according to an aspect of the invention, wherein the views are elevation views except that FIGS. 6C, 6E, 6G, 6I, 6K, 6M, and 6O are top plan views of, respectively, FIGS. 6B, 6D, 6F, 6H, 6J, 6L, and 6N.
Figure 6B:
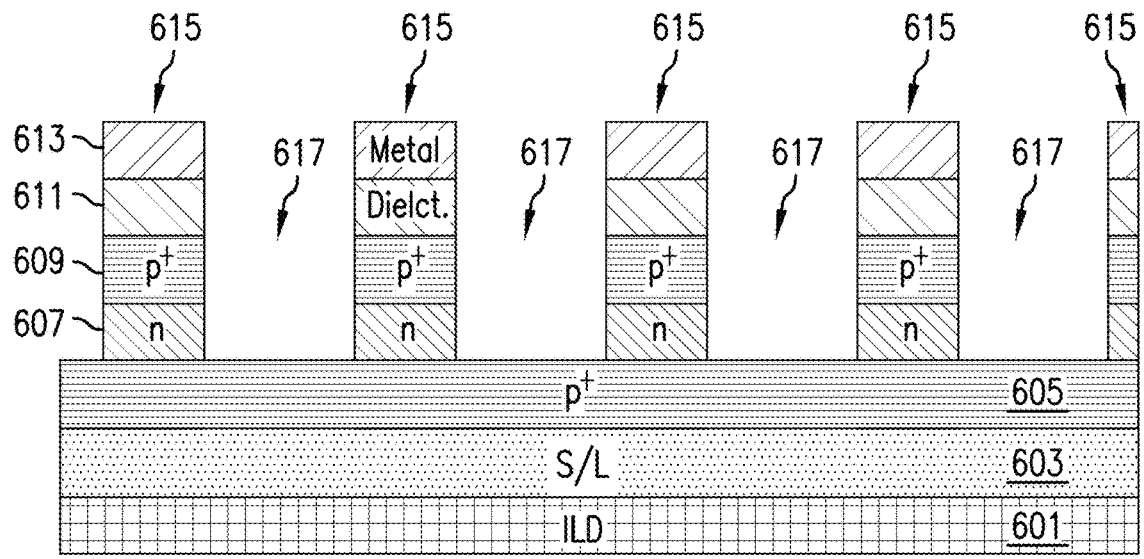
Figure 6C:
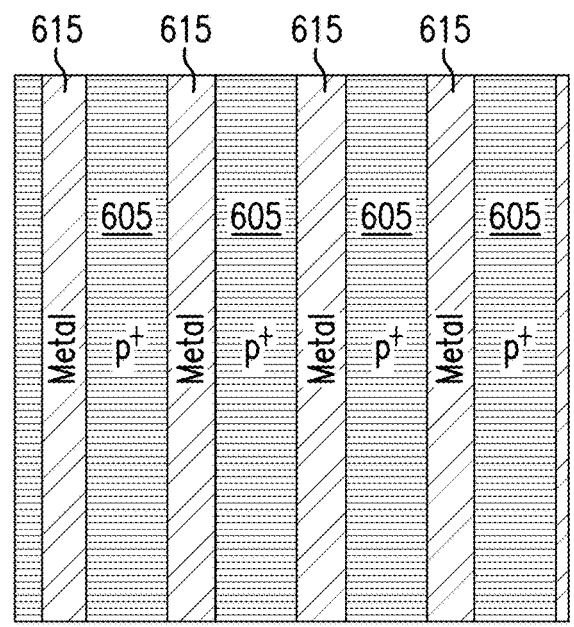
Figure 6D:
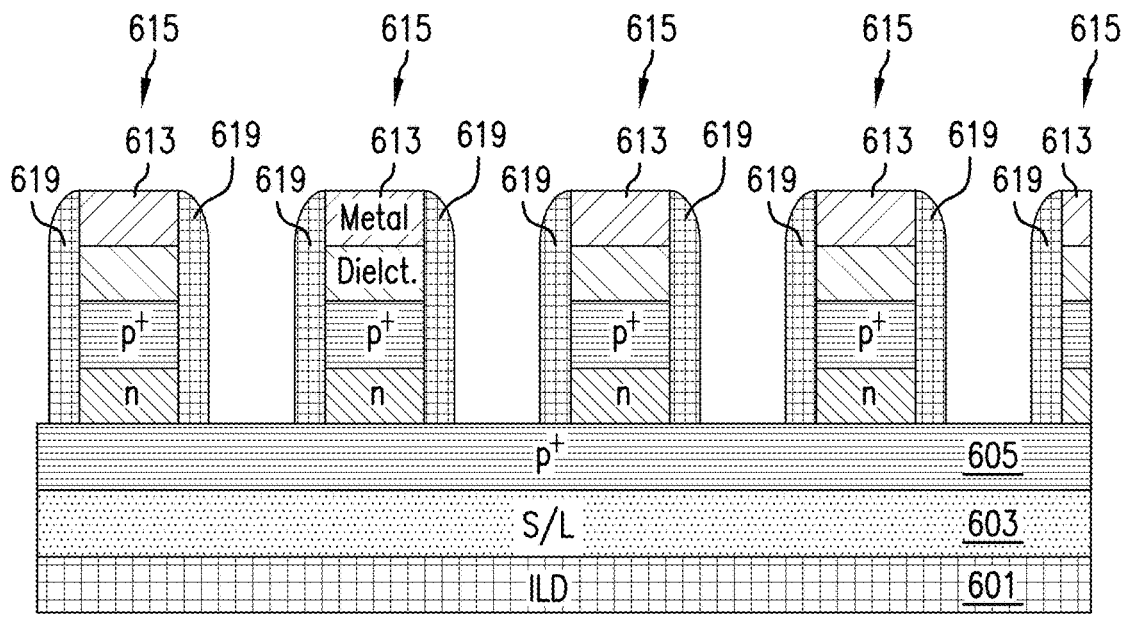
Figure 6E:
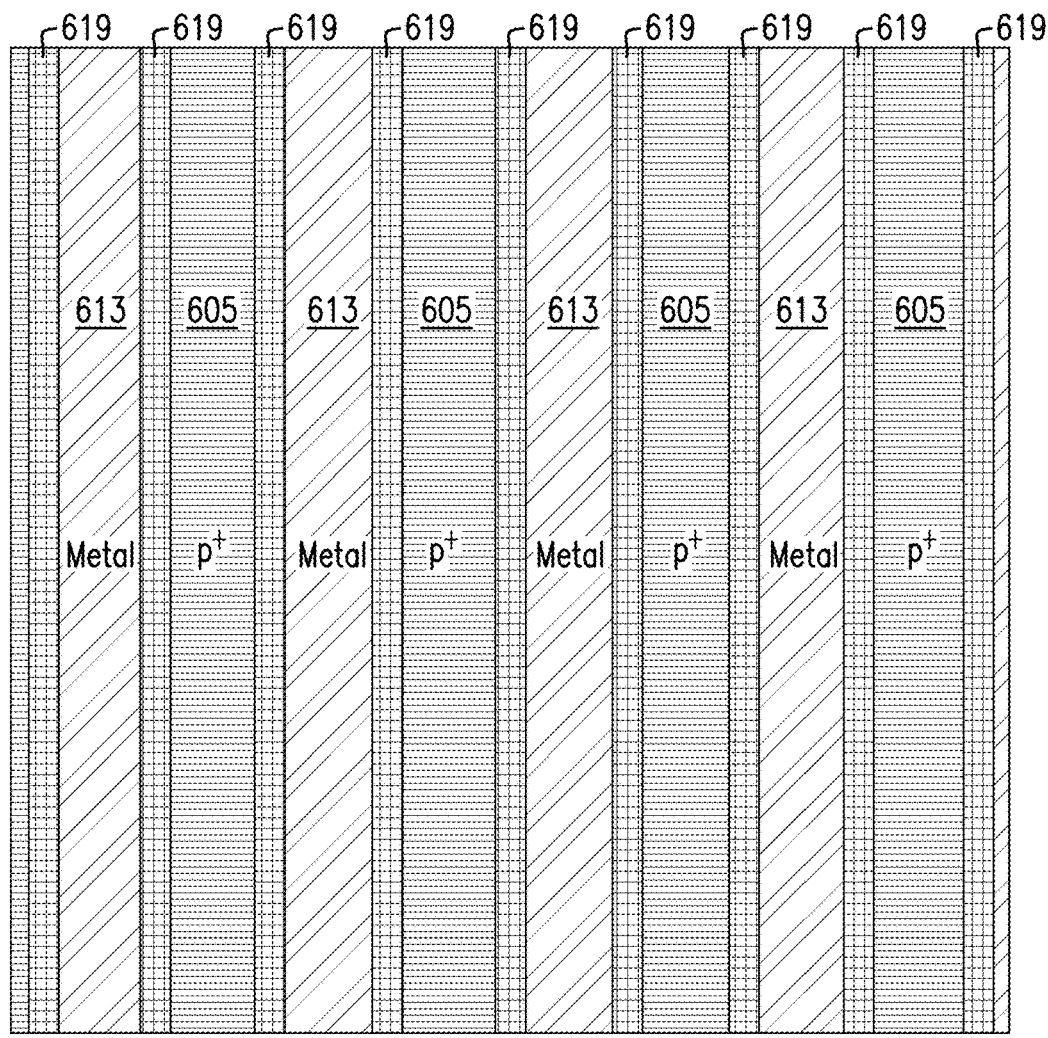
Figure 6F:
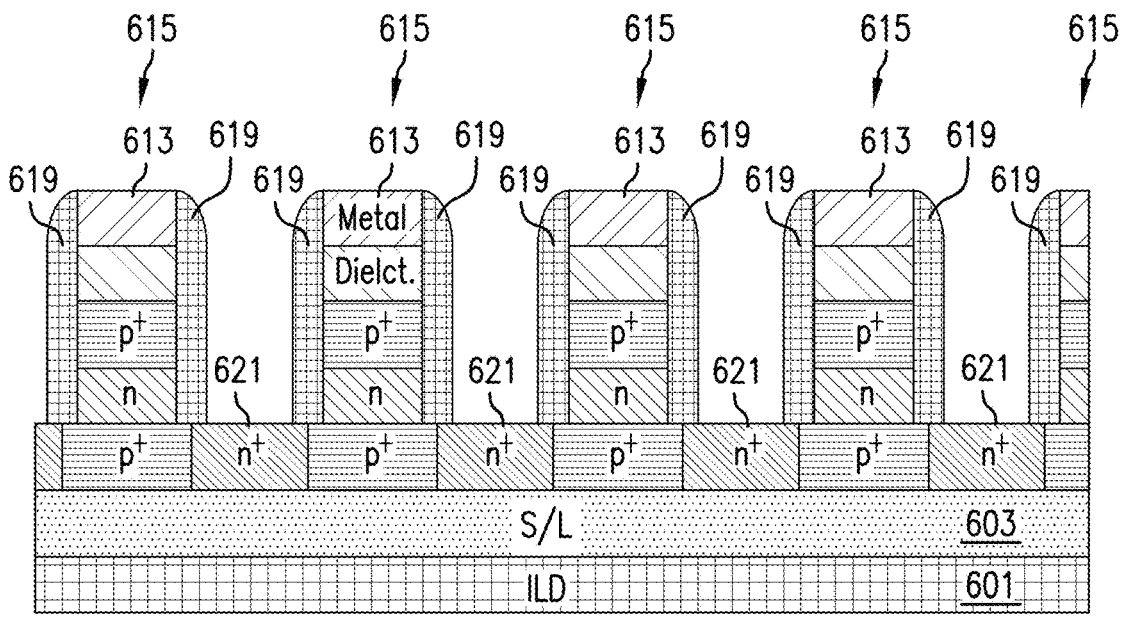
Figure 6G:
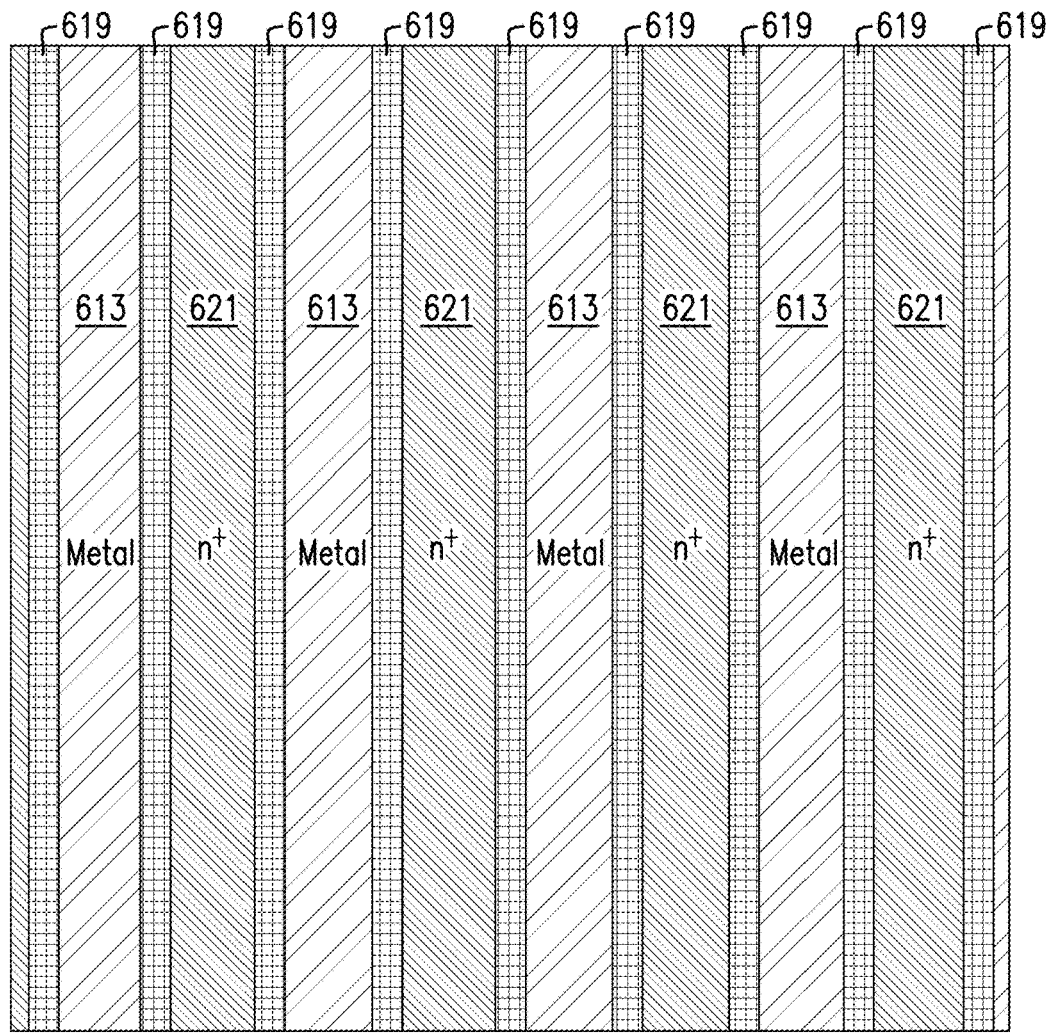
Figure 6H:
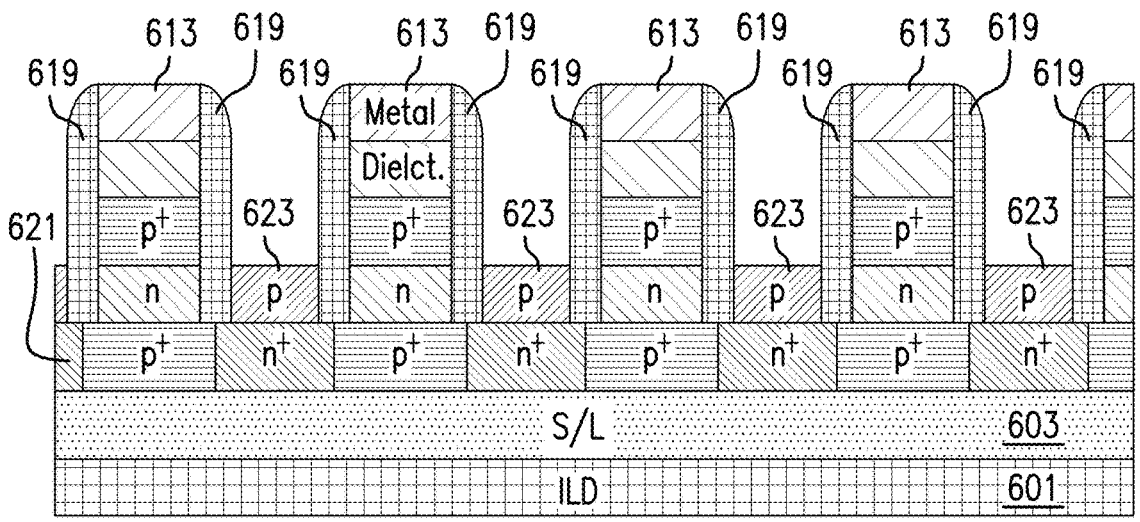
Figure 6I:
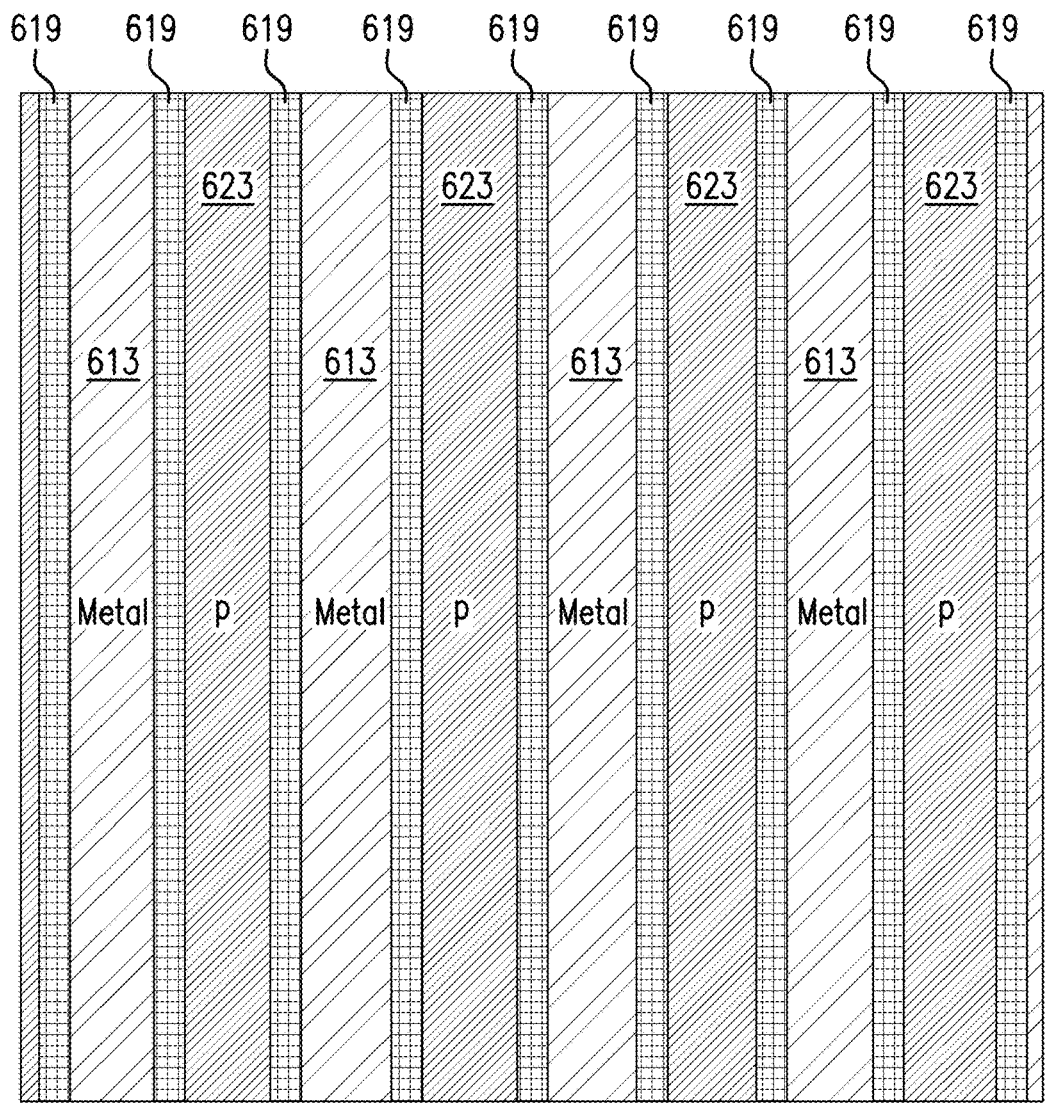
Figure 6J:
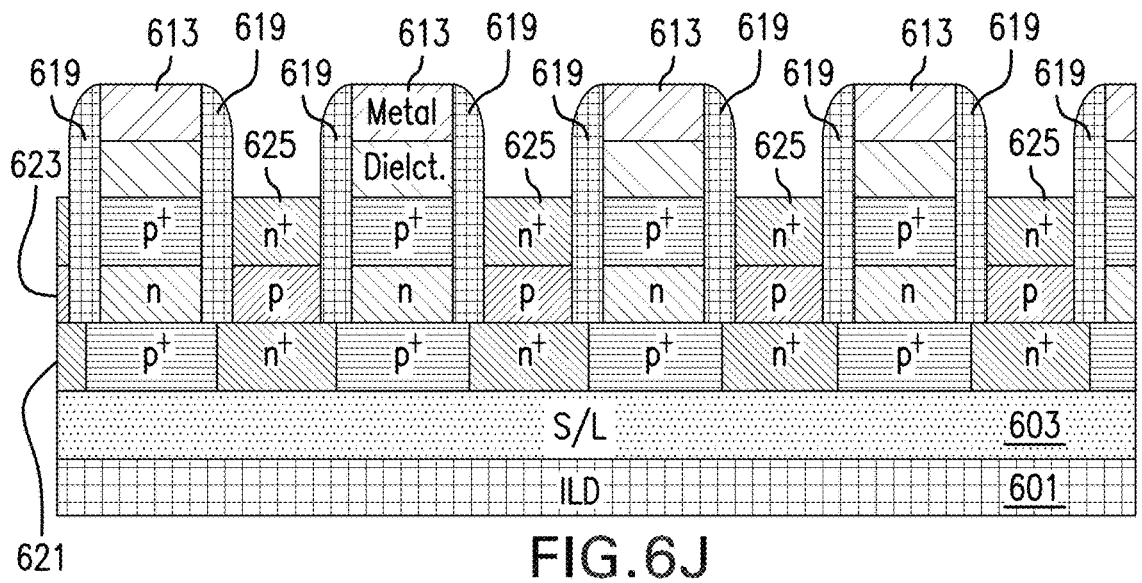
Figure 6K:
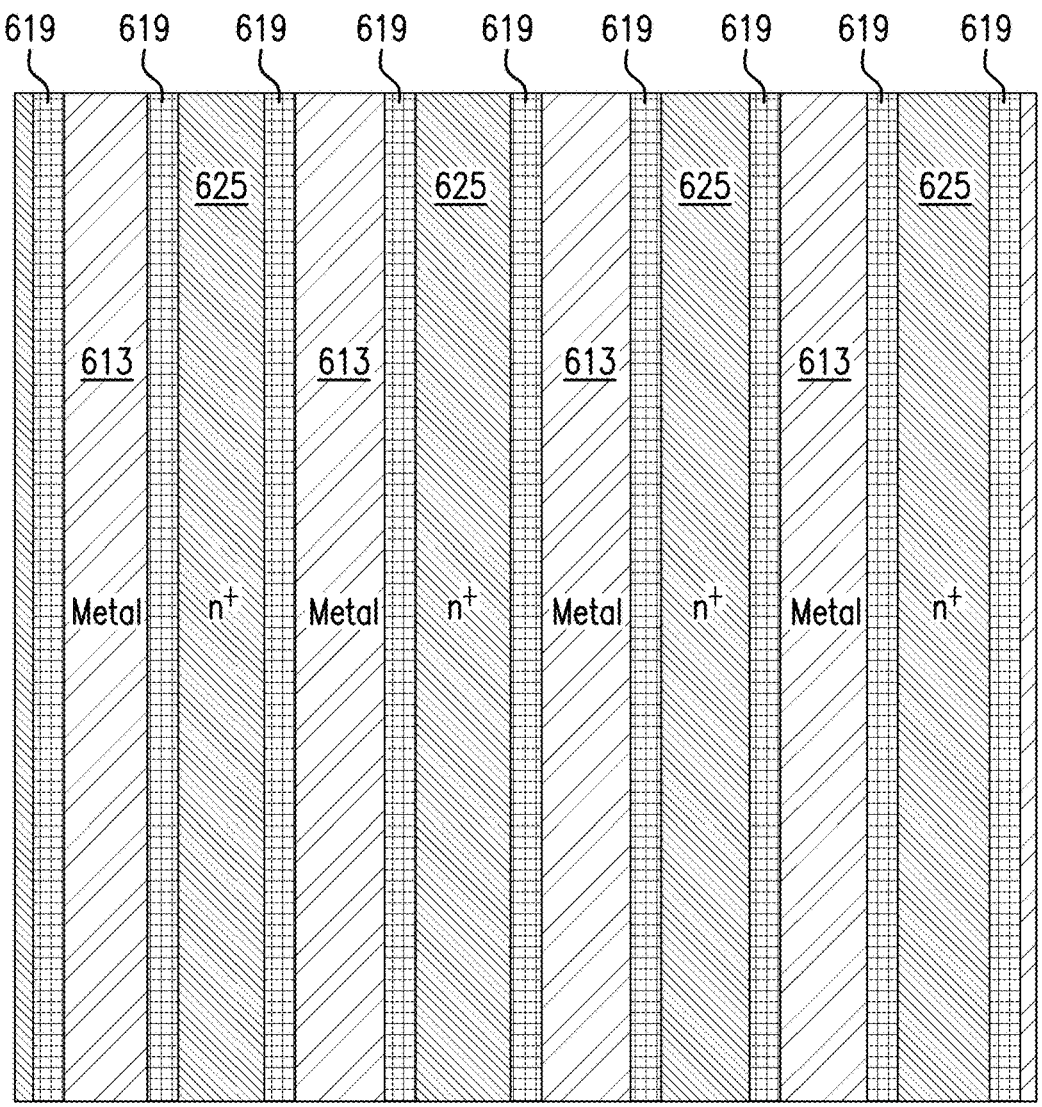
Figure 6L:
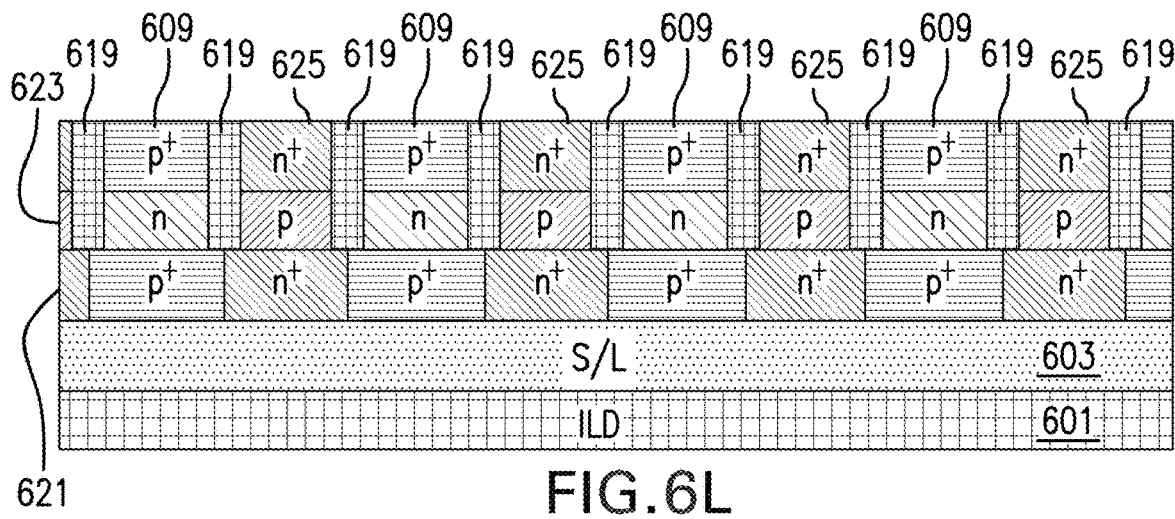
Figure 6M:
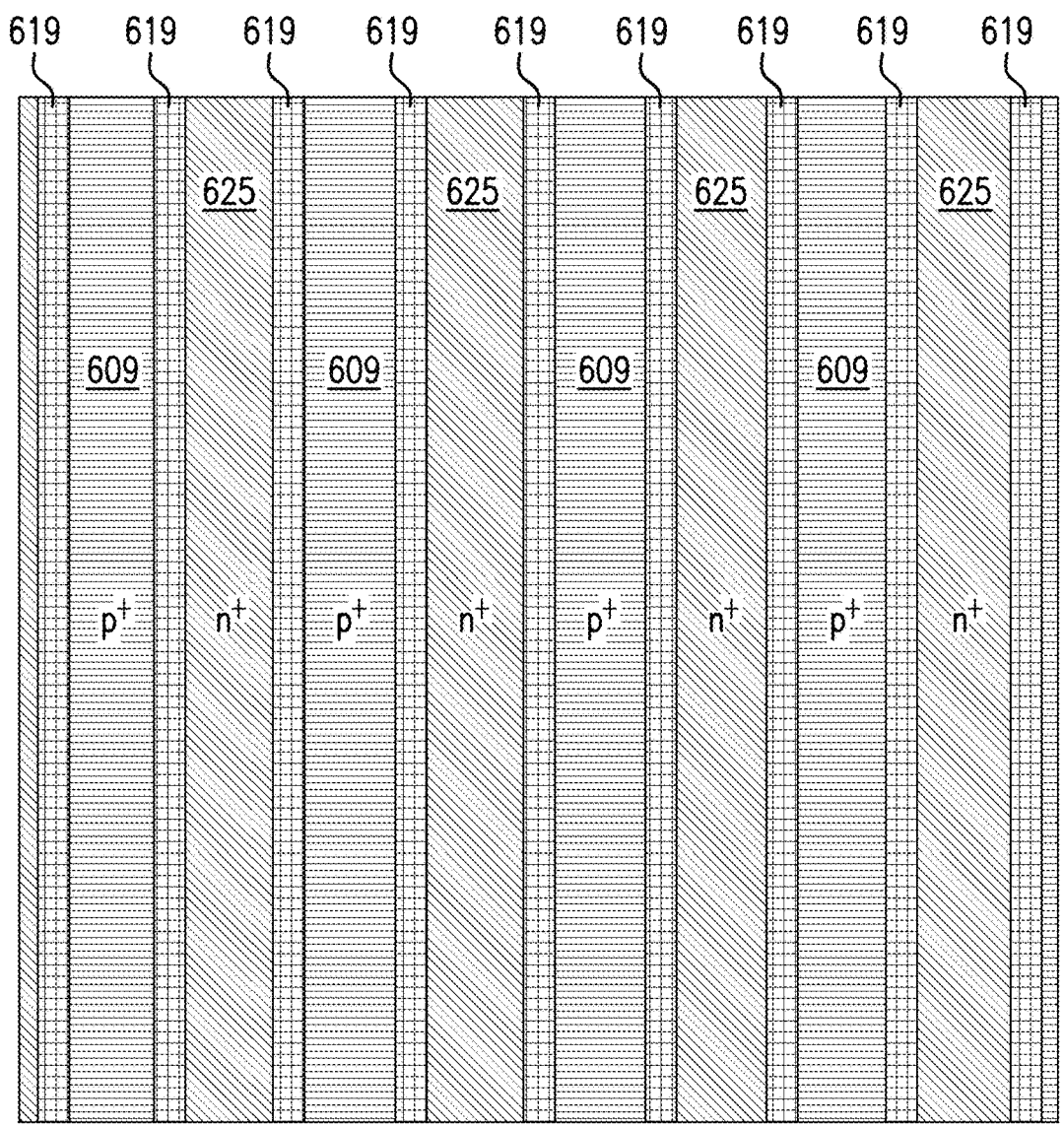
Figure 6N:
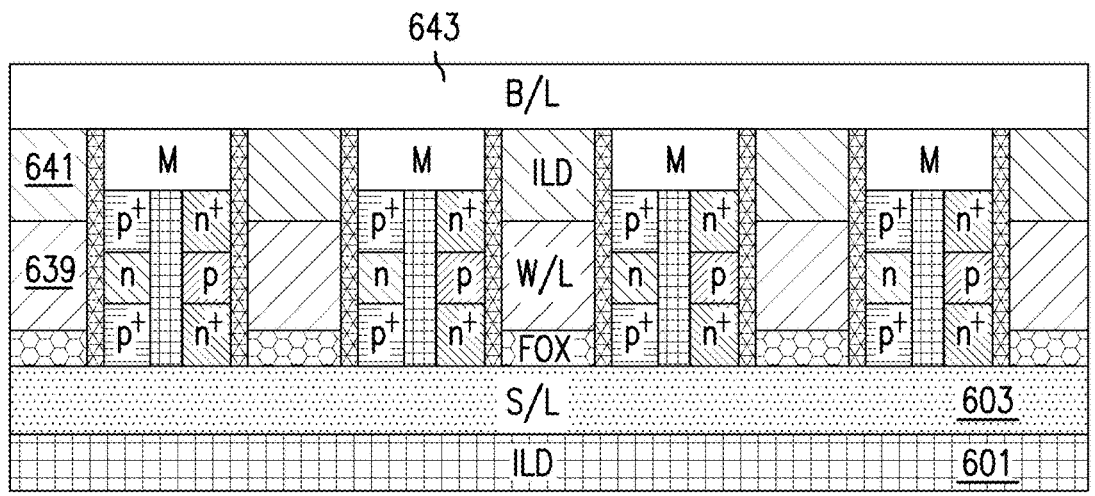
Figure 6O:
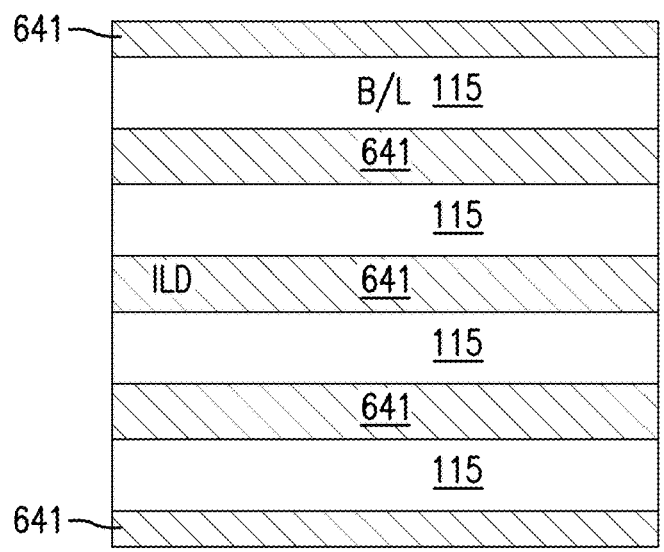

FIGS. 6A-6O show steps in a second exemplary process flow, according to an aspect of the invention, wherein the views are elevation views except that FIGS. 6C, 6E, 6G, 6I, 6K, 6M, and 6O are top plan views of, respectively, FIGS. 6B, 6D, 6F, 6H, 6J, 6L, and 6N. Referring now to FIG. 6A, a metal/dielectric/$p^+$/n/$p^+$ stack is formed on the S/L using the process flow described in FIGS. 5A-5E for the first exemplary process flow. The layers 601, 603, 605, 607, 609, 611, 613 correspond to the layers 501, 503, 505, 507, 509, 511, 513. Similar to the first exemplary process flow, the dielectric layer may be omitted in some embodiments, or a dielectric layer may be deposited on metal and function as a hard-mask. Referring now to FIGS. 6B and 6C, the metal, dielectric, and $p^+$/n poly-Si stack is patterned into lines 615, e.g. using a single mask. Gaps 617 are defined between the sidewalls of the lines. In some embodiments, one or more appropriate hard mask(s) may be used. The etching process stops on $p^+$ poly-Si 605. In one example, the top $p^+$ 609 and a portion of the n layer 607 are etched with reactive-ion etching (RIE), followed by wet-etching using TMAH (Tetramethyl ammonium hydroxide) or KOH (potassium hydroxide) which etch n but stop on $p^+$. In some embodiments, more than one lithography mask may be used, and/or the patterning process may include further steps, as known in the art. In FIGS. 6D and 6E, dielectric spacers 619 are formed on the sidewalls using techniques known in the art, e.g. conformal deposition, followed by anisotropic etching. The drawing is illustrative (spacer dimensions are not to scale; sidewall profile is illustrative). In FIGS. 6F and 6G, ion-implantation is used to counter-dope the exposed $p^+$ poly-Si 605 into $n^+$, designated as 621. In one or more embodiments, a pulsed laser-annealing step is performed to activate doping; multiple laser shots can be used as needed to diffuse $n^+$ doping under a portion of the spacer 619.

In FIGS. 6H and 6I, low-temperature PECVD epi is used to "selectively" form p poly-Si:H 623. An optional low-energy laser treatment may follow to improve the crystalline quality. In one or more embodiments, the selective formation is a two-step process: epitaxial growth of p poly-Si:H on $n^+$ poly-Si, followed by selective removal of the non-crystalline p Si:H grown elsewhere (e.g. using hydrogen plasma). The process details were disclosed in the aforementioned U.S. Patent Publication 2012-0210932. In FIGS. 6J and 6K, low-temperature PECVD epi is used to "selectively" form $n^+$ poly-Si:H 625. An optional low-energy laser treatment may follow to improve the crystalline quality. In one or more embodiments, the selective formation is a two-step process: epitaxial growth of $n^+$ poly-Si:H on p poly-Si:H, followed by selective removal of the non-crystalline $n^+$ Si:H grown elsewhere (e.g. using hydrogen plasma). The process details were disclosed in the aforementioned U.S. Patent Publication 2012-0210932.

In FIGS. 6L and 6M, the metal 613, dielectric 611, and a portion of the spacers 619 are removed using techniques known in the art; e.g., including CMP. The memory (M), gate dielectric, W/L and B/L are then formed using the process flow described in FIGS. 5S-5OO for the first exemplary process flow; the final structure is shown in FIGS. 6N and 6O. Similar to the first exemplary process flow, the process steps for the second exemplary process flow can be repeated to create a 3D cross-point memory structure. Note the word line metal 639, ILD 641, and bit line metal 643 patterned to form bit lines 115. In some embodiments, the patterning of either the select-line metal or the bit-line metal may be skipped to form a common-electrode, as explained with respect to FIG. 3.

Figure 7A:
FIGS. 7A-7P show steps in a third exemplary process flow, according to an aspect of the invention, wherein the views are elevation views except that FIGS. 7D, 7G, 7I, 7L, 7N, and 7P are top plan views of, respectively, FIGS. 7B, 7C, 7F, 7H, 7K, 7M, and 7O.
Figure 7B:
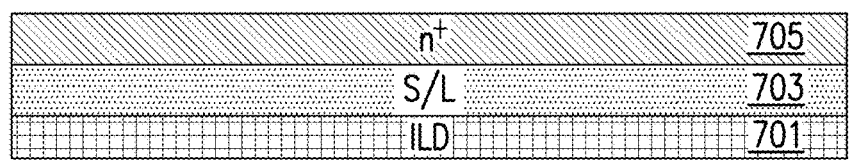
Figure 7C:
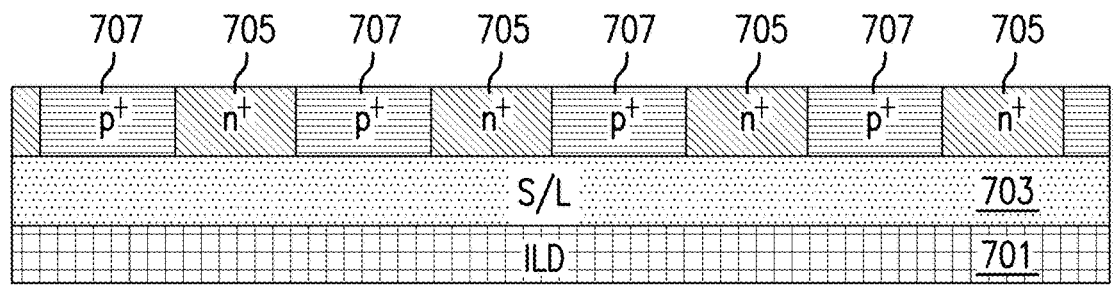
Figure 7D:
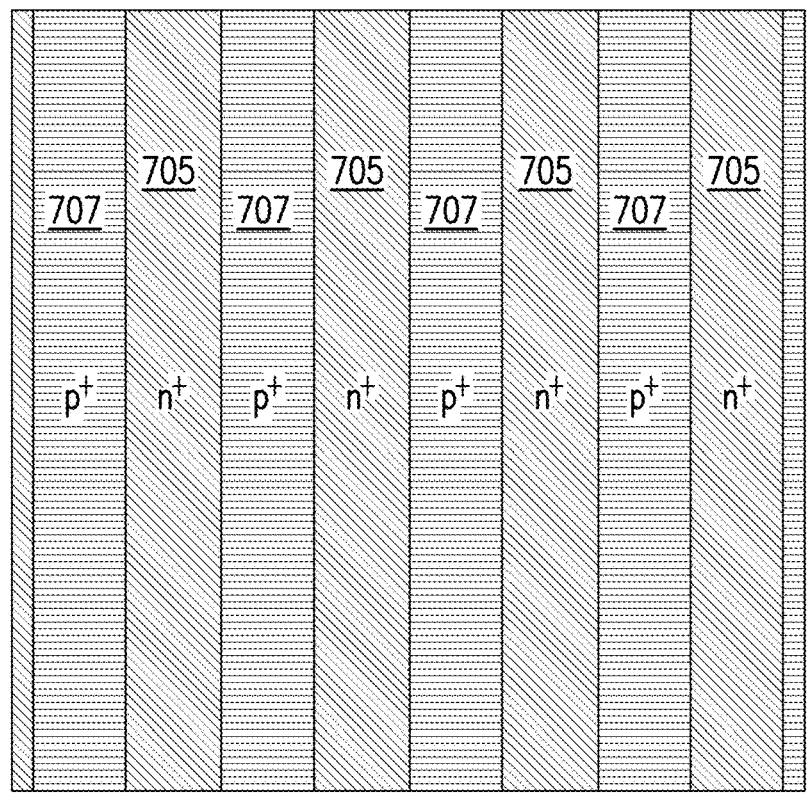
Figure 7E:
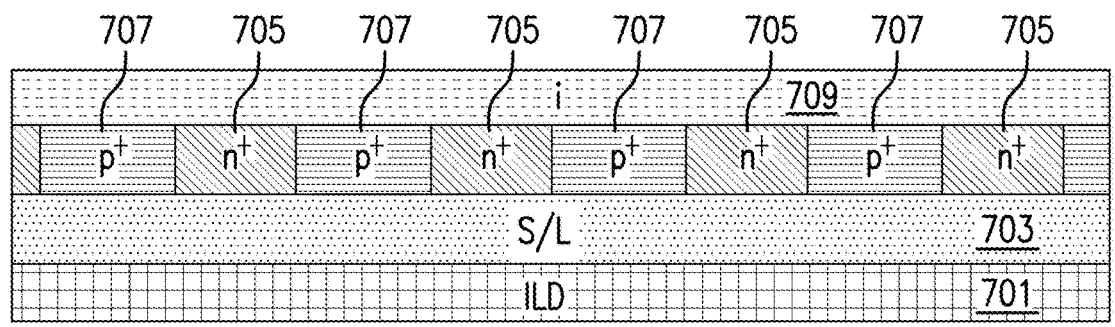
Figure 7F:
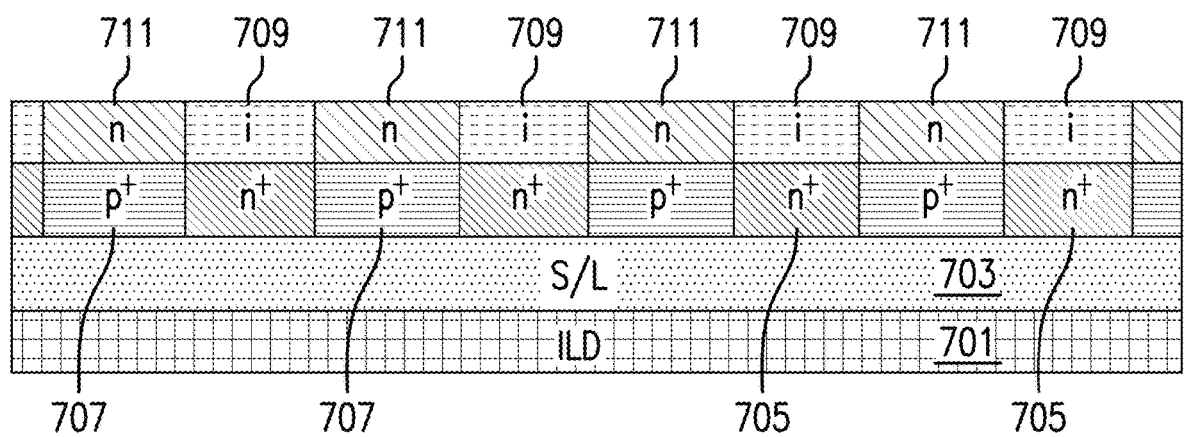
Figure 7G:
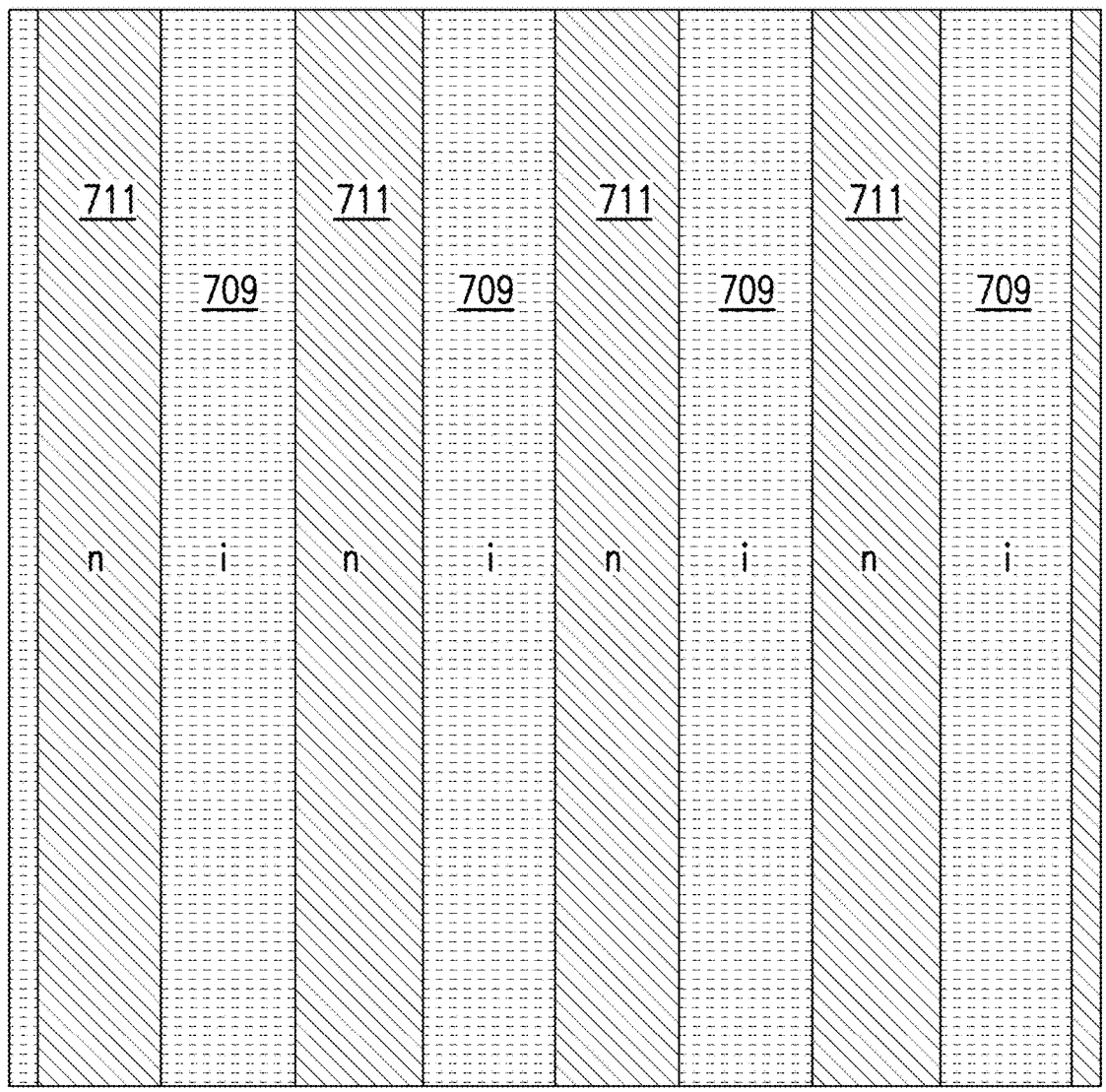
Figure 7H:
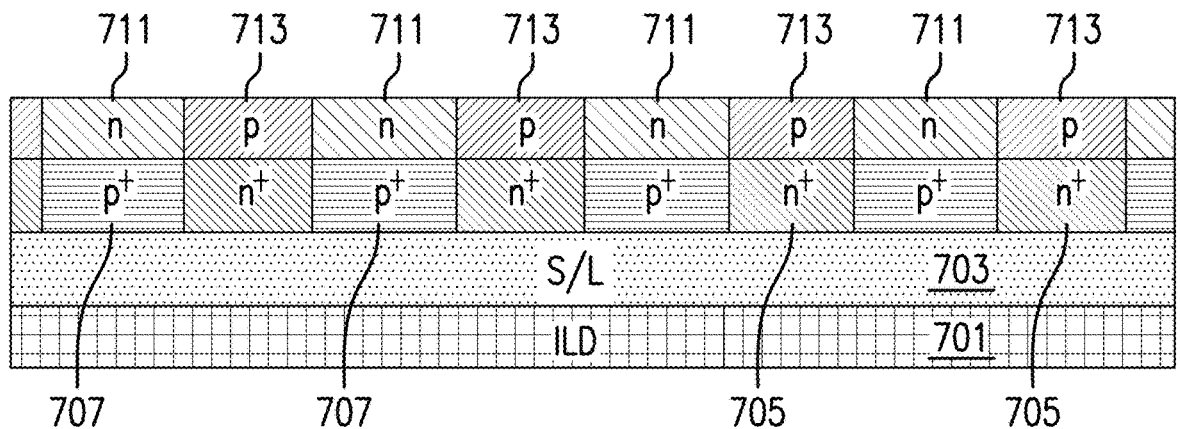
Figure 7I:
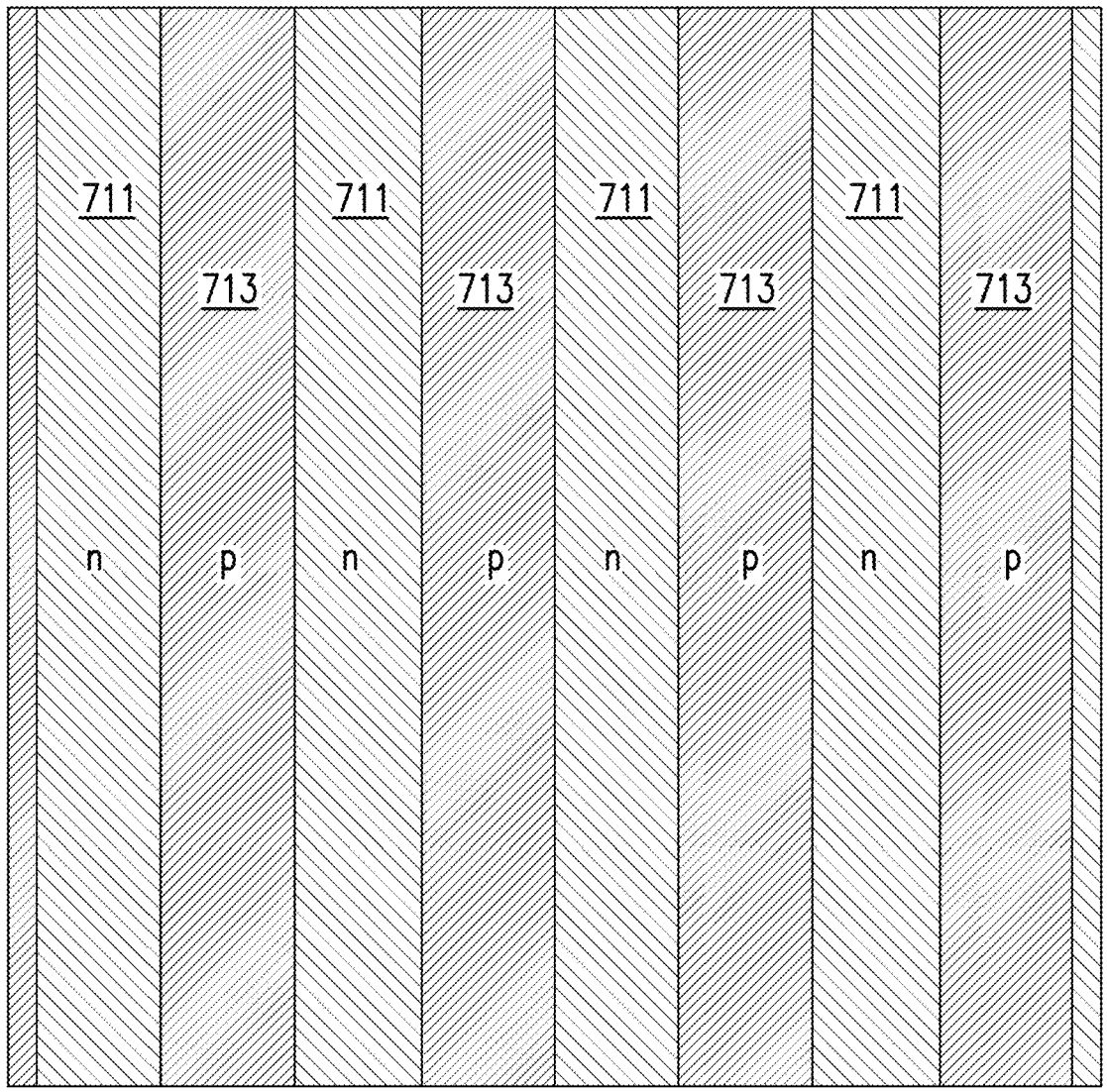
Figure 7J:
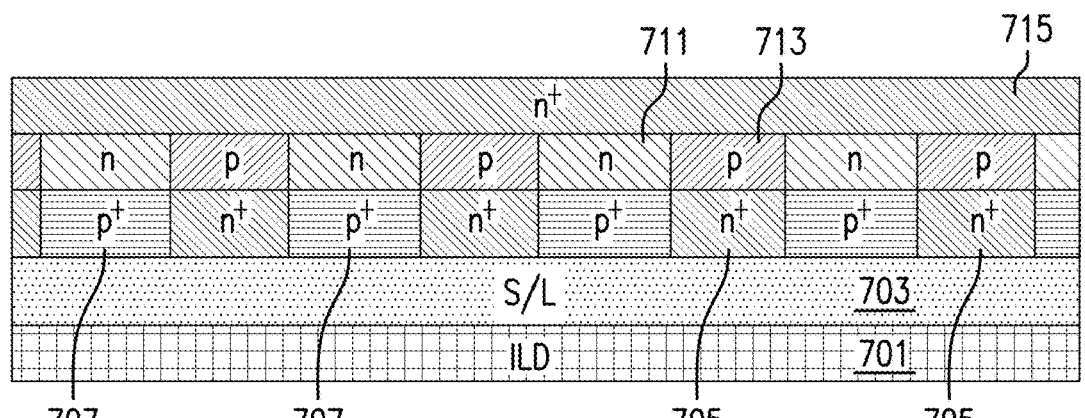
Figure 7K:
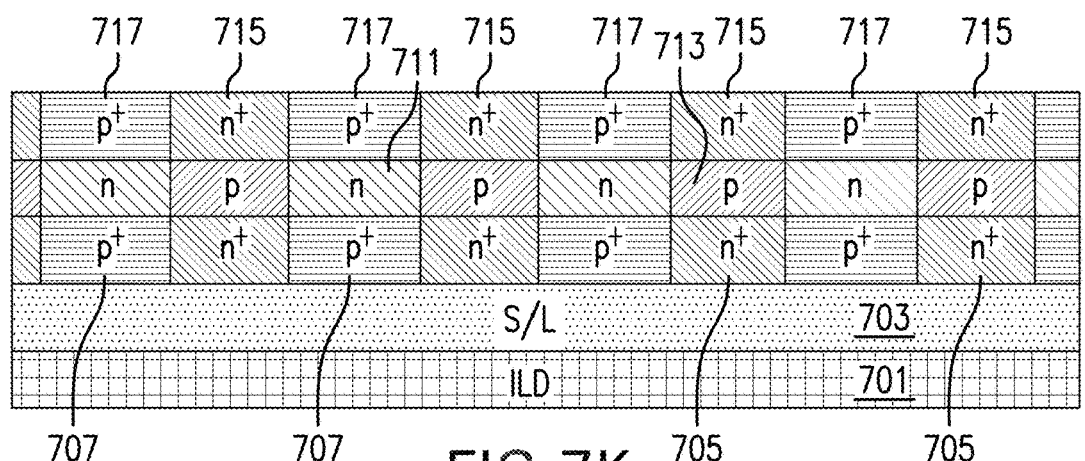
Figure 7L:
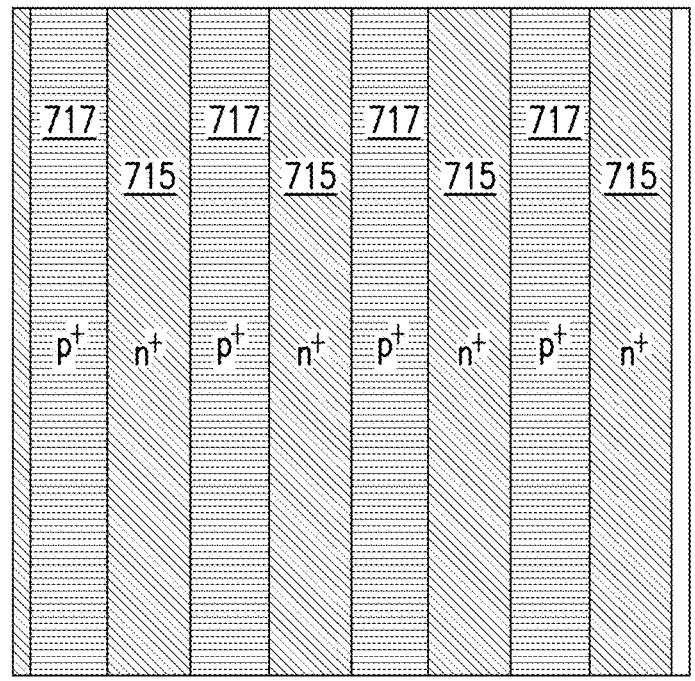
Figure 7M:
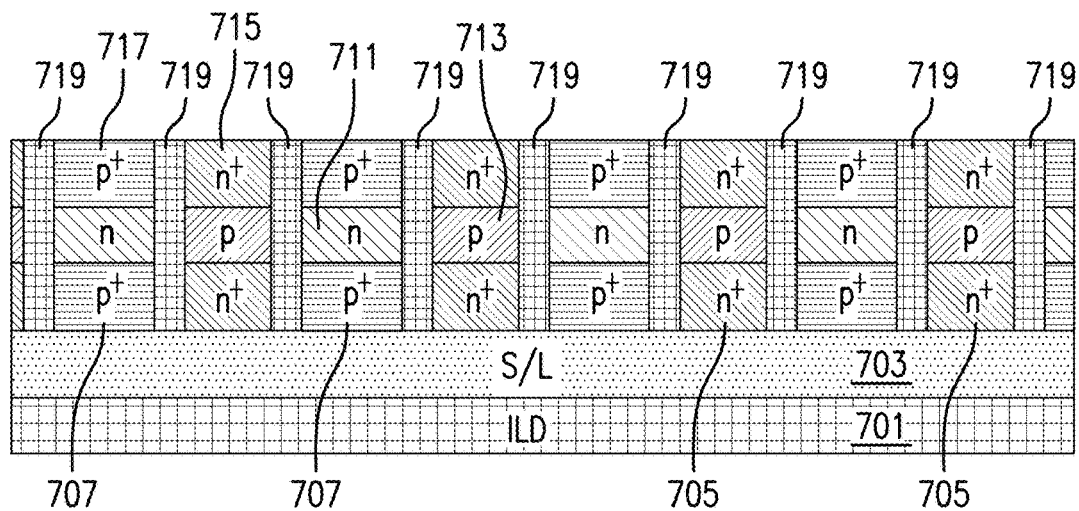
Figure 7N:
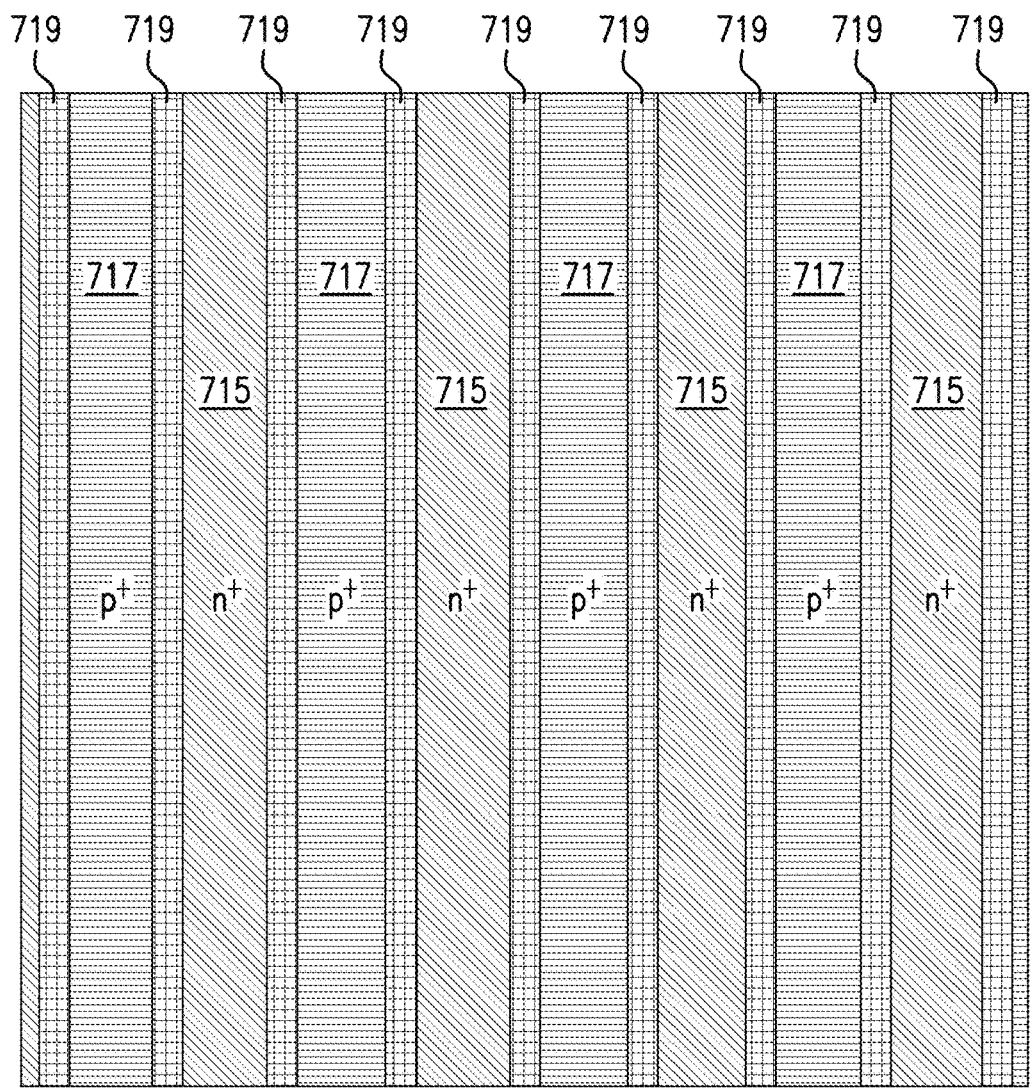
Figure 7O:
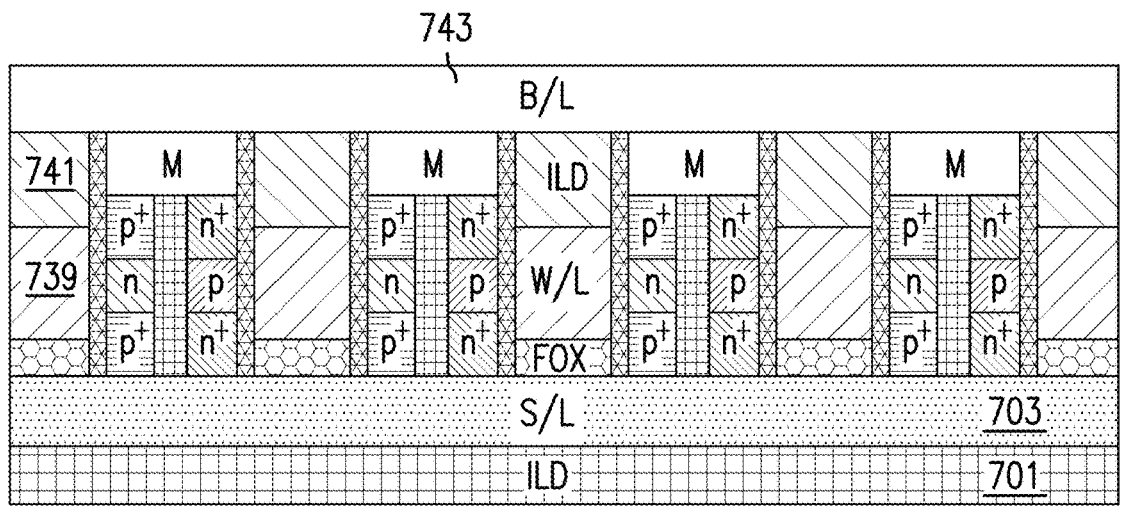
Figure 7P:
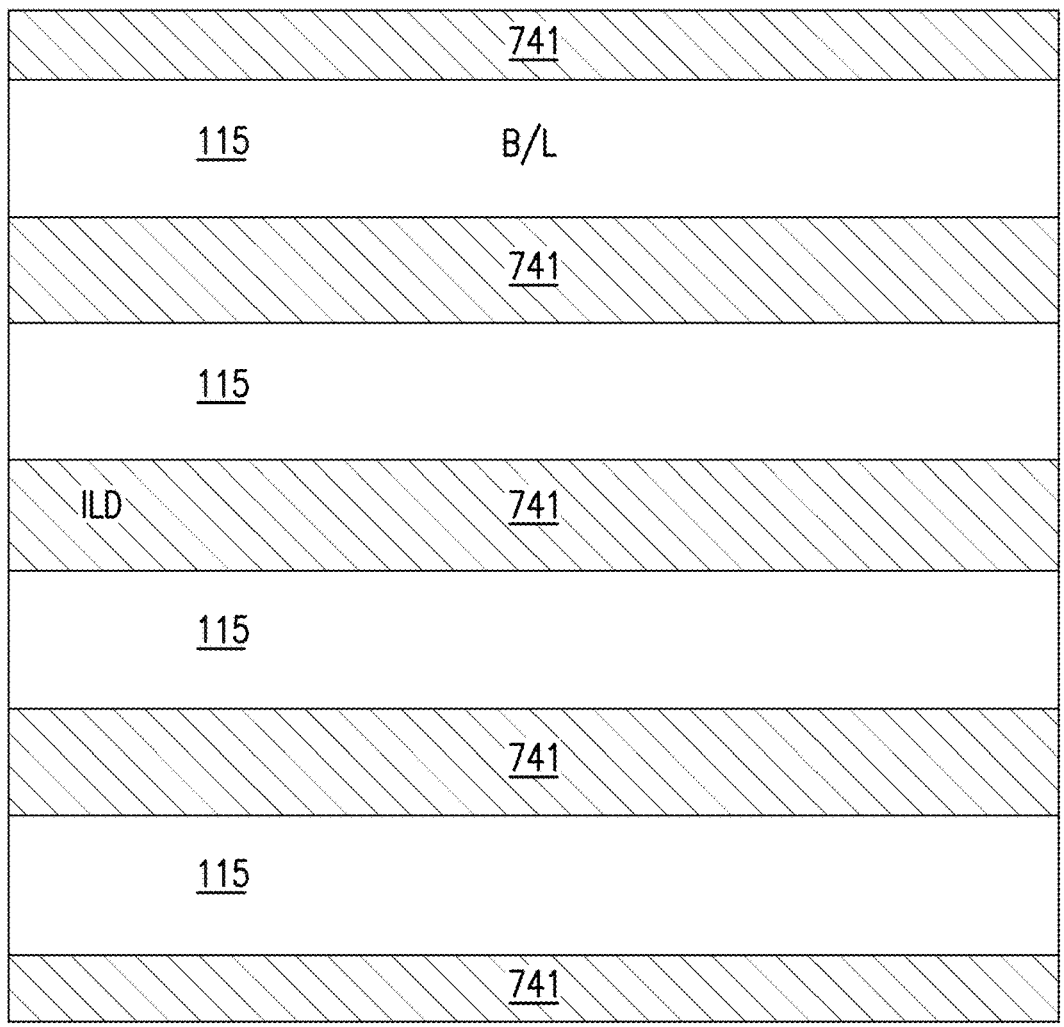

FIGS. 7A-7P show steps in a third exemplary process flow, according to an aspect of the invention, wherein the views are elevation views except that FIGS. 7D, 7G, 7I, 7L, 7N, and 7P are top plan views of, respectively, FIGS. 7B, 7C, 7F, 7H, 7K, 7M, and 7O.

In FIG. 7A, ILD 701 and required vias to the underlying level (underlying level and vias omitted to avoid clutter) are formed. Select-line (S/L) metal 703 is formed on the ILD 701; non-limiting examples of metal include W, TiN, and the like. In FIG. 7B, n+ a-Si is deposited and converted to n+ poly-Si 705 using pulsed laser annealing. Alternatively, intrinsic (i) a-Si may be deposited and implanted before laser crystallization; or poly-Si may be implanted and activated with a second (e.g. lower energy) laser anneal. Pulsed laser annealing may include a first lower energy anneal step to dehydrogenate a-Si:H (if the deposited a-Si layer is hydrogenated), as known in the art, followed by a higher energy anneal step for crystallization. In FIGS. 7C and 7D, portions of n+ a-Si 705 are counter-doped to p+ (as seen at 707) with implantation using a mask, followed by laser anneal for dopant activation. Alternatively, two implantation steps could be used to dope intrinsic (i) a-Si before laser crystallization or to dope intrinsic (i) poly-Si after laser crystallization, instead of counter-doping. In FIG. 7E, low-temperature PECVD epi is used to grow intrinsic (i) poly-Si:H 709. An optional low-energy laser treatment may follow to improve the crystalline quality. Alternatively, intrinsic (i) a-Si (or i a-Si:H) may be deposited and crystallized epitaxially using laser. In FIGS. 7F and 7G, implantation with a mask is used to form n-type regions 711 in intrinsic (i) a-Si (if not already crystallized) or in intrinsic (i) poly-Si. Note, there will typically be some misalignment due to masking (not explicitly shown).

In FIGS. 7H and 7I, a second implantation and masking step is used to form p-type regions 713. Alternatively, a doped epitaxial poly-Si or doped a-Si may be grown instead of the i-layer and a single implantation/masking step may be used for counter-doping (less preferred in some embodiments inasmuch as counter-doping degrades carrier mobility, but can still be used as appropriate). A low-energy laser anneal may be used to activate implanted doping. In FIG. 7J, low-temperature PECVD epi is used to grow $n^+$ poly-Si 715. An optional low-energy laser treatment may follow to improve the crystalline quality. Alternatively, n+ a-Si may be deposited and crystallized epitaxially using laser. In FIGS. 7K and 7L, n+ a-Si is counter-doped to p+ (as seen at 717) with implantation using a mask, followed by laser anneal for dopant activation. Alternatively, two implantation steps could be used to dope intrinsic (i) a-Si before laser crystallization or to dope intrinsic (i) poly-Si after laser crystallization, instead of counter-doping. Note, in some embodiments, the entire Si stack (705, 707, 711, 713, 715, 717) may be formed amorphous and then crystallized using a single pulsed laser annealing step. However, due to dopant diffusion during melting and solidification, these embodiments are less preferred for thin layers (e.g. when the total stack thickness is below 100 nm). Note also that there will typically be some misalignment due to masking (not explicitly shown).

In FIGS. 7M and 7N, Shallow Trench Isolation (STI) regions 719 are formed using techniques known in the art, e.g. etching vias, filling vias with dielectric deposition, followed by CMP. In one or more embodiments, the STI regions 719 are wide enough to remove all the potentially misaligned lateral $p^-/n^-$ and $p^+/n^+$ junctions. The memory (M), gate dielectric, W/L and B/L are then formed using the process flow described in FIGS. 5S-5OO for the first exemplary process flow; the final structure is shown in FIGS. 7O and 7P. Similar to the first exemplary process flow, the process steps for the third exemplary process flow can be repeated to create a 3D cross-point memory structure. Note the word line metal 739, ILD 741, and bit line metal 743 patterned to form bit lines 115. In some embodiments, the patterning of either the select-line metal or the bit-line metal may be skipped to form a common-electrode, as explained with respect to FIG. 3.

Referring back to FIGS. 1A-1F, the dielectric spacer 107 provides electrical insulation between the n-FET and the p-FET. As appreciated by those skilled in the art, if the dielectric spacer 107 is omitted, the n-FET and the p-FET (and therefore the memory array circuit shown in FIG. 3) will, in principle, still operate as described above with respect to FIGS. 3 and 4; however, the OFF current of the n-FET and the p-FET (i.e. the leakage current between drain and source when the FET is OFF) may increase significantly. The OFF currents of the n-FET and the p-FET may increase due to the inherent leakage of the reversed biased p-n junction formed between the channel (p) region of the n-FET and the channel (n) region of the p-FET; and/or due to the $p^+/p/p^+$ or $n^+/n/n^+$ leakage paths formed between source and drain as a result of misalignment in photolithography. As known in the art, the ON/OFF ratio of the selector devices (complementary pass transistors in this disclosure) poses an upper bound on the size of the memory array (i.e. number of memory elements in the array). Therefore, omitting the dielectric spacers 107 may significantly reduce the practical size of the memory array. It will be appreciated that, if desired, such memory arrays (i.e. without dielectric spacers between n-FET and p-FET), may be implemented according to the principles taught by this disclosure, for example, by using the third exemplary process flow (FIGS. 7A-7P) and skipping the formation of the STI regions 719 described in FIGS. 7M and 7N.

Given the discussion herein, it will be appreciated that in one or more embodiments, the use of low-temperature hydrogenated Si-containing layers allows multi-layer (3D) stacking of the memory cells. Use of low-temperature hydrogenated Si allows fabricating multiple layers of these 2D arrays (without damaging the underlying layers) thus allowing 3D structures.

It will be further appreciated that one or more embodiments provide a 3D-stacked cross-point memory array, wherein each stacked level includes an array of bit-lines, word-lines, select-lines, memory cells and selection elements, wherein each selection element includes an n-channel transistor and a p-channel transistor with shared source/drain terminals and with transistor bodies separated by a dielectric spacer, and wherein the gates of an n-channel transistor and a p-channel transistor from two adjacent selection elements share the same word-line. Also provided is a method of operating such a 3D cross-point memory array wherein a memory cell is selected by applying a LOW voltage to the word-line connected to the gate of the p-channel transistor connected to the memory element, applying a HIGH voltage to the word-line connected to the gate of the n-channel transistor connected to the memory element, and applying a voltage between HIGH and LOW to all other word-lines. The HIGH voltage is higher than the threshold voltage of the n-channel transistor and the LOW voltage is lower than the threshold voltage of the p-channel transistor. In one or more embodiments, at least a portion of the source, drain and channel region of the transistors is formed of hydrogenated polycrystalline silicon with 5-40 atomic percent hydrogen.

Given the discussion thus far, it will be appreciated that, in general terms, an exemplary multi-layer cross point memory array, according to an aspect of the invention, includes a plurality of layers. Each of the layers in turn includes a plurality of word lines 111, 113, and a plurality of intersecting lines (e.g. select lines 101 but could also be bit lines 115 as explained elsewhere herein) intersecting the plurality of word lines at a plurality of points. Furthermore in this regard, in one or more embodiments, in order to form a cross-point structure, at least one of the select lines or the bit lines intersect the word lines. The other one of the select lines or the bit lines may be parallel, intersect or not be patterned at all (i.e. be a common electrode). Each of the layers also includes a plurality of memory element-transistor stacks. Each of the memory element-transistor stacks is formed on the intersecting (e.g., select) lines at each of the plurality of points, and each of the memory element-transistor stacks in turn includes a memory element 103 and a complementary pair of parallel-connected field effect selection transistors 105. The complementary pair includes a p-channel field effect transistor 121 and an n-channel field-effect transistor 123. Each of the field effect selection transistors has a gate, a first drain-source terminal connected to a corresponding one of the intersecting (e.g. select) lines 101 and a second drain-source terminal connected to a corresponding one of the memory elements 103. The p-type field effect transistor has a gate connected to (in a non-limiting example, formed at least in part by) a corresponding one of the word lines 113, and the n-type field effect transistor has a gate connected to (in a non-limiting example, formed at least in part by) a corresponding one of the word lines 111. In one or more embodiments, as best seen in FIG. 3, except at the edge of the array (and thus for a majority of the memory element-transistor stacks), the gate of each transistor is also connected to the gate of a field-effect transistor of the opposite channel type in an adjacent memory element-transistor stack.

The intersecting lines (e.g. the plurality of select lines 101 and the bit lines 115) are typically interconnected with corresponding ones of the memory elements (in each layer).

In some embodiments, each of the plurality of layers further includes a common electrode shared between the memory elements in the layer (as explained elsewhere herein, the select-lines or the bit-lines may be connected to each other to form a common electrode. This may be achieved, for example, by not patterning the metal layers that form the select lines or the bit-lines, respectively).

The disclosed structures and methods are of particular interest to non-volatile memory elements with bipolar switching characteristics. In the case of unipolar characteristics, the memory state of the system can be switched by successive application of electric stress of either the same or opposite polarities. In contrast, the bipolar memories can be toggled between the memory states by application of successive electric stress of alternate polarity. Therefore, complementary pass transistors are particularly beneficial for bipolar memories by providing sufficiently low and voltage-invariant access resistance during the application of opposite voltage polarities. Examples of bipolar memory elements include, but not limited to, resistive memories including various ternary oxides with perovskite structure such as $SrTiO_3$ (STO) and $SrZrO_3$; and various spin-transfer torque memories. Accordingly, in some embodiments, the memory element is bipolar, and/or the memory element is one of RRAM or STT-RAM.

Exemplary array operation has been described above. Typically, a controller circuit is fabricated in the front-end, and the disclosed 3D cross-point memory array is fabricated on top of it (i.e. in the back-end). Thus, in one or more embodiments, the underlying layer for the first layer of the 3D memory array is the front-end, and the underlying layer for the subsequent layers in the preceding layer in the backend. Furthermore, in one or more embodiments, there are vias connecting the first layer of the 3D memory in the backend to the control circuitry in the front-end, vias connecting the 2nd layer of the 3D memory in the backend to the 1st layer of the 3D memory in the backend (therefore electrical connection between the 2nd backend layer to the control circuit in the front-end is also established), and so on. Given the teachings herein, the skilled artisan will be able to fabricate appropriate interconnections, adapting techniques employed in a typical monolithic CMOS chip with a front-end layer and multiple back-end layers; with multiple inter-layer dielectric and metallization vias. However, hybrid designs where a CMOS-chip is bonded to the 3D memory are also possible. For example, a 3D memory stack may be fabricated on a plastic substrate, using the described techniques, then a CMOS chip that contains the control circuitry is mounted externally onto the plastic substrate. The memory layers within the 3D memory stack have their electrical connections with their upper and lower layers using vias in interlayer dielectrics, similar to the monolithic case. Metal connections (wirings) can be subsequently formed between the external leads of the CMOS chip and the metal lines coming out of the 3D memory stack (for example from the topmost layer or the bottom-most layer).

In one or more embodiments, the plurality of select lines 101 are formed in a first layer; the plurality of word lines 111, 113 are formed in a second layer outward from the first layer; the plurality of memory element-transistor stacks are formed on the plurality of select lines 101 between the plurality of the word lines with the memory elements 103 at outmost portions thereof; and the plurality of bit lines 115 are formed outwardly from the plurality of memory element-transistor stacks.

As seen at 105 in FIG. 1B, in one or more embodiments, each of the p-type field effect transistors includes an inner p+ layer, an intermediate n layer, and an outermost p+ layer; and each of the n-type field-effect transistors includes an inner n+ layer, an intermediate p layer, and an outermost n+ layer. Also included are a plurality of dielectric spacers 107 extending in a direction perpendicularly outward from the select lines 101 and at least partially separating the p-channel field effect transistors from corresponding ones of the n-channel field-effect transistors (see, e.g., complete separation in FIGS. 5NN and 7O; partial separation in FIG. 6N wherein dielectric spacers separate the p-channel field effect transistors from corresponding ones of the n-channel field-effect transistors in the intermediate and outermost layers, but not the inner layers).

One or more embodiments also include a plurality of high-k dielectric structures 109 extending in a direction perpendicularly outward from the select lines 101 and surrounding side walls of the memory element-transistor stacks.

Furthermore, given the discussion thus far, it will be appreciated that, in general terms, an exemplary method of manufacturing a multi-layer cross point memory array, according to an aspect of the invention, includes fabricating a plurality of layers, each layer outward of a preceding layer. Referring to FIGS. 5Q/5R, 6L/6M, and 7M/7N, fabricating each of the layers in turn includes forming a structure including an inter-layer dielectric layer 501, 601, 701; a select line metal layer 503, 603, 703 outward of the inter-layer dielectric layer, a plurality of p+/n/p+ lines outward of the select line metal layer, a plurality of n+/p/n+ lines outward of the select line metal layer, and a plurality of dielectric spacers 519, 619, 719 outward of the select line metal layer and at least partially separating the p+/n/p+ lines from the n+/p/n+ lines, wherein the p+/n/p+ lines are formed with inner p+ layers, intermediate n layers, and outermost p+ layers, and wherein the n+/p/n+ lines are formed with inner n+ layers, intermediate p layers, and outermost n+ layers.

Further steps includes forming a memory stack 527 outward of the plurality of p+/n/p+ lines, the plurality of n+/p/n+ lines, and the plurality of dielectric spacers; patterning the memory stack, the plurality of p+/n/p+ lines, the plurality of n+/p/n+ lines, and the plurality of dielectric spacers to form a plurality of lines 529 perpendicular to the plurality of p+/n/p+ lines and the plurality of n+/p/n+ lines; and patterning the plurality of lines perpendicular to the plurality of p+/n/p+ lines and the plurality of n+/p/n+ lines into a plurality of pillars 531 including memory elements. Even further steps include forming a high-k dielectric 533, 533A on at least sidewalls of the pillars; forming a plurality of word lines (word lines generally 539) parallel to the plurality of p+/n/p+ lines and the plurality of n+/p/n+ lines; and forming a plurality of bit lines 115 interconnected with the memory elements.

Referring to the first exemplary process flow of FIGS. 5A-5Z and 5AA-5OO, in one or more embodiments, forming the structure including the inter-layer dielectric layer, the select line metal layer outward of the inter-layer dielectric layer, the plurality of p+/n/p+ lines outward of the select line metal layer, the plurality of n+/p/n+ lines outward of the select line metal layer, and the plurality of dielectric spacers outward of the select line metal layer and at least partially separating the p+/n/p+ lines from the n+/p/n+ lines, includes forming the select line metal layer 503 outward of the inter-layer dielectric layer 501 (FIG. 5A); depositing a layer of p+ amorphous silicon outward of the select line metal layer and converting the layer of p+ amorphous silicon to p+ polysilicon 505 via pulsed laser annealing to form the inner p+ layers of the p+/n/p+ lines, as per FIG. 5B; epitaxially growing n hydrogenated polysilicon outward of the p+ polysilicon via low temperature plasma-enhanced chemical vapor deposition (PECVD) to form the intermediate n layers of the p+/n/p+ lines, as per FIG. 5C; and epitaxially growing p+ hydrogenated polysilicon outward of the n hydrogenated polysilicon via low temperature plasma-enhanced chemical vapor deposition to form the outermost p+ layers of the p+/n/p+ lines, as per FIG. 5D. The PECVD temperature may be in the range of room-temperature to 450° C. In some embodiments, the PECVD temperature is in the range of 150-250° C.

One or more embodiments further include selectively etching down to the select line metal layer to define the p+/n/p+ lines 515 as per FIGS. 5F and 5G; depositing the dielectric spacers 519 on sides of the p+/n/p+ lines as per FIGS. 5H and 5I; forming n+ amorphous silicon 521 (optionally hydrogenated) between the dielectric spacers and outward of the select line metal layer, as per FIG. 5J; converting the n+ amorphous silicon between the dielectric spacers to n+ polysilicon between the dielectric spacers using pulsed laser annealing, to form the inner n+ layers of the n+/p/n+ lines, as per FIGS. 5K and 5L; epitaxially growing p hydrogenated polysilicon outward of the n+ polysilicon between the dielectric spacers via low temperature plasma-enhanced chemical vapor deposition, to form the intermediate p layers of the n+/p/n+ lines 523, as per FIGS. 5M and 5N; and epitaxially growing n+ hydrogenated polysilicon outward of the p hydrogenated polysilicon via low temperature plasma-enhanced chemical vapor deposition, to form the outermost n+ layers of the n+/p/n+ lines 525, as per FIGS. 5O and 5P.

Still referring to the first exemplary process flow of FIGS. 5A-5Z and 5AA-5OO, in one or more alternative embodiments, forming the structure including the inter-layer dielectric layer, the select line metal layer outward of the inter-layer dielectric layer, the plurality of p+/n/p+ lines outward of the select line metal layer, the plurality of n+/p/n+ lines outward of the select line metal layer, and the plurality of dielectric spacers outward of the select line metal layer and at least partially separating the p+/n/p+ lines from the n+/p/n+ lines, includes forming the select line metal layer 503 outward of the inter-layer dielectric layer 501, as per FIG. 5A; depositing and implanting a layer of intrinsic amorphous silicon outward of the select line metal layer and laser crystallizing the deposited and implanted layer of intrinsic amorphous silicon to form the inner p+ layers 505 of the p+/n/p+ lines, as per FIG. 5B; depositing and epitaxially crystallizing n amorphous silicon (optionally hydrogenated) outward of the inner p+ layers, to form the intermediate n layers 507 of the p+/n/p+ lines, as per FIG. 5C; depositing and epitaxially crystallizing p+ amorphous silicon (optionally hydrogenated) outward of the intermediate n layers, to form the outermost p+ layers 509 of the p+/n/p+ lines, as per FIG. 5D; and selectively etching down to the select line metal layer 503 to define the p+/n/p+ lines 515 as per FIGS. 5F and 5G. Further steps include depositing the dielectric spacers 519 on sides of the p+/n/p+ lines, as per FIGS. 5H and 5I; depositing and implanting intrinsic amorphous silicon between the dielectric spacers and outward of the select line metal layer, followed by laser crystallization, to form the inner n+ layers 521 of the n+/p/n+ lines, as per FIGS. 5K and 5L; epitaxially growing p hydrogenated polysilicon outward of the n+ polysilicon between the dielectric spacers via low temperature plasma-enhanced chemical vapor deposition, to form the intermediate p layers 523 of the n+/p/n+ lines, as per FIGS. 5M and 5N; and epitaxially growing n+ hydrogenated polysilicon outward of the p hydrogenated polysilicon via low temperature plasma-enhanced chemical vapor deposition, to form the outermost n+ layers 525 of the n+/p/n+ lines, as per FIGS. 5O and 5P.

Still referring to the first exemplary process flow of FIGS. 5A-5Z and 5AA-5OO, in one or more further alternative embodiments, forming the structure including the inter-layer dielectric layer, the select line metal layer outward of the inter-layer dielectric layer, the plurality of p+/n/p+ lines outward of the select line metal layer, the plurality of n+/p/n+ lines outward of the select line metal layer, and the plurality of dielectric spacers outward of the select line metal layer and at least partially separating the p+/n/p+ lines from the n+/p/n+ lines, includes forming the select line metal layer 503 outward of the inter-layer dielectric layer 501, as per FIG. 5A; implanting a layer of polysilicon outward of the select line metal layer and activating the implanted layer of polysilicon with a low-energy laser anneal to form the inner p+ layers 505 of the p+/n/p+ lines, as per FIG. 5B; depositing and epitaxially crystallizing n amorphous silicon (optionally hydrogenated) outward of the inner p+ layers, with a low energy laser, to form the intermediate n layers 507 of the p+/n/p+ lines, as per FIG. 5C; depositing and epitaxially crystallizing p+ amorphous silicon (optionally hydrogenated) outward of the intermediate n layers, to form the outermost p+ layers 509 of the p+/n/p+ lines, as per FIG. 5D; and selectively etching down to the select line metal layer 503 to define the p+/n/p+ lines 515, as per FIGS. 5F and 5G. Further steps include depositing the dielectric spacers 519 on sides of the p+/n/p+ lines, as per FIGS. 5H and 5I; depositing and implanting intrinsic amorphous silicon between the dielectric spacers and outward of the select line metal layer, followed by laser crystallization, to form the inner n+ layers 521 of the n+/p/n+ lines, as per FIGS. 5K and 5L; epitaxially growing p hydrogenated polysilicon outward of the n+ polysilicon between the dielectric spacers via low temperature plasma-enhanced chemical vapor deposition, to form the intermediate p layers 523 of the n+/p/n+ lines, as per FIGS. 5M and 5N; and epitaxially growing n+ hydrogenated polysilicon outward of the p hydrogenated polysilicon via low temperature plasma-enhanced chemical vapor deposition, to form the outermost n+ layers 525 of the n+/p/n+ lines, as per FIGS. 5O and 5P.

Referring to the second exemplary process flow of FIGS. 6A-6O, in one or more embodiments, forming the structure including the inter-layer dielectric layer, the select line metal layer outward of the inter-layer dielectric layer, the plurality of p+/n/p+ lines outward of the select line metal layer, the plurality of n+/p/n+ lines outward of the select line metal layer, and the plurality of dielectric spacers outward of the select line metal layer and at least partially separating the p+/n/p+ lines from the n+/p/n+ lines, includes forming the select line metal layer 603 outward of the inter-layer dielectric layer 601; depositing a layer of p+ amorphous silicon outward of the select line metal layer and converting the layer of p+ amorphous silicon to p+ polysilicon via pulsed laser annealing to form the inner p+ layers 605 of the p+/n/p+ lines; epitaxially growing n hydrogenated polysilicon outward of the p+ polysilicon via low temperature plasma-enhanced chemical vapor deposition to form the intermediate n layers 607 of the p+/n/p+ lines; and epitaxially growing p+ hydrogenated polysilicon outward of the n hydrogenated polysilicon via low temperature plasma-enhanced chemical vapor deposition to form the outermost p+ layers 609 of the p+/n/p+ lines. Further steps include selectively etching down to the inner p+ layer 605 to partially define the p+/n/p+ lines 615 as per FIGS. 6B and 6C; depositing the dielectric spacers 619 on sides of the partially defined p+/n/p+ lines, adjacent the intermediate n layers and the outermost p+ layers, as per FIGS. 6D and 6E; carrying out ion implantation to counter-dope portions of the inner p+ layer between the dielectric spacers and outward of the select line metal layer, to form the inner n+ layers 621 of the n+/p/n+ lines, as per FIGS. 6F and 6G; epitaxially growing p hydrogenated polysilicon outward of the inner n+ layers between the dielectric spacers via low temperature plasma-enhanced chemical vapor deposition, to form the intermediate p layers 623 of the n+/p/n+ lines, as per FIGS. 6H and 6I; and epitaxially growing n+ hydrogenated polysilicon outward of the p hydrogenated polysilicon via low temperature plasma-enhanced chemical vapor deposition, to form the outermost n+ layers 625 of the n+/p/n+ lines, as per FIGS. 6J and 6K.

Referring to the third exemplary process flow of FIGS. 7A-7P, in one or more embodiments, forming the structure including the inter-layer dielectric layer, the select line metal layer outward of the inter-layer dielectric layer, the plurality of p+/n/p+ lines outward of the select line metal layer, the plurality of n+/p/n+ lines outward of the select line metal layer, and the plurality of dielectric spacers outward of the select line metal layer and at least partially separating the p+/n/p+ lines from the n+/p/n+ lines, includes forming the select line metal layer 703 outward of the inter-layer dielectric layer 701, as per FIG. 7A; depositing a layer of n+ amorphous silicon outward of the select line metal layer and converting the layer of n+ amorphous silicon to n+ polysilicon via pulsed laser annealing to form at least the inner n+ layers 705 of the n+/p/n+ lines, as per FIG. 7B; counter-doping portions of the n+ polysilicon to p+, followed by laser anneal for dopant activation, to form the inner p+ layers 707 of the p+/n/p+ lines, as per FIGS. 7C and 7D; and epitaxially growing intrinsic hydrogenated polysilicon 709 outward of the inner n+ layers of the n+/p/n+ lines and the inner p+ layers of the p+/n/p+ lines via low temperature plasma-enhanced chemical vapor deposition, as per FIG. 7E. Further steps include, via implantation of the epitaxially grown intrinsic hydrogenated polysilicon, forming the intermediate p layers 713 of the n+/p/n+ lines over the inner n+ layers of the n+/p/n+ lines and the intermediate n layers 711 of the p+/n/p+ lines over the inner p+ layers of the p+/n/p+ lines, as per FIGS. 7F-7I; epitaxially growing n+ polysilicon outward of the intermediate p layers of the n+/p/n+ lines and the intermediate n layers of the p+/n/p+ lines via low temperature plasma-enhanced chemical vapor deposition, to form at least the outermost n+ layers 715 of the n+/p/n+ lines, as per FIG. 7J; and counter-doping portions of the epitaxially grown n+ polysilicon to p+, followed by laser anneal for dopant activation, to form the outermost p+ layers 717 of the p+/n/p+ lines, as per FIGS. 7K and 7L. As seen in FIGS. 7M and 7N, a further step includes forming shallow trench isolation regions 719 between the n+/p/n+ lines and the p+/n/p+ lines (said shallow trench isolation regions are the plurality of dielectric spacers).

Still referring to the third exemplary process flow of FIGS. 7A-7P, in one or more alternative embodiments, forming the structure including the inter-layer dielectric layer, the select line metal layer outward of the inter-layer dielectric layer, the plurality of p+/n/p+ lines outward of the select line metal layer, the plurality of n+/p/n+ lines outward of the select line metal layer, and the plurality of dielectric spacers outward of the select line metal layer and at least partially separating the p+/n/p+ lines from the n+/p/n+ lines, includes forming the select line metal layer 703 outward of the inter-layer dielectric layer 701, as per FIG. 7A; depositing and implanting a layer of intrinsic amorphous silicon outward of the select line metal layer, and laser crystallizing the deposited and implanted layer of intrinsic amorphous silicon to form at least the inner n+ layers 705 of the n+/p/n+ lines, as per FIG. 7B; counter-doping portions of the laser crystallized, deposited and implanted layer of intrinsic amorphous silicon to p+, followed by laser anneal for dopant activation, to form the inner p+ layers 707 of the p+/n/p+ lines, as per FIGS. 7C and 7D; epitaxially depositing and crystallizing intrinsic amorphous silicon (optionally hydrogenated) 709 outward of the inner n+ layers of the n+/p/n+ lines and the inner p+ layers of the p+/n/p+ lines, as per FIG. 7E; via implantation of the epitaxially deposited and crystallized intrinsic amorphous silicon, forming the intermediate p layers 713 of the n+/p/n+ lines over the inner n+ layers of the n+/p/n+ lines and the intermediate n layers 711 of the p+/n/p+ lines over the inner p+ layers of the p+/n/p+ lines, as per FIGS. 7F-7I; and epitaxially depositing and crystallizing n+ amorphous silicon outward of the intermediate p layers of the n+/p/n+ lines and the intermediate n layers of the p+/n/p+ lines, to form at least the outermost n+ layers 715 of the n+/p/n+ lines, as per FIG. 7J. Further steps include counter-doping portions of the epitaxially deposited and crystallized n+ amorphous silicon to p+, followed by laser anneal for dopant activation, to form the outermost p+ layers 717 of the p+/n/p+ lines, as per FIGS. 7K and 7L, and forming shallow trench isolation regions 719 between the n+/p/n+ lines and the p+/n/p+ lines, as per FIGS. 7M and 7N; the shallow trench isolation regions are the plurality of dielectric spacers.

Still referring to the third exemplary process flow of FIGS. 7A-7P, in one or more alternative embodiments, forming the structure including the inter-layer dielectric layer, the select line metal layer outward of the inter-layer dielectric layer, the plurality of p+/n/p+ lines outward of the select line metal layer, the plurality of n+/p/n+ lines outward of the select line metal layer, and the plurality of dielectric spacers outward of the select line metal layer and at least partially separating the p+/n/p+ lines from the n+/p/n+ lines, includes forming the select line metal layer 703 outward of the inter-layer dielectric layer 701, as per FIG. 7A; implanting a layer of polysilicon outward of the select line metal layer and activating the implanted layer of polysilicon with a low energy laser anneal to form at least the inner n+ layers 705 of the n+/p/n+ lines, as per FIG. 7B; counter-doping portions of the implanted, activated layer of polysilicon to p+, followed by laser anneal for dopant activation, to form the inner p+ layers 707 of the p+/n/p+ lines, as per FIGS. 7C and 7E; epitaxially depositing and crystallizing intrinsic amorphous silicon (optionally hydrogenated) 709 outward of the inner n+ layers of the n+/p/n+ lines and the inner p+ layers of the p+/n/p+ lines, as per FIG. 7E; and, via implantation of the epitaxially deposited and crystallized intrinsic amorphous silicon, forming the intermediate p layers 713 of the n+/p/n+ lines over the inner n+ layers of the n+/p/n+ lines and the intermediate n layers 711 of the p+/n/p+ lines over the inner p+ layers of the p+/n/p+ lines, as per FIGS. 7F-7I. Further steps include epitaxially depositing and crystallizing n+ amorphous silicon outward of the intermediate p layers of the n+/p/n+ lines and the intermediate n layers of the p+/n/p+ lines, to form at least the outermost n+ layers 715 of the n+/p/n+ lines, as per FIG. 7J; counter-doping portions of the epitaxially deposited and crystallized n+ amorphous silicon to p+, followed by laser anneal for dopant activation, to form the outermost p+ layers 717 of the p+/n/p+ lines, as per FIGS. 7K and 7L; and forming shallow trench isolation regions between the n+/p/n+ lines and the p+/n/p+ lines, the shallow trench isolation regions 719 including the plurality of dielectric spacers, as per FIGS. 7M and 7N.

Even further, given the discussion thus far, it will be appreciated that an exemplary method is provided for operating a cross-point memory array. The cross-point memory array to be operated includes at least one stacked level, including an array of bit-lines 115, word-lines 111, 113, select-lines 101, memory cells 103, and selection elements. Each of the selection elements includes an n-channel transistor 123 and a p-channel transistor 121 with shared source/drain terminals and with transistor channels separated by a dielectric spacer 107 (fully or partially). Each of the n-channel and p-channel transistors has a gate. The gates of a given n-channel transistor and a given p-channel transistor from two adjacent ones of the selection elements share the same word line; e.g., n-channel transistor 123' shares word line 135 with p-channel transistor 121 in the right-most location.

The method includes selecting a given one of the memory cells 103' by carrying out the steps of applying a LOW voltage to that one of the word-lines 133 connected to the gate of the p-channel transistor 121' connected to the memory cell to be selected; applying a HIGH voltage to that one of the word-lines 135 connected to the gate of the n-channel transistor 123' connected to the memory cell to be selected; and applying a voltage between HIGH and LOW to all other ones of the word-lines (e.g. 131, 137 . . . ). The applied HIGH voltage is higher than a threshold voltage of the n-channel transistor connected to the memory cell to be selected and the applied LOW voltage is lower than a threshold voltage of the p-channel transistor connected to the memory cell to be selected. See FIG. 4.

In one or more embodiments, applying the voltage between HIGH and LOW to all other ones of the word-lines includes grounding the all other ones of the word-lines.

In one or more embodiments, the method further includes carrying out at least one of a READ operation, a WRITE operation, and an ERASE operation on the memory cell 103' to be selected while the LOW voltage is applied to that one of the word-lines connected to the gate of the p-channel transistor connected to the memory cell to be selected, the HIGH voltage is applied to that one of the word-lines connected to the gate of the n-channel transistor connected to the memory cell to be selected, and the all other ones of the word-lines are grounded, such that those of the memory cells 103 other than the memory cell to be selected 103' do not disturb the memory cell to be selected and are not disturbed by the memory cell to be selected.

At least a portion of the apparatus, methods and/or system described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having circuitry formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a multi-layer cross point memory array, said method comprising:
fabricating a plurality of layers, each layer outward of a preceding layer, wherein fabricating each of said layers in turn comprises:
forming a structure comprising an inter-layer dielectric layer, a select line metal layer outward of the inter-layer dielectric layer, a plurality of p+/n/p+ lines outward of the select line metal layer, a plurality of n+/p/n+ lines outward of the select line metal layer, and a plurality of dielectric spacers outward of the select line metal layer and at least partially separating the p+/n/p+ lines from the n+/p/n+ lines, wherein the p+/n/p+ lines are formed with inner p+ layers, intermediate n layers, and outermost p+ layers, and wherein the n+/p/n+ lines are formed with inner n+ layers, intermediate p layers, and outermost n+ layers;
forming a memory stack outward of said plurality of p+/n/p+ lines, said plurality of n+/p/n+ lines, and said plurality of dielectric spacers;
patterning said memory stack, said plurality of p+/n/p+ lines, said plurality of n+/p/n+ lines, and said plurality of dielectric spacers to form a plurality of lines perpendicular to said plurality of p+/n/p+ lines and said plurality of n+/p/n+ lines;
patterning said plurality of lines perpendicular to said plurality of p+/n/p+ lines and said plurality of n+/p/n+ lines into a plurality of pillars including memory elements;
forming a high-k dielectric on at least sidewalls of said pillars;
forming a plurality of word lines parallel to said plurality of p+/n/p+ lines and said plurality of n+/p/n+ lines; and
forming a plurality of bit lines interconnected with said memory elements.

2. The method of claim 1, wherein forming said structure comprising said inter-layer dielectric layer, said select line metal layer outward of the inter-layer dielectric layer, said plurality of p+/n/p+ lines outward of the select line metal layer, said plurality of n+/p/n+ lines outward of the select line metal layer, and said plurality of dielectric spacers outward of the select line metal layer and at least partially separating the p+/n/p+ lines from the n+/p/n+ lines, comprises:
forming said select line metal layer outward of said inter-layer dielectric layer;
depositing a layer of p+ amorphous silicon outward of said select line metal layer;
converting said layer of p+ amorphous silicon to p+ polysilicon via pulsed laser annealing to form said inner p+ layers of said p+/n/p+ lines;
epitaxially growing n hydrogenated polysilicon outward of said p+ polysilicon via low temperature plasma-enhanced chemical vapor deposition to form said intermediate n layers of said p+/n/p+ lines;
epitaxially growing p+ hydrogenated polysilicon outward of said n hydrogenated polysilicon via low temperature plasma-enhanced chemical vapor deposition to form said outermost p+ layers of said p+/n/p+ lines;
selectively etching down to said select line metal layer to define said p+/n/p+ lines;
depositing said dielectric spacers on sides of said p+/n/p+ lines;
forming n+ amorphous silicon between said dielectric spacers and outward of said select line metal layer;
converting said n+ amorphous silicon between said dielectric spacers to n+ polysilicon between said dielectric spacers using pulsed laser annealing, to form said inner n+ layers of said n+/p/n+ lines;
epitaxially growing p hydrogenated polysilicon outward of said n+ polysilicon between said dielectric spacers via low temperature plasma-enhanced chemical vapor deposition, to form said intermediate p layers of said n+/p/n+ lines; and
epitaxially growing n+ hydrogenated polysilicon outward of said p hydrogenated polysilicon via low temperature plasma-enhanced chemical vapor deposition, to form said outermost n+ layers of said n+/p/n+ lines.

3. The method of claim 1, wherein forming said structure comprising said inter-layer dielectric layer, said select line metal layer outward of the inter-layer dielectric layer, said plurality of p+/n/p+ lines outward of the select line metal layer, said plurality of n+/p/n+ lines outward of the select line metal layer, and said plurality of dielectric spacers outward of the select line metal layer and at least partially separating the p+/n/p+ lines from the n+/p/n+ lines, comprises:
forming said select line metal layer outward of said inter-layer dielectric layer;
depositing and implanting a layer of intrinsic amorphous silicon outward of said select line metal layer;
laser crystallizing said deposited and implanted layer of intrinsic amorphous silicon to form said inner p+ layers of said p+/n/p+ lines;
depositing and epitaxially crystallizing n amorphous silicon outward of said inner p+ layers, with a laser, to form said intermediate n layers of said p+/n/p+ lines;
depositing and epitaxially crystallizing p+ amorphous silicon outward of said intermediate n layers, with a laser, to form said outermost p+ layers of said p+/n/p+ lines;
selectively etching down to said select line metal layer to define said p+/n/p+ lines;
depositing said dielectric spacers on sides of said p+/n/p+ lines;
depositing and implanting intrinsic amorphous silicon between said dielectric spacers and outward of said select line metal layer, followed by laser crystallization, to form said inner n+ layers of said n+/p/n+ lines;
epitaxially growing p hydrogenated polysilicon outward of said n+ polysilicon between said dielectric spacers via low temperature plasma-enhanced chemical vapor deposition, to form said intermediate p layers of said n+/p/n+ lines; and
epitaxially growing n+ hydrogenated polysilicon outward of said p hydrogenated polysilicon via low temperature plasma-enhanced chemical vapor deposition, to form said outermost n+ layers of said n+/p/n+ lines.

4. The method of claim 1, wherein forming said structure comprising said inter-layer dielectric layer, said select line metal layer outward of the inter-layer dielectric layer, said plurality of p+/n/p+ lines outward of the select line metal layer, said plurality of n+/p/n+ lines outward of the select line metal layer, and said plurality of dielectric spacers outward of the select line metal layer and at least partially separating the p+/n/p+ lines from the n+/p/n+ lines, comprises:

forming said select line metal layer outward of said inter-layer dielectric layer;

implanting a layer of polysilicon outward of said select line metal layer and activating said implanted layer of polysilicon with a low-energy laser anneal to form said inner p+ layers of said p+/n/p+ lines;

depositing and epitaxially crystallizing n amorphous silicon outward of said inner p+ layers, with a laser, to form said intermediate n layers of said p+/n/p+ lines;

depositing and epitaxially crystallizing p+ amorphous silicon outward of said intermediate n layers, with a laser, to form said outermost p+ layers of said p+/n/p+ lines;

selectively etching down to said select line metal layer to define said p+/n/p+ lines;

depositing said dielectric spacers on sides of said p+/n/p+ lines;

depositing and implanting intrinsic amorphous silicon between said dielectric spacers and outward of said select line metal layer, followed by laser crystallization, to form said inner n+ layers of said n+/p/n+ lines;

epitaxially growing p hydrogenated polysilicon outward of said n+ polysilicon between said dielectric spacers via low temperature plasma-enhanced chemical vapor deposition, to form said intermediate p layers of said n+/p/n+ lines; and epitaxially growing n+ hydrogenated polysilicon outward of said p hydrogenated polysilicon via low temperature plasma-enhanced chemical vapor deposition, to form said outermost n+ layers of said n+/p/n+ lines.

5. The method of claim 1, wherein forming said structure comprising said inter-layer dielectric layer, said select line metal layer outward of the inter-layer dielectric layer, said plurality of p+/n/p+ lines outward of the select line metal layer, said plurality of n+/p/n+ lines outward of the select line metal layer, and said plurality of dielectric spacers outward of the select line metal layer and at least partially separating the p+/n/p+ lines from the n+/p/n+ lines, comprises:

forming said select line metal layer outward of said inter-layer dielectric layer;

depositing a layer of p+ amorphous silicon outward of said select line metal layer;

converting said layer of p+ amorphous silicon to p+ polysilicon via pulsed laser annealing to form said inner p+ layers of said p+/n/p+ lines;

epitaxially growing n hydrogenated polysilicon outward of said p+ polysilicon via low temperature plasma-enhanced chemical vapor deposition to form said intermediate n layers of said p+/n/p+ lines;

epitaxially growing p+ hydrogenated polysilicon outward of said n hydrogenated polysilicon via low temperature plasma-enhanced chemical vapor deposition to form said outermost p+ layers of said p+/n/p+ lines;

selectively etching down to said inner p+ layer to partially define said p+/n/p+ lines;

depositing said dielectric spacers on sides of said partially defined p+/n/p+ lines, adjacent said intermediate n layers and said outermost p+ layers;

carrying out ion implantation to counter-dope portions of said inner p+ layer between said dielectric spacers and outward of said select line metal layer, to form said inner n+ layers of said n+/p/n+ lines;

epitaxially growing p hydrogenated polysilicon outward of said inner n+ layers between said dielectric spacers via low temperature plasma-enhanced chemical vapor deposition, to form said intermediate p layers of said n+/p/n+ lines; and epitaxially growing n+ hydrogenated polysilicon outward of said p hydrogenated polysilicon via low temperature plasma-enhanced chemical vapor deposition, to form said outermost n+ layers of said n+/p/n+ lines.

6. The method of claim 1, wherein forming said structure comprising said inter-layer dielectric layer, said select line metal layer outward of the inter-layer dielectric layer, said plurality of p+/n/p+ lines outward of the select line metal layer, said plurality of n+/p/n+ lines outward of the select line metal layer, and said plurality of dielectric spacers outward of the select line metal layer and at least partially separating the p+/n/p+ lines from the n+/p/n+ lines, comprises:

forming said select line metal layer outward of said inter-layer dielectric layer;

depositing a layer of n+ amorphous silicon outward of said select line metal layer;

converting said layer of n+ amorphous silicon to n+ polysilicon via pulsed laser annealing to form at least said inner n+ layers of said n+/p/n+ lines;

counter-doping portions of said n+ polysilicon to p+, followed by laser anneal for dopant activation, to form said inner p+ layers of said p+/n/p+ lines;

epitaxially growing intrinsic hydrogenated polysilicon outward of said inner n+ layers of said n+/p/n+ lines and said inner p+ layers of said p+/n/p+ lines via low temperature plasma-enhanced chemical vapor deposition;

via implantation of said epitaxially grown intrinsic hydrogenated polysilicon, forming said intermediate p layers of said n+/p/n+ lines over said inner n+ layers of said n+/p/n+ lines and said intermediate n layers of said p+/n/p+ lines over said inner p+ layers of said p+/n/p+ lines;

epitaxially growing n+ polysilicon outward of said intermediate p layers of said n+/p/n+ lines and said intermediate n layers of said p+/n/p+ lines via low temperature plasma-enhanced chemical vapor deposition, to form at least said outermost n+ layers of said n+/p/n+ lines;

counter-doping portions of said epitaxially grown n+ polysilicon to p+, followed by laser anneal for dopant activation, to form said outermost p+ layers of said p+/n/p+ lines; and forming shallow trench isolation regions between said n+/p/n+ lines and said p+/n/p+ lines, said shallow trench isolation regions comprising said plurality of dielectric spacers.

7. The method of claim 1, wherein forming said structure comprising said inter-layer dielectric layer, said select line metal layer outward of the inter-layer dielectric layer, said plurality of p+/n/p+ lines outward of the select line metal layer, said plurality of n+/p/n+ lines outward of the select line metal layer, and said plurality of dielectric spacers outward of the select line metal layer and at least partially separating the p+/n/p+ lines from the n+/p/n+ lines, comprises:

forming said select line metal layer outward of said inter-layer dielectric layer;

depositing and implanting a layer of intrinsic amorphous silicon outward of said select line metal layer;
laser crystallizing said deposited and implanted layer of intrinsic amorphous silicon to form at least said inner n+ layers of said n+/p/n+ lines;
counter-doping portions of said laser crystallized, deposited and implanted layer of intrinsic amorphous silicon to p+, followed by laser anneal for dopant activation, to form said inner p+ layers of said p+/n/p+ lines;
epitaxially depositing and crystallizing intrinsic amorphous silicon outward of said inner n+ layers of said n+/p/n+ lines and said inner p+ layers of said p+/n/p+ lines;
via implantation of said epitaxially deposited and crystallized intrinsic amorphous silicon, forming said intermediate p layers of said n+/p/n+ lines over said inner n+ layers of said n+/p/n+ lines and said intermediate n layers of said p+/n/p+ lines over said inner p+ layers of said p+/n/p+ lines;
epitaxially depositing and crystallizing n+ amorphous silicon outward of said intermediate p layers of said n+/p/n+ lines and said intermediate n layers of said p+/n/p+ lines, to form at least said outermost n+ layers of said n+/p/n+ lines;
counter-doping portions of said epitaxially deposited and crystallized n+ amorphous silicon to p+, followed by laser anneal for dopant activation, to form said outermost p+ layers of said p+/n/p+ lines; and
forming shallow trench isolation regions between said n+/p/n+ lines and said p+/n/p+ lines, said shallow trench isolation regions comprising said plurality of dielectric spacers.

8. The method of claim 1, wherein forming said structure comprising said inter-layer dielectric layer, said select line metal layer outward of the inter-layer dielectric layer, said plurality of p+/n/p+ lines outward of the select line metal layer, said plurality of n+/p/n+ lines outward of the select line metal layer, and said plurality of dielectric spacers outward of the select line metal layer and at least partially separating the p+/n/p+ lines from the n+/p/n+ lines, comprises:
forming said select line metal layer outward of said inter-layer dielectric layer;
implanting a layer of polysilicon outward of said select line metal layer;
activating said implanted layer of polysilicon with a low energy laser anneal to form at least said inner n+ layers of said n+/p/n+ lines;
counter-doping portions of said implanted, activated layer of polysilicon to p+, followed by laser anneal for dopant activation, to form said inner p+ layers of said p+/n/p+ lines;
epitaxially depositing and crystallizing intrinsic amorphous silicon outward of said inner n+ layers of said n+/p/n+ lines and said inner p+ layers of said p+/n/p+ lines;
via implantation of said epitaxially deposited and crystallized intrinsic amorphous silicon, forming said intermediate p layers of said n+/p/n+ lines over said inner n+ layers of said n+/p/n+ lines and said intermediate n layers of said p+/n/p+ lines over said inner p+ layers of said p+/n/p+ lines;
epitaxially depositing and crystallizing n+ amorphous silicon outward of said intermediate p layers of said n+/p/n+ lines and said intermediate n layers of said p+/n/p+ lines, to form at least said outermost n+ layers of said n+/p/n+ lines;
counter-doping portions of said epitaxially deposited and crystallized n+ amorphous silicon to p+, followed by laser anneal for dopant activation, to form said outermost p+ layers of said p+/n/p+ lines; and
forming shallow trench isolation regions between said n+/p/n+ lines and said p+/n/p+ lines, said shallow trench isolation regions comprising said plurality of dielectric spacers.

\* \* \* \* \*